(12) United States Patent
Naito et al.

(10) Patent No.: US 11,981,844 B2
(45) Date of Patent: May 14, 2024

(54) COMPOSITION, FILM, LAMINATED STRUCTURE, LIGHT-EMITTING DEVICE AND DISPLAY

(71) Applicant: Sumitomo Chemical Company, Limited, Tokyo (JP)

(72) Inventors: Shota Naito, Tsukuba (JP); Mizuho Sugiuchi, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 363 days.

(21) Appl. No.: 17/288,431

(22) PCT Filed: Oct. 28, 2019

(86) PCT No.: PCT/JP2019/042118
§ 371 (c)(1),
(2) Date: Apr. 23, 2021

(87) PCT Pub. No.: WO2020/085516
PCT Pub. Date: Apr. 30, 2020

(65) Prior Publication Data
US 2021/0395609 A1     Dec. 23, 2021

(30) Foreign Application Priority Data
Oct. 26, 2018   (JP) ................................. 2018-202354

(51) Int. Cl.
| C09K 11/02 | (2006.01) |
| B82Y 20/00 | (2011.01) |
| B82Y 40/00 | (2011.01) |
| C09K 11/61 | (2006.01) |
| H01L 33/50 | (2010.01) |

(52) U.S. Cl.
CPC ............ *C09K 11/025* (2013.01); *C09K 11/02* (2013.01); *C09K 11/61* (2013.01); *H01L 33/502* (2013.01); *B82Y 20/00* (2013.01); *B82Y 40/00* (2013.01)

(58) Field of Classification Search
CPC ....... C09K 11/61; C09K 11/02; C09K 11/025; H01L 33/502
See application file for complete search history.

(56) References Cited

U.S. PATENT DOCUMENTS

| 2016/0002374 A1 | 1/2016 | Sakamoto et al. |
| 2017/0222162 A1 | 8/2017 | Lee et al. |
| 2017/0260150 A1 | 9/2017 | Nose et al. |
| 2018/0002459 A1 | 1/2018 | Endo et al. |
| 2018/0002460 A1 | 1/2018 | Endo et al. |
| 2018/0016502 A1 | 1/2018 | Endo et al. |
| 2018/0066189 A1 | 3/2018 | Ishii et al. |
| 2019/0112469 A1 | 4/2019 | Yoshiwara et al. |
| 2020/0168666 A1 | 5/2020 | Naito et al. |

FOREIGN PATENT DOCUMENTS

| CN | 104995219 A | 10/2015 |
| CN | 107001242 A | 8/2017 |
| CN | 107108770 A | 8/2017 |
| CN | 107108775 A | 8/2017 |
| CN | 107209307 A | 9/2017 |
| CN | 107209309 A | 9/2017 |
| CN | 108250754 A | 7/2018 |
| EP | 3597723 A1 | 1/2020 |
| KR | 10-2017-0090216 A | 8/2017 |
| TW | 201737521 A1 | 10/2017 |
| WO | 2017/221833 A1 | 12/2017 |
| WO | 2017/221834 A1 | 12/2017 |
| WO | 2017/221837 A1 | 12/2017 |
| WO | 2018/117130 A1 | 6/2018 |
| WO | 2018/117131 A1 | 6/2018 |
| WO | 2018/117141 A1 | 6/2018 |
| WO | WO 2018/117130 * | 6/2018 |
| WO | 2018/168638 A1 | 9/2018 |

OTHER PUBLICATIONS

Office Action issued in related Taiwanese Patent Application No. 108138873 dated Nov. 29, 2022.
Palazon et al., "Polymer-Free Films of Inorganic Halide Perovskite Nanocrystals as UV-to-White Color-Conversion Layers in LEDs," Chemistry of Materials, 28: 2902-2906 (2016).
International Search Report issued in corresponding International Patent Application No. PCT/JP2019/042118 dated Dec. 10, 2019.
Office Action issued in related Japanese Patent Application No. 2018-202354 dated Feb. 5, 2019.
Office Action issued in related Chinese Patent Application No. 201980069905.5 dated Oct. 13, 2022.
Aygüler et al., "Light-Emitting Electrochemical Cells Based on Hybrid Lead Halide Perovskite Nanoparticles", J. Phys. Chem. C. 2015, 119, 12047-12054.
Li et al., "Efficient Light-Emitting Diodes Based on Nanocrystalline Perovskite in a Dielectric Polymer Matrix", Nano Letters, 2015, 15, 2640-2644.
Akkerman et al., "Tuning the Optical Properties of Cesium Lead Halide Perovskite Nanocrystals by Anion Exchange Reactions", Journal of the American Chemical Society, 2015, 137, 10276-10281.
Office Action issued in related Chinese Patent Application No. 201980069905.5 dated Apr. 26, 2023.
Office Action dated Sep. 27, 2023, issued in corresponding Taiwanese Patent Application No. 108138873.

\* cited by examiner

*Primary Examiner* — C Melissa Koslow
(74) *Attorney, Agent, or Firm* — Morgan, Lewis & Bockius LLP

(57) ABSTRACT

Disclosed is a light-emitting composition with a perovskite compound and a halogen-containing compound.

18 Claims, 1 Drawing Sheet

COMPOSITION, FILM, LAMINATED STRUCTURE, LIGHT-EMITTING DEVICE AND DISPLAY

TECHNICAL FIELD

The present invention relates to a composition, a film, a laminated structure, a light-emitting device, and a display.

Priority is claimed on Japanese Patent Application No. 2018-202354, filed on Oct. 26, 2018, the content of which is incorporated herein by reference.

BACKGROUND ART

In recent years, there has been an increasing interest in luminescent semiconductor materials having a high quantum yield as a luminescent material. For example, a composition containing two types of inorganic luminescent particles has been reported (Non-Patent Document 1).

DESCRIPTION OF PRIOR ART

Non-Patent Document

[Non-Patent Document 1] Chem. Mater. 2016, 28, p. 2902-2906

DISCLOSURE OF INVENTION

Technical Problem

When the composition disclosed in Non-Patent Document 1 is used as a light-emitting material, it is required that the light-emitting intensity does not easily decrease.

The present invention has been made in view of the above circumstances, and the object of the present invention is to provide a composition having light-emitting property in which the light-emitting intensity does not easily decrease. Further, another object of the present invention is to provide a film formed by using the composition, a laminated structure, a light-emitting device, and a display.

Solution to Problem

In other words, embodiments of the present invention include the following inventions [1] to [9].

[1] A luminescent composition containing a component (1), a component (2), and at least one component selected from the group consisting of a component (3), a component (4) and a component (4-1), wherein an amount of halogen atoms contained in the component (2) is 5500 ppm by mass or less with respect to a total mass of the composition, and wherein:
the component (1) is a perovskite compound containing constituent components A, B, and X,
wherein the constituent component A indicates a component positioned at each vertex of a hexahedron having the constituent component B at its center in a perovskite type crystal structure, and is a monovalent cation,
the constituent component X indicates a component positioned at each vertex of an octahedron having the constituent component B at the center in the perovskite type crystal structure, and is one or more kinds of anions selected from the group consisting of a halide ion and a thiocyanate ion,
the constituent component B indicates a component positioned at a center of a hexahedron having the constituent component A at each vertex and at a center of an octahedron having the constituent component X at each vertex in the perovskite type crystal structure, and is a metal ion;
the component (2) is a halogen-containing compound;
the component (3) is a solvent;
the component (4) is a polymerizable compound; and
the component (4-1) is a polymer.

[2]. A luminescent composition containing a component (1), a component (2), and a component (10), wherein a mass ratio of halide ions contained in the component (2) to the component (10) (mass of halide ions contained in the component (2)/mass of the component (10)) is 3.0 or less, and wherein:
the component (1) is a perovskite compound containing constituent components A, B, and X,
wherein the constituent component A indicates a component positioned at each vertex of a hexahedron having the constituent component B at its center in a perovskite type crystal structure, and is a monovalent cation,
the constituent component X indicates a component positioned at each vertex of an octahedron having the constituent component B at the center in the perovskite type crystal structure, and is one or more kinds of anions selected from the group consisting of a halide ion and a thiocyanate ion,
the constituent component B indicates a component positioned at a center of a hexahedron having the constituent component A at each vertex and at a center of an octahedron having the constituent component X at each vertex in the perovskite type crystal structure, and is a metal ion;
the component (2) is a halogen-containing compound; and
the component (10) is a luminescent semiconductor material.

[3] The composition according to [1] or [2], further containing a component (6) which is at least one compound selected from the group consisting of silazane, a modified product of silazane, a compound represented by formula (C1), a modified product of the compound represented by the formula (C1), a compound represented by formula (C2), a modified product of the compound represented by the formula (C2), a compound represented by formula (A5-51), a modified product of the compound represented by the formula (A5-51), a compound represented by formula (A5-52), a modified product of the compound represented by the formula (A5-52), sodium silicate, and a modified product of sodium silicate:

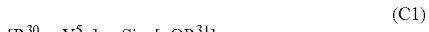

(C1)

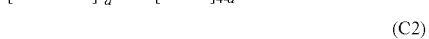

(C2)

wherein: in the formula (C1), $Y^5$ represents a single bond, an oxygen atom, or a sulfur atom,
with the proviso that, when $Y^5$ is an oxygen atom, each of $R^{30}$ and $R^{31}$ independently represents a hydrogen atom, an alkyl group having 1 to 20 carbon atoms, a cycloalkyl group having 3 to 30 carbon atoms, or an unsaturated hydrocarbon group having 2 to 20 carbon atoms, and when $Y^5$ is a single bond or a sulfur atom, $R^{30}$ represents an alkyl group having 1 to 20 carbon atoms, a cycloalkyl having 3 to 30 carbon atoms, or an unsaturated hydrocarbon group having 2 to 20 carbon atoms, and $R^{31}$ represents a hydrogen atom, an alkyl group having 1 to 20 carbon atoms, a cycloalkyl group having 3 to 30 carbon atoms, or an unsaturated hydrocarbon group having 2 to 20 carbon atoms;

in the formula (C2), each of $R^{30}$, $R^{31}$ and $R^{32}$ independently represents a hydrogen atom, an alkyl group having 1 to 20 carbon atoms, a cycloalkyl group having 3 to 30 carbon atoms, or an unsaturated hydrocarbon group having 2 to 20 carbon atoms;

in the formulae (C1) and (C2),
hydrogen atoms in the alkyl group, the cycloalkyl group and the unsaturated hydrocarbon group as $R^{30}$, $R^{31}$ or $R^{32}$ are each independently substituted by or not substituted by a halogen atom or an amino group, and
a is an integer of 1 to 3, with the proviso that,
when a is 2 or 3, a plurality of $Y^5$ is the same or different,
when a is 2 or 3, a plurality of $R^{30}$ is the same or different,
when a is 2 or 3, a plurality of $R^{32}$ is the same or different,
when a is 1 or 2, a plurality of $R^{31}$ is the same or different,

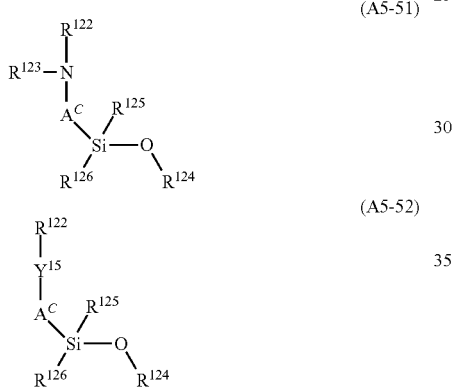

(A5-51)

(A5-52)

wherein $A^C$ is a divalent hydrocarbon group and $Y^{15}$ is an oxygen atom or a sulfur atom,
each of $R^{122}$ and $R^{123}$ is independently a hydrogen atom, an alkyl group having 1 to 20 carbon atoms, or a cycloalkyl group having 3 to 30 carbon atoms, $R^{124}$ is an alkyl group having 1 to 20 carbon atoms or a cycloalkyl group having 3 to 30 carbon atoms, and each of $R^{125}$ and $R^{126}$ is independently a hydrogen atom, an alkyl group having 1 to 20 carbon atoms, an alkoxy group having 1 to 20 carbon atoms, or a cycloalkyl group having 3 to 30 carbon atoms, with the proviso that
hydrogen atoms in the alkyl group and the cycloalkyl group as $R^{122}$ to $R^{126}$ are each independently substituted by or not substituted by a halogen atom or an amino group.

[4] The composition according to any one of [1] to [3], which further includes:
a component (5) which is at least one compound or ion selected from the group consisting of an ammonium ion, an amine, primary to quaternary ammonium cations, an ammonium salt, a carboxylic acid, a carboxylate ion, a carboxylate salt, compounds respectively represented by formulae (X1) to (X6), and salts of the compounds respectively represented by formulae (X2) to (X4):

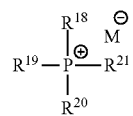

(X1)

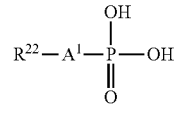

(X2)

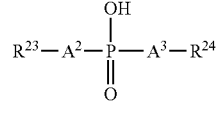

(X3)

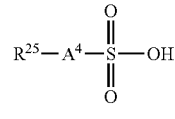

(X4)

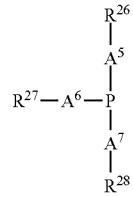

(X5)

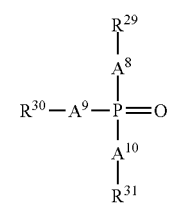

(X6)

wherein:
in the formula (X1), each of $R^{18}$ to $R^{21}$ is independently an alkyl group having 1 to 20 carbon atoms, a cycloalkyl group having 3 to 30 carbon atoms, or an aryl group having 6 to 30 carbon atoms, which is or is not substituted, and $M^-$ is a counter anion; in the formula (X2), $A^1$ is a single bond or an oxygen atom, and $R^{22}$ is an alkyl group having 1 to 20 carbon atoms, a cycloalkyl group having 3 to 30 carbon atoms, or an aryl group having 6 to 30 carbon atoms, which is or is not substituted;

in the formula (X3), each of $A^2$ and $A^3$ independently represents a single bond or an oxygen atom, and each of $R^{23}$ and $R^{24}$ independently represents an alkyl groups having 1 to 20 carbon atoms, a cycloalkyl group having 3 to 30 carbon atoms, or an aryl group having 6 to 30 carbon atoms, which is or is not substituted;

in the formula (X4), $A^4$ represents a single bond or an oxygen atom, and $R^{25}$ represents an alkyl group having 1 to 20 carbon atoms, a cycloalkyl group having 3 to 30 carbon atoms, or an aryl group having 6 to 30 carbon atoms, which is or is not substituted;

in the formula (X5), each of $A^5$ to $A^7$ independently represents a single bond or an oxygen atom, and each of $R^{26}$ to $R^{28}$ independently represents an alkyl group having 1 to 20 carbon atoms, a cycloalkyl group having 3 to 30 carbon atoms, an aryl group having 6 to 30 carbon atoms, an alkenyl group having 2 to 20 carbon atoms, or an alkynyl group having 2 to 20 carbon atoms, which is or is not substituted;

in the formula (X6), each of $A^8$ to $A^{10}$ independently represents a single bond or an oxygen atom, and each of $R^{29}$ to $R^{31}$ independently represents an alkyl group having 1 to 20 carbon atom, a cycloalkyl group having 3 to 30 carbon atoms, an aryl group of 6 to 30 carbon atoms, an alkenyl group having 2 to 20 carbon atoms, or an alkynyl group having 2 to 20 carbon atoms, which is or is not substituted, with the proviso that hydrogen atoms in the groups represented by $R^{18}$ to $R^{31}$ are each independently substituted or not substituted by a halogen atom.

[5] The composition according to [4], wherein the component (5) is a component (5-1) which is at least one compound or ion selected from the group consisting of an ammonium ion, an amine, primary to quaternary ammonium cations, an ammonium salt, a carboxylic acid, a carboxylate ion, and a carboxylate salt.

[6] A film containing the composition of any one of [1] to [5] as a fabrication material.

[7] A laminated structure containing the film according to [6].

[8] A light-emitting device containing the laminated structure of [7].

[9] A display containing the laminated structure of [7].

Advantageous Effects of Invention

The present invention can provide a composition having light-emitting property in which the light-emitting intensity does not easily decrease, as well as a film, a laminated structure, a light-emitting device and a display.

DESCRIPTION OF THE EMBODIMENTS

Figure 1:
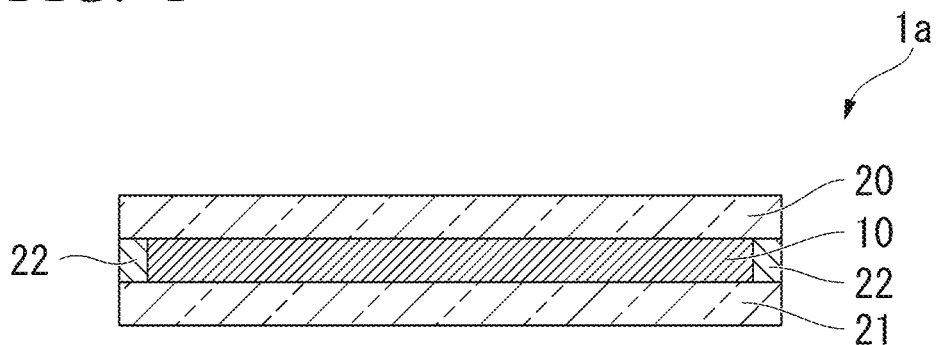
FIG. 1 is a cross-sectional view showing an embodiment of a laminated structure according to the present invention.

Hereinafter, the present invention will be described in detail based on embodiments.

<Composition>

A composition according to the present embodiment has a light-emitting property. The "light-emitting property" indicates a property of emitting light. As the light-emitting property, a property of emitting light using excitation of electrons is preferable, and a property of emitting light using excitation of electrons caused by excitation light is more preferable. The wavelength of excitation light may be, for example, in a range of 200 nm to 800 nm, in a range of 250 nm to 750 nm, or in a range of 300 nm to 700 nm.

<Composition Containing Component (1), Component (2), and Dispersion Medium>

The composition of the present embodiment contains a component (1) and a component (2), in which the amount of halogen atoms contained in the component (2) is 5500 ppm by mass or less with respect to a total mass of the composition. The composition of the present embodiment further contains at least one component selected from the group consisting of a component (3), component (4), and component (4-1). In the present specification, solvent (3), polymerizable compound (4), and polymer (4) is sometimes collectively referred to as "dispersion medium".

Component (1): a perovskite compound containing constituent components A, B, and X
Component (2): a halogen-containing compound
Component (3): a solvent
Component (4): a polymerizable compound
Component (4-1): a polymer Hereinafter, each component constituting the composition of the present embodiment will be described. Hereinafter, the component (1) is sometimes referred to as a perovskite compound (1). The component (2) is sometimes referred to as a halogen-containing compound (2).

The composition of the present embodiment may be dispersed in a dispersion medium.

In the present specification, the term "dispersed" indicates a state in which the perovskite compound (1) is floated or a state in which the perovskite (1) is suspended in a dispersion medium. When the perovskite compound (1) is dispersed in the dispersion medium, the perovskite compound (1) may be partially precipitated.

<<Perovskite Compound (1)>>

The perovskite compound includes constituent components A, B, and X and has a perovskite type crystal structure. In the following description, a compound semiconductor having perovskite structure is sometimes referred to as a "perovskite compound".

The constituent component A indicates a component positioned at each vertex of a hexahedron having the constituent component B at its center in a perovskite type crystal structure, and is a monovalent cation.

The constituent component B indicates a component positioned at a center of a hexahedron having the constituent component A at each vertex and at a center of an octahedron having the constituent component X at each vertex in the perovskite type crystal structure, and is a metal ion. B represents a metal cation which can have octahedral coordination of X.

The constituent component X indicates a component positioned at each vertex of an octahedron having the constituent component B at the center in the perovskite type crystal structure, and is one or more kinds of anions selected from the group consisting of a halide ion and a thiocyanate ion.

The perovskite compound having the constituent components A, B, and X is not particularly limited, and may be a compound having any of a three-dimensional structure, a two-dimensional structure, and a quasi-two-dimensional (quasi-2D) structure.

In a case of the three-dimensional structure, the composition of the perovskite compound is represented by $ABX_{(3+\delta)}$.

In a case of the two-dimensional structure, the composition of the perovskite compound is represented by $A_2BX_{(4+\delta)}$.

Here, the parameter $\delta$ is a number which can be appropriately changed according to the charge balance of B and is in a range of −0.7 to 0.7. For example, in a case where A represents a monovalent cation, B represents a divalent cation, and X represents a monovalent anion, the parameter $\delta$ can be selected such that the perovskite compound becomes electrically neutral. When the perovskite compound is electrically neutral, it means that the charge of the perovskite compound is zero.

The perovskite compound contains an octahedron which has B as the center and X as the vertex. The octahedron is represented by $BX_6$.

In the case where the perovskite compound has the three-dimensional structure, $BX_6$ contained in the perovskite compound forms the three-dimensional network by sharing one X located at the vertex in the octahedron ($BX_6$) with two adjacent octahedrons ($BX_6$) in the crystal.

In the case where the perovskite compound has the two-dimensional structure, $BX_6$ contained in the perovskite compound forms the two-dimensionally continuous layer by sharing the two Xs located at the vertices of the octahedron ($BX_6$) with the two adjacent octahedrons ($BX_6$) in the crystal, and sharing the ridgeline of the octahedron. The perovskite compound contains a structure in which a layer formed of two-dimensionally connected $BX_6$ and a layer formed of A are alternately laminated.

In the present specification, the crystal structure of the perovskite compound can be confirmed by an X-ray diffraction pattern.

In a case of the perovskite compound having the perovskite type crystal structure of the three-dimensional structure, typically, a peak derived from (hkl)=(001) is confirmed at a position where 2θ is in a range of 12° to 18° or a peak derived from (hkl)=(110) is confirmed at a position where 2θ is in a range of 18° to 25° in the X ray diffraction pattern.

In a case of the perovskite compound having the perovskite type crystal structure of the three-dimensional structure, it is preferable that a peak derived from (hkl)=(001) is confirmed at a position where 2θ is in a range of 13° to 16° or a peak derived from (hkl)=(110) is confirmed at a position where 2θ is in a range of 20° to 23°.

In a case of the perovskite compound having the perovskite type crystal structure of the two-dimensional structure, typically, a peak derived from (hkl)=(002) is confirmed at a position where 2θ is in a range of 1° to 10° in the X ray diffraction pattern. Further, it is preferable that a peak derived from (hkl)=(002) is confirmed at a position where 2θ is in a range of 2° to 8°.

The perovskite compound preferably has the three-dimensional structure.

(Constituent Component A)

The constituent component A in the perovskite compound is a monovalent cation. Examples of the constituent component A include a cesium ion, an organic ammonium ion, and an amidinium ion.

(Organic Ammonium Ion)

Specific examples of the organic ammonium ion as the constituent component A include a cation represented by Formula (A3).

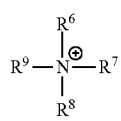
(A3)

In Formula (A3), $R^6$ to $R^9$ each independently represent a hydrogen atom, an alkyl group, or cycloalkyl group. However, at least one of $R^6$ to $R^9$ is an alkyl group or a cycloalkyl group, and not all of $R^6$ to $R^9$ simultaneously represent hydrogen atoms.

The alkyl groups represented by $R^6$ to $R^9$ may be linear or branched. Further, the alkyl group represented by each of independent $R^6$ to $R^9$ may have an amino group as a substituent.

In a case where $R^6$ to $R^9$ represent an alkyl group, the number of carbon atoms of each of independent $R^6$ to $R^9$ is typically in a range of 1 to 20, preferably in a range of 1 to 4, still more preferably in a range of 1 to 3, and even still more preferably 1.

The cycloalkyl group represented by each of independent $R^6$ to $R^9$ may have an amino group as a substituent.

The number of carbon atoms of the cycloalkyl group represented by each of independent $R^6$ to $R^9$ is typically in a range of 3 to 30, preferably in a range of 3 to 11, and more preferably in a range of 3 to 8. The number of carbon atoms include the number of carbon atoms in a substituent.

As the group represented by each of independent $R^6$ to $R^9$, a hydrogen atom or an alkyl group is preferable.

In a case where the perovskite compound contains an organic ammonium ion represented by Formula (A3) as the constituent component A, the number of alkyl groups and cycloalkyl groups contained in Formula (A3) is preferably small. Further, the number of carbon atoms of the alkyl group and the cycloalkyl group contained in Formula (A3) is preferably small. As a result, a perovskite compound having a three-dimensional structure with high light-emitting intensity can be obtained.

In the organic ammonium ion represented by Formula (A3), the total number of carbon atoms contained in the alkyl group represented by $R^6$ to $R^9$ and the cycloalkyl group is preferably 1 to 4. Further, in the organic ammonium ion represented by Formula (A3), it is preferable that one of $R^6$ to $R^9$ is an alkyl group having 1 to 3 carbon atoms, and three of $R^6$ to $R^9$ are hydrogen atoms.

Examples of the alkyl group as $R^6$ to $R^9$ include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, a 1-methylbutyl group, an n-hexyl group, a 2-methylpentyl group, a 3-methylpentyl group, a 2,2-dimethylbutyl group, a 2,3-dimethylbutyl group, an n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbutyl group, an n-octyl group, an isooctyl group, a 2-ethylhexyl group, a nonyl group, a decyl group, an undecyl group, a dodecyl group, a tridecyl group, a tetradecyl group, a pentadecyl group, a hexadecyl group, a heptadecyl group, an octadecyl group, a nonadecyl group, and an icosyl group.

As the cycloalkyl group as $R^6$ to $R^9$, a group in which an alkyl group having 3 or more carbon atoms which has been provided as an exemplary example of the alkyl group represented by each of independent $R^6$ to $R^9$ forms a ring is an exemplary example. Examples thereof include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group.

As the organic ammonium ion represented by the constituent component A, $CH_3NH_3^+$ (also referred to as a methylammonium ion), $C_2H_5NH_3^+$ (also referred to as an ethylammonium ion), or $C_3H_7NH_3^+$ (also referred to as a propylammonium ion) is preferable, $CH_3NH_3^+$ or $C_2H_5NH_3^+$ is more preferable, and $CH_3NH_3^+$ is still more preferable.

(Amidinium Ion)

As the amidinium ion represented by constituent component A, an amidinium ion represented by Formula (A4) is an exemplary example.

$(R^{10}R^{11}N=CH-NR^{12}R^{13})^+$ (A4)

In Formula (A4), $R^{10}$ to $R^{13}$ each independently represent a hydrogen atom, an alkyl group which may contain an amino group as a substituent, or a cycloalkyl group which may contain amino group as a substituent.

The alkyl group represented by each of independent $R^{10}$ to $R^{13}$ may be linear or branched. Further, the alkyl group represented by each of independent $R^{10}$ to $R^{13}$ may have an amino group as a substituent.

The number of carbon atoms in the alkyl group represented by each of independent $R^{10}$ to $R^{13}$ is typically in a range of 1 to 20, preferably in a range of 1 to 4, and more preferably in a range of 1 to 3.

The cycloalkyl group represented by each of independent $R^{10}$ to $R^{13}$ may contain an amino group as a substituent.

The number of carbon atoms of the cycloalkyl group represented by each of independent $R^{10}$ to $R^{13}$ is typically in a range of 3 to 30, preferably in a range of 3 to 11, and more preferably in a range of 3 to 8. The number of carbon atoms include the number of carbon atoms in a substituent.

Specific examples of the alkyl group as $R^{10}$ to $R^{13}$ are the same as those provided as exemplary examples of the alkyl group represented by each of independent $R^6$ to $R^9$.

Specific examples of the cycloalkyl group as $R^{10}$ to $R^{13}$ are the same as those provided as exemplary examples of the cycloalkyl group represented by each of independent $R^6$ to $R^9$.

As the group represented by each of independent $R^{10}$ to $R^{13}$, a hydrogen atom or an alkyl group is preferable.

A perovskite compound having a three-dimensional structure with high emission intensity can be obtained by decreasing the number of alkyl groups and cycloalkyl groups included in Formula (A4) and decreasing the number of carbon atoms in the alkyl group and the cycloalkyl group.

In the amidinium ion, it is preferable that the total number of carbon atoms contained in the alkyl group and the cycloalkyl group represented by $R^{10}$ to $R^{13}$ is 1 to 4, and it is more preferable that $R^{10}$ is an alkyl group having 1 carbon atom and RH to $R^{13}$ are hydrogen atoms.

In a case where the constituent component A is a cesium ion, an organic ammonium ion having 3 or less carbon atoms, or an amidinium ion having 3 or less carbon atoms in the perovskite compound, the perovskite compound typically has a three-dimensional structure.

In a case where the constituent component A is a an organic ammonium ion having 4 or more carbon atoms, or an amidinium ion having 4 or more carbon atoms in the perovskite compound, the perovskite compound has one or both of a two-dimensional structure and a quasi-two-dimensional (quasi-2D) structure. In this case, the perovskite compound can have the two-dimensional structure or the quasi-two-dimensional structure in a part or the whole of the crystal.

In a case where a pluraloty of two-dimensional perovskite type crystal structures are laminated, the resulting structure becomes equivalent to the three-dimensional perovskite type crystal structure (reference literature: P. P. Boix et al., J. Phys. Chem. Lett. 2015, 6, 898 to 907, etc.).

In the perovskite compound, a cesium ion or an amidinium ion is preferable as the constituent component A. Among the amidinium ions, formamidinium ions in which all of $R^{10}$ to $R^{13}$ are hydrogen atoms are preferable.

(Constituent Component B)

The constituent component B in the perovskite compound may be one or more metal ions selected from the group consisting of a monovalent metal ion, a divalent metal ion, and a trivalent metal ion. It is preferable that the constituent component B contains a divalent metal ion, it is more preferable that the constituent component B contains one or more metal ions selected from the group consisting of lead and tin, and it is still more preferable that the constituent component B contains lead ion.

(Constituent Component X)

The constituent component X in the perovskite compound may be one or more anions selected from the group consisting of a halide ion, and a thiocyanate ion.

Examples of the halide ion include a chloride ion, a bromide ion, a fluoride ion, and an iodide ion. The constituent component B is preferably a bromide ion.

In a case where the constituent component X is two or more kinds of halide ions, the content ratio of the halide ions can be appropriately selected according to the emission wavelength. For example, a combination of a bromide ion and a chloride ion or a combination of a bromide ion and an iodide ion can be employed.

The constituent component X can be appropriately selected according to a desired emission wavelength.

The perovskite compound in which the constituent component X is a bromide ion is capable of emitting fluorescence having a maximum peak of the intensity in a wavelength range of typically 480 nm or greater, preferably 500 nm or greater, and more preferably 520 nm or greater.

Further, the perovskite compound in which the constituent component X is a bromide ion is capable of emitting fluorescence having a maximum peak of the intensity in a wavelength range of typically 700 nm or less, preferably 600 nm or less, and more preferably 580 nm or less.

The upper limit values and lower limit values of the above-described wavelength range can be arbitrarily combined.

In a case where the constituent component X in the perovskite compound is a bromide ion, the peak of the emitted fluorescence is typically in a range of 480 nm to 700 nm, preferably in a range of 500 nm to 600 nm, and more preferably in a range of 520 nm to 580 nm.

The perovskite compound in which the constituent component X is a iodide ion is capable of emitting fluorescence having a maximum peak of the intensity in a wavelength range of typically 520 nm or greater, preferably 530 nm or greater, and more preferably 540 nm or greater.

Further, the perovskite compound in which the constituent component X is a iodide ion is capable of emitting fluorescence having a maximum peak of the intensity in a wavelength range of typically 800 nm or less, preferably 750 nm or less, and more preferably 730 nm or less.

The upper limit values and lower limit values of the above-described wavelength range can be arbitrarily combined.

In a case where the constituent component X in the perovskite compound is a iodide ion, the peak of the emitted fluorescence is typically in a range of 520 nm to 800 nm, preferably in a range of 530 nm to 750 nm, and more preferably in a range of 540 nm to 730 nm.

The perovskite compound in which the constituent component X is a chloride ion is capable of emitting fluorescence having a maximum peak of the intensity in a wavelength range of typically 300 nm or greater, preferably 310 nm or greater, and more preferably 330 nm or greater.

Further, the perovskite compound in which the constituent component X is a chloride ion is capable of emitting fluorescence having a maximum peak of the intensity in a wavelength range of typically 600 nm or less, preferably 580 nm or less, and more preferably 550 nm or less.

The upper limit values and lower limit values of the above-described wavelength range can be arbitrarily combined.

In a case where the constituent component X in the perovskite compound is a chloride ion, the peak of the emitted fluorescence is typically in a range of 300 nm to 600 nm, preferably in a range of 310 nm to 580 nm, and more preferably in a range of 330 nm to 550 nm.

(Example of the Perovskite Compound Having the Three-Dimensional Structure)

Preferred examples of the perovskite compound having the three-dimensional structure represented by $ABX_{(3+\delta)}$ include $CH_3NH_3PbBr_3$, $CH_3NH_3PbCl_3$, $CH_3NH_3PbI_3$, $CH_3NH_3PbBr_{(3-y)}I_y(0<y<3)$, $CH_3NH_3PbBr_{(3-y)}Cl_y(0<y<3)$, $(H_2N=CH-NH_2)PbBr_3$, $(H_2N=CH-NH_2)PbCl_3$, and $(H_2N=CH-NH_2)PbI_3$.

Preferred examples of the perovskite compound having the three-dimensional structure also include $CH_3NH_3Pb_{(1-a)}Ca_aBr_3(0<a\leq0.7)$, $CH_3NH_3Pb_{(1-a)}Sr_aBr_3(0<a\leq0.7)$, $CH_3NH_3Pb_{(1-a)}La_aBr_{(3+\delta)}(0<a\leq0.7, 0<\delta\leq0.7)$, $CH_3NH_3Pb_{(1-a)}Ba_aBr_3(0<a\leq0.7)$, and $CH_3NH_3Pb_{(1-a)}Dy_aBr_{(3+\delta)}(0<a\leq0.7, 0<\delta\leq0.7)$.

Preferred examples of the perovskite compound having the three-dimensional structure also include $CH_3NH_3Pb_{(1-a)}Na_aBr_{(3+\delta)}(0<a\leq0.7, -0.7\leq\delta<0)$ and $CH_3NH_3Pb_{(1-a)}Li_aBr_{(3+\delta)}(0<a\leq0.7, -0.7\leq\delta<0)$.

Preferred examples of the perovskite compound having the three-dimensional structure also include $CsPb_{(1-a)}Na_aBr_{(3+\delta)}(0<a\leq0.7, -0.7\leq\delta<0)$ and $CsPb_{(1-a)}Li_aBr_{(3+\delta)}(0<a\leq0.7, -0.7\leq\delta<0)$.

Preferred examples of the perovskite compound having the three-dimensional structure also include $CH_3NH_3Pb_{(1-a)}Na_aBr_{(3+\delta-y)}I_y(0<a\leq0.7, -0.7\leq\delta<0, 0<y<3)$, $CH_3NH_3Pb_{(1-a)}Li_aBr_{(3+\delta-y)}I_y(0<a\leq0.7, -0.7\leq\delta<0, 0<y<3)$, $CH_3NH_3Pb_{(1-a)}Na_aBr_{(3+\delta-y)}Cl_y(0<a\leq0.7, -0.7\leq\delta<0, 0<y<3)$, and $CH_3NH_3Pb_{(1-a)}Li_aBr_{(3+\delta-y)}Cl_y(0<a\leq0.7, -0.7\leq\delta<0, 0<y<3)$.

Preferred examples of the perovskite compound having the three-dimensional structure also include $(H_2N=CH-NH_2)Pb_{(1-a)}Na_aBr_{(3+\delta)}(0<a\leq0.7, -0.7\leq\delta<0)$, $(H_2N=CH-NH_2)Pb_{(1-a)}Li_aBr(3+s)(0<a\leq0.7, -0.7\leq\delta<0)$, $(H_2N=CH-NH_2)Pb_{(1-a)}Na_aBr_{(3+\delta-y)}I_y(0<a\leq0.7, -0.7\leq\delta<0, 0<y<3)$, and $(H_2N=CH-NH_2)Pb_{(1-a)}Na_aBr_{(3+\delta-y)}Cl_y(0<a\leq0.7, -0.7\leq\delta<0, 0<y<3)$.

Preferred examples of the perovskite compound having the three-dimensional structure also include $CsPbBr_3$, $CsPbCl_3$, $CsPbI_3$, $CsPbBr_{(3-y)}I_y(0<y<3)$, and $CsPbBr_{(3-y)}Cl_y(0<y<3)$.

Preferred examples of the perovskite compound having the three-dimensional structure also include $CH_3NH_3Pb_{(1-a)}Zn_aBr_3(0<a\leq0.7)$, $CH_3NH_3Pb_{(1-a)}Al_aBr_{(3+\delta)}(0<a\leq0.7, 0\leq\delta\leq0.7)$, $CH_3NH_3Pb_{(1-a)}Co_aBr_3(0<a\leq0.7)$, $CH_3NH_3Pb_{(1-a)}Mn_aBr_3(0<a\leq0.7)$, and $CH_3NH_3Pb_{(1-a)}Mg_aBr_3(0<a\leq0.7)$.

Preferred examples of the perovskite compound having the three-dimensional structure also include $CsPb_{(1-a)}Zn_aBr_3(0<a\leq0.7)$, $CsPb_{(1-a)}Al_aBr_{(3+\delta)}(0<a\leq0.7, 0<\delta\leq0.7)$, $CsPb_{(1-a)}Co_aBr_3(0<a\leq0.7)$, $CsPb_{(1-a)}Mn_aBr_3(0<a\leq0.7)$, and $CsPb_{(1-a)}Mg_aBr_3(0<a\leq0.7)$.

Preferred examples of the perovskite compound having the three-dimensional structure also include $CH_3NH_3Pb_{(1-a)}Zn_aBr_{(3-y)}I_y(0<a\leq0.7, 0<y<3)$, $CH_3NH_3Pb_{(1-a)}Al_aBr_{(3+\delta-y)}I_y(0<a\leq0.7, 0<\delta\leq0.7, 0<y<3)$, $CH_3NH_3Pb_{(1-a)}Co_aBr_{(3-y)}I_y(0<a\leq0.7, 0<y<3)$, $CH_3NH_3Pb_{(1-a)}Mn_aBr_{(3-y)}I_y(0<a\leq0.7, 0<y<3)$, $CH_3NH_3Pb_{(1-a)}Mg_aBr_{(3-y)}I_y(0<a\leq0.7, 0<y<3)$, $CH_3NH_3Pb_{(1-a)}Zn_aBr_{(3-y)}Cl_y(0<a\leq0.7, 0<y<3)$, $CH_3NH_3Pb_{(1-a)}Al_aBr_{(3+\delta-y)}Cl_y(0<a\leq0.7, 0<\delta\leq0.7, 0<y<3)$, $CH_3NH_3Pb_{(1-a)}Co_aBr_{(3+\delta-y)}Cl_y(0<a\leq0.7, 0<y<3)$, $CH_3NH_3Pb_{(1-a)}Mn_aBr_{(3-y)}Cl_y(0<a\leq0.7, 0<y<3)$, and $CH_3NH_3Pb_{(1-a)}Mg_aBr_{(3-y)}Cl_y(0<a\leq0.7, 0<y<3)$.

Preferred examples of the perovskite compound having the three-dimensional structure also include $(H_2N=CH-NH_2)Zn_aBr_3(0<a\leq0.7)$, $(H_2N=CH-NH_2)Mg_aBr_3(0<a\leq0.7)$, $(H_2N=CH-NH_2)Pb_{(1-a)}Zn_aBr_{(3-y)}I_y(0<a\leq0.7, 0<y<3)$, and $(H_2N=CH-NH_2)Pb_{(1-a)}Zn_aBr_{(3-y)}Cl_y(0<a\leq0.7, 0<y<3)$.

Among the above described perovskite compounds having the three-dimensional structure, $CsPbBr_3$, $CsPbBr_{(3-y)}I_y(0<y<3)$, $(H_2N=CH-NH_2)PbBr_3$ are more preferable, and $(H_2N=CH-NH_2)PbBr_3$ is still more preferable.

(Example of the Perovskite Compound Having the Two-Dimensional Structure)

Preferred examples of the perovskite compound having the two-dimensional structure include $(C_4H_9NH_3)_2PbBr_4$, $(C_4H_9NH_3)_2PbCl_4$, $(C_4H_9NH_3)_2PbI_4$, $(C_7H_{15}NH_3)_2PbBr_4$, $(C_7H_{15}NH_3)_2PbCl_4$, $(C_7H_{15}NH_3)_2PbI_4$, $(C_4H_9NH_3)_2Pb_{(1-a)}Li_aBr_{(4+\delta)}(0<a\leq0.7, -0.7\leq\delta<0)$, $(C_4H_9NH_3)_2Pb_{(1-a)}Na_aBr_{(4+\delta)}(0<a\leq0.7, -0.7\leq\delta<0)$, and $(C_4H_9NH_3)_2Pb_{(1-a)}Rb_aBr_{(4+\delta)}(0<a\leq0.7, -0.7\leq\delta<0)$.

Preferred examples of the perovskite compound having the two-dimensional structure also include $(C_7H_{15}NH_3)_2Pb_{(1-a)}Na_aBr_{(4+\delta)}(0<a\leq0.7, -0.7\leq\delta<0)$, $(C_7H_{15}NH_3)_2Pb_{(1-a)}Li_aBr_{(4+\delta)}(0<a\leq0.7, -0.7\leq\delta<0)$, and $(C_7H_{15}NH_3)_2Pb_{(1-a)}Rb_aBr_{(4+\delta)}(0<a\leq0.7, -0.7\leq\delta<0)$.

Preferred examples of the perovskite compound having the two-dimensional structure also include $(C_4H_9NH_3)_2Pb_{(1-a)}Na_aBr_{(4+\delta-y)}I_y(0<a\leq0.7, -0.7\leq\delta<0, 0<y<4)$, $(C_4H_9NH_3)_2Pb_{(1-a)}Li_aBr_{(4+\delta-y)}I_y(0<a\leq0.7, -0.7\leq\delta<0, 0<y<4)$, and $(C_4H_9NH_3)_2Pb_{(1-a)}Rb_aBr_{(4+\delta-y)}I_y(0<a\leq0.7, -0.7\leq\delta<0, 0<y<4)$.

Preferred examples of the perovskite compound having the two-dimensional structure also include $(C_4H_9NH_3)_2Pb_{(1-a)}Na_aBr_{(4+\delta-y)}Cl_y(0<a\leq0.7, -0.7\leq\delta<0, 0<y<4)$, $(C_4H_9NH_3)_2Pb_{(1-a)}Li_aBr_{(4+\delta-y)}Cl_y(0<a\leq0.7, -0.7\leq\delta<0, 0<y<4)$, and $(C_4H_9NH_3)_2Pb_{(1-a)}Rb_aBr_{(4+\delta-y)}CL_y(0<a\leq0.7, -0.7\leq\delta<0, 0<y<4)$.

Preferred examples of the perovskite compound having the two-dimensional structure also include $(C_4H_9NH_3)_2PbBr_4$ and $(C_7H_{15}NH_3)_2PbBr_4$.

Preferred examples of the perovskite compound having the two-dimensional structure also include $(C_4H_9NH_3)_2PbBr_{(4-y)}Cl_y(0<y<4)$ and $(C_4H_9NH_3)_2PbBr_{(4-y)}I_y(0<y<4)$.

Preferred examples of the perovskite compound having the two-dimensional structure also include $(C_4H_9NH_3)_2Pb_{(1-a)}Zn_aBr_4(0<a\leq0.7)$, $(C_4H_9NH_3)_2Pb_{(1-a)}Mg_aBr_4(0\leq a\leq0.7)$, $(C_4H_9NH)_2Pb_{(1-a)}Co_aBr_4(0<a\leq0.7)$, and $(C_4H_9NH_3)_2Pb_{(1-a)}Mn_aBr_4(0<a\leq0.7)$.

Preferred examples of the perovskite compound having the two-dimensional structure also include $(C_7H_{15}NH_3)_2Pb_{(1-a)}Zn_aBr_4(0<a\leq0.7)$, $(C_7H_{15}NH_3)_2Pb_{(1-a)}Mg_aBr_4(0<a\leq0.7)$, $(C_7H_{15}NH_3)_2Pb_{(1-a)}Co_aBr_4(0<a\leq0.7)$, and $(C_7H_{15}NH_3)_2Pb_{(1-a)}Mn_aBr_4(0<a\leq0.7)$.

Preferred examples of the perovskite compound having the two-dimensional structure also include $(C_4H_9NH_3)_2Pb_{(1-a)}Zn_aBr_{(4-y)}I_y(0<a\leq0.7, 0<y<4)$, $(C_4H_9NH_3)_2Pb_{(1-a)}Mg_aBr_{(4-y)}I_y(0<a\leq0.7, 0<y<4)$, $(C_4H_9NH_3)_2P_{(1-a)}Co_aBr_{(4-y)}I_y(0<a\leq0.7, 0<y<4)$, and $(C_4H_9NH_3)_2Pb_{(1-a)}Mn_aBr_{(4-y)}I_y(0<a\leq0.7, 0<y<4)$.

Preferred examples of the perovskite compound having the two-dimensional structure also include $(C_4H_9NH_3)_2Pb_{(1-a)}Zn_aBr_{(4-y)}Cl_y$ ($0<a\leq0.7$, $0<y<4$), $(C_4H_9NH_3)_2Pb_{(1-a)}Mg_aBr_{(4-y)}Cl_y$ ($0<a\leq0.7$, $0<y<4$), $(C_4H_9NH_3)_2Pb_{(1-a)}Co_aBr_{(4-y)}Cl_y$ ($0<a\leq0.7$, $0<y<4$), and $(C_4H_9NH_3)_2Pb_{(1-a)}Mn_aBr_{(4-y)}Cl_y$ ($0<a\leq0.7$, $0<y<4$).

(Particle Diameter of the Perovskite Compound (1))

The average particle diameter of the perovskite compound (1) is not particularly limited, but the average particle diameter thereof is preferably 1 nm or greater, more preferably 2 nm or greater, and still more preferably 3 nm or greater from the viewpoint of satisfactorily maintaining the crystal structure.

Further, the average particle diameter of the perovskite compound is preferably 10 μm or less because it is easy to maintain the desired light-emitting characteristics. The average particle diameter of the perovskite compound is more preferably 1 μm or less, and still more preferably 500 nm or less. The "light-emitting characteristic" refers to optical characteristics such as the quantum yield, emission intensity, and color purity of the converted light obtained by irradiating the perovskite compound with excitation light. The color purity can be evaluated by the half width of the spectrum of the converted light.

The upper limit values and lower limit values of the average particle diameter of the perovskite compound can be arbitrarily combined.

For example, the average diameter of the perovskite compound is preferably in a range of 1 nm to 10 μm, more preferably in a range of 2 nm to 1 μm, and still more preferably 3 nm to 500 nm.

In the present specification, the average particle diameter of the perovskite compound can be measured using, for example, a transmission electron microscope (hereinafter, also referred to as a TEM) and a scanning electron microscope (hereinafter, also referred to as a SEM). Specifically, the average particle diameter can be acquired by observing the maximum Feret diameter of twenty perovskite compounds using a TEM or a SEM and calculating the average maximum Feret diameter which is an average value of the obtained values.

The "maximum Feret diameter" in the present specification indicates the maximum distance between two straight lines parallel to each other which interpose the perovskite compound therebetween on a TEM or SEM image.

The median diameter (D50) of the perovskite compound (1) is not particularly limited, but the median diameter (D50) thereof is preferably 3 nm or greater from the viewpoint of satisfactorily maintaining the crystal structure. The median diameter (D50) of the perovskite compound is more preferably 4 nm or greater and still more preferably 5 nm or greater.

Further, the median diameter (D50) of the perovskite compound is preferably 5 μm or less because it is easy to maintain the desired light-emitting characteristics. The median diameter (D50) of the perovskite compound is more preferably 500 nm or less, and still more preferably 100 nm or less.

The upper limit values and lower limit values of the median diameter (D50) of the perovskite compound can be arbitrarily combined.

For example, the median diameter (D50) of the perovskite compound is preferably in a range of 3 nm to 5 μm, more preferably in a range of 4 nm to 500 nm, and still more preferably 5 nm to 100 nm.

In the present specification, the particle size distribution of the perovskite compound can be measured using, for example, a TEM or a SEM. Specifically, the median diameter (D50) thereof can be acquired by observing the maximum Feret diameter of twenty perovskite compounds using a TEM or a SEM and calculating the median diameter based on the distribution.

In the present embodiment, one type of the perovskite compound may be used alone, or two or more types of the perovskite compounds may be used in combination.

<<Halogen-Containing Compound (2)>>

The component (2) is a halogen-containing compound.

Examples of the halogen-containing compound in the present embodiment include a halogen-containing metal salt $MX_2$ (M is a divalent metal ion, and X is at least one ion selected from the group consisting of ions of F, Cl, Br and I), and an inorganic acid HX.

Examples of M include lead, tin, manganese, zinc, etc., and examples of the halogen-containing metal salt $MX_2$ include $PbI_2$, $PbBr_2$ and $PbCl_2$. However, the perovskite compound (1) described above is excluded.

Specific examples of the halogen-containing compound include a residue of the halogen compound used in the production process of the perovskite compound (1), a halogen compound contained in the solvent (3), and the surface modifier (5) contained as an optional component, a residue of a halogen compound contained in the modified product group (6).

The composition of the present embodiment preferably does not contain a halogen-containing compound. However, the contamination with halogen-containing compounds inevitably occurs during the production process. For example, the reaction residue in the step of preparing oleylamine bromide may remain. In the present invention, by controlling the amount of the halogen-containing compound as an inevitable contaminant, the composition with less amount of impurities can be obtained.

Ideally, the composition of the present embodiment does not contain a halogen-containing compound, but when the composition contains a halogen-containing compound, the amount of halogen atoms contained in the halogen compound is up to 5500 ppm by mass, preferably up to 2200 ppm by mass, more preferably up to 1300 ppm by mass, and even more preferably up to 1000 ppm by mass, even more preferably up to 900 ppm by mass, and particularly preferably up to 600 ppm by mass, based on the total mass of the composition.

As described above, it is preferable that the composition of the present embodiment does not contain a halogen-containing compound, but when the composition contains a halogen-containing compound from the viewpoint of reducing the production cost of the composition, the amount of halogen atoms contained in the halogen-containing compound (2) is generally 1 ppm by mass or more, or may be 108 ppm by mass or more or 130 ppm by mass or more, based on the total mass of the composition.

The above-described upper limit values and lower limit values can be arbitrarily combined.

As the combination of the upper limit values and the lower limit values, for example, the amount of halogen atoms is preferably 0 ppm by mass or more and 5500 ppm by mass or less, more preferably 0 ppm by mass or more and 2200 ppm by mass or less, even more preferably 1 ppm by mass or more and 1300 ppm by mass or less, even more preferably 108 ppm by mass or less and 1000 ppm by mass or less, even more preferably 130 ppm by mass or more and 900 ppm by mass or less, and particularly preferably 130 ppm by mass or more and 600 ppm by mass or less.

When the composition of the present embodiment contains a halogen-containing compound, only one of the above-mentioned halogen-containing compounds may be contained, or two or more of the above-mentioned halogen-containing compounds may be contained.

The amount of the halogen atoms contained in the halogen-containing compound (2) can be reduced by using, for example, a method such as removal by washing, dilution, or deaeration by gas flow.

The composition of the present embodiment is characterized in that the amount of the halogen-containing compound is not more than the upper limit value described above, i.e., the amount of impurities is small. Since less amount of impurities is present in the composition, when used in combination with a semiconductor material other than the perovskite compound (1), it is possible to suppress a decrease in the emission intensity of the semiconductor material used.

The amount of halogen atoms in the halogen-containing compound can be calculated by the following method.

The amount of halogen atoms contained in the halogen-containing compound can be determined by adding an ion-exchanged water to the composition to extract halogen ions of the halogen-containing compound into an aqueous layer, followed by determining the mass of halogen atoms in the aqueous layer by ion chromatography, and dividing the mass of halogen atoms by the mass of the composition. Alternatively, the amount of halogen atoms can be determined by extracting a halogen atom from the composition of the present embodiment with toluene and measuring the amount of halogen atoms by an ion chromatograph. Specific conditions for the extraction and ion chromatography will be described in detail in the Examples section.

<<Dispersion Medium>>

The composition of the present embodiment contains at least one dispersion medium selected from the group consisting of a component (3), a component (4), and a component (4-1).

Component (3): a solvent
Component (4): a polymerizable compound
Component (4-1): a polymer (3) Solvent The solvent is not particularly limited as long as the solvent is a medium in which the perovskite compound (1) can be dispersed. Further, a solvent in which the perovskite compound (1) is unlikely to be dissolved is preferable.

In the present specification, the "solvent" indicates a substance that enters a liquid state at 25° C. and 1 atm. However, the solvent does not include the polymerizable compound and the polymer described below.

Examples of such a solvent include the following (a) to (k).

(a): an ester
(b): a ketone
(c): an ether
(d): an alcohol
(e): glycol ether
(f): an organic solvent having an amide group
(g): an organic solvent having a nitrile group
(h): an organic solvent having a carbonate group
(i): a halogenated hydrocarbon
(j): a hydrocarbon
(k): dimethyl sulfoxide Examples of the ester (a) include methyl formate, ethyl formate, propyl formate, pentyl formate, methyl acetate, ethyl acetate, and pentyl acetate.

Examples of the ketone (b) include γ-butyrolactone, N-methyl-2-pyrrolidone, acetone, diisobutyl ketone, cyclopentanone, cyclohexanone, and methylcyclohexanone.

Examples of the ether (c) include diethyl ether, methyl-tert-butyl ether, diisopropyl ether, dimethoxymethane, dimethoxyethane, 1,4-dioxane, 1,3-dioxolane, 4-methyldioxolane, tetrahydrofuran, methyltetrahydrofuran, anisole, and phenetole.

Examples of the alcohol (d) include methanol, ethanol, 1-propanol, 2-propanol, 1-butanol, 2-butanol, tert-butanol, 1-pentanol, 2-methyl-2-butanol, methoxypropanol, diacetone alcohol, cyclohexanol, 2-fluoroethanol, 2,2,2-trifluoroethanol, and 2,2,3,3-tetrafluoro-1-propanol.

Examples of the glycol ether (e) include ethylene glycol monomethyl ether, ethylene glycol monoethyl ether, ethylene glycol monobutyl ether, ethylene glycol monoethyl ether acetate, and triethylene glycol dimethyl ether.

Examples of the organic solvent (f) containing an amide group include, N,N-dimethylformamide, acetamide, and N,N-dimethylacetamide.

Examples of the organic solvent (g) having a nitrile group include acetonitrile, isobutyronitrile, propionitrile, and methoxy acetonitrile.

Examples of the organic solvent (h) having a carbonate group include ethylene carbonate and propylene carbonate.

Examples of the halogenated hydrocarbon (i) include methylene chloride and chloroform.

Examples of the hydrocarbon (j) include n-pentane, cyclohexane, n-hexane, 1-octadecene, benzene, toluene, xylene.

Among these solvents, an ester (a), a ketone (b), an ether (c), an organic solvent (g) having a nitrile group, an organic solvent (h) having a carbonate group, and a hydrocarbon (j) are preferable, because these have a low polarity and are considered to be unlikely to dissolve the perovskite compound (1). Further, a hydrocarbon-based organic solbent (j) is more preferable from the viewpoint of controlling the amount of halogen atoms in the halogen-containing compound (2).

In the composition of the present embodiment, one type of the above described solvent may be used alone, or two or more types of the solvents may be used in combination.

(4) Polymerizable Compound

As the polymerizable compound contained in the composition according to the present embodiment, a polymerizable compound with a low solubility of the perovskite compound (1) at the temperature at which the composition according to the present embodiment is produced is preferable.

In the present specification, the "polymerizable compound" indicates a monomer compound (monomer) containing a polymerizable group. For example, the polymerizable compound is a monomer that enters a liquid state at 25° C. and 1 atm.

For example, in a case where the composition is produced at room temperature under normal pressure, the polymerizable compound is not particularly limited. Examples of the polymerizable compound include known polymerizable compounds such as styrene, acrylic acid ester, methacrylic acid ester, and acrylonitrile. Among these, any one or both of acrylic acid ester and methacrylic acid ester serving as a monomer of an acrylic resin are preferable as the polymerizable compound.

In the composition of the present embodiment, one type of the polymerizable compound may be used alone, or two or more types of the polymerizable compounds may be used in combination.

In the composition of the present embodiment, the ratio of the total amount of the acrylic acid ester and the methacrylic acid ester with respect to all the polymerizable compound (4) may be 10 mol % or greater. The ratio may be 30 mol % or greater, 50 mol % or greater, 80 mol % or greater, or 100 mol %.

(4-1) Polymer

As the polymer in the composition of the present embodiment, a polymer with a low solubility of the perovskite compound (1) at the temperature at which the composition according to the present embodiment is produced is preferable.

For example, in a case where the composition is produced at room temperature under normal pressure, the polymer is not particularly limited, and examples thereof include known polymers such as polystyrene, acrylic resins, and epoxy resins. Among these, an acrylic resin is preferable as the polymer. The acrylic resin has one or both of a constitutional unit derived from acrylic acid ester and a constitutional unit derived from methacrylic acid ester.

In the composition of the present embodiment, the ratio of the total amount of the constitutional unit derived from the acrylic acid ester and the constitutional unit derived from the methacrylic acid ester with respect to the amount of all constitutional units contained in the polymer (4-1) may be 10 mol % or greater. The ratio may be 30 mol % or greater, 50 mol % or greater, 80 mol % or greater, or 100 mol %.

The weight-average molecular weight of the polymer (4-1) is preferably in a range of 100 to 1200000, more preferably in a range of 1000 to 800000, and still more preferably in a range of 5000 to 150000.

In the composition of the present embodiment, one type of the polymer may be used alone, or two or more types of the polymers may be used in combination.

In the present specification, the "weight average molecular weight" indicates a value in terms of polystyrene to be measured according to a gel permeation chromatography (GPC) method.

<Regarding Compounding Ratio of Each Component>

In the composition of the present embodiment, the amount of the perovskite compound (1) with respect to the total mass of the composition is not particularly limited.

The amount of the perovskite compound (1) with respect to the total mass of the composition is preferably 90% by mass or less, more preferably 40% by mass or less, still more preferably 10% by mass or less, and even still more preferably 3% by mass of less, from the viewpoint of preventing the concentration quenching.

The amount of the perovskite compound (1) with respect to the total mass of the composition is preferably 0.0002% by mass or greater, more preferably 0.002% by mass or greater, still more preferably 0.01% by mass or greater, from the viewpoint of obtaining an excellent quantum yield.

The above-described upper limit values and lower limit values can be arbitrarily combined.

The amount of the perovskite compound (1) with respect to the total mass of the composition is typically in a range of 0.0002% to 90% by mass.

The amount of the perovskite compound (1) with respect to the total mass of the composition is preferably in a range of 0.001% to 40% by mass, more preferably in a range of 0.002% to 10% by mass, and still more preferably in a range of 0.01% to 3% by mass.

From the viewpoints of making the perovskite compound (1) difficult to aggregate and exhibiting an excellent light-emitting property, a composition in which the amount of the perovskite compound (1) with respect to the total mass of the composition is in the above-described range is preferable.

Further, in the above described composition, total content ratio of the perovskite compound (1) and dispersion medium may be 90% by mass or greater, 95% by mass or greater, 99% by mass or greater, and 100% by mass or greater, with respect to the total mass of the composition.

In the composition, the mass ratio of the perovskite compound (1) to dispersion medium [perovskite compound (1)/(dispersion medium)] may be 0.00001 to 10, 0.0001 to 2, or 0.0005 to 1.

From the viewpoints of making the perovskite compound (1) difficult to aggregate and exhibiting an excellent light-emitting property, it is preferable that the compounding ratio between the perovskite compound (1) and the dispersion medium is in the above-described range.

The composition according to the present embodiment may further include components (hereinafter, referred to as "other components") other than the perovskite compound (1), the solvent (3), the polymerizable compound (4), and the polymer (4-1).

Examples of other components include a compound having an amorphous structure formed of a small amount of impurities and an element component constituting the perovskite compound (1), and a polymerization initiator.

The amount of other components is preferably 10% by mass or less, more preferably 5% by mass or less, and still more preferably 1% by mass or less with respect to the total mass of the composition.

As a polymer (4-1) contained in the composition according to the present embodiment, the above-described polymer (4-1) can be employed.

In the composition according to the present embodiment, it is preferable that the perovskite component (1) is dispersed in the polymer (4-1).

In the composition, the compounding ratio between the perovskite compound (1) and the polymer (4-1) may be such that the perovskite compound satisfactorily exhibits a light-emitting effect. The compounding ratio can be appropriately determined depending on the types of perovskite compound (1) and polymer (4-1).

In the composition, the amount of the perovskite compound (1) with respect to the total mass of the composition is not particularly limited. The amount of the perovskite compound (1) with respect to the total mass of the composition is preferably 90% by mass or less, more preferably 40% by mass or less, still more preferably 10% by mass or less, and even still more preferably 3% by mass of less, from the viewpoint of preventing the concentration quenching.

The amount of the perovskite compound (1) with respect to the total mass of the composition is preferably 0.0002% by mass or greater, more preferably 0.002% by mass or greater, still more preferably 0.01% by mass or greater, from the viewpoint of obtaining an excellent quantum yield.

The above-described upper limit values and lower limit values can be arbitrarily combined.

The amount of the perovskite compound (1) with respect to the total mass of the composition is typically in a range of 0.0001% to 30% by mass.

The amount of the perovskite compound (1) with respect to the total mass of the composition is preferably in a range of 0.0001% to 10% by mass, more preferably in a range of 0.0005% to 10% by mass, and still more preferably in a range of 0.001% to 3% by mass.

In the composition, the mass ratio of the perovskite compound (1) to the polymer (4-1) [perovskite compound (1)/polymer (4-1)] may be 0.00001 to 10, 0.0001 to 2, or 0.0005 to 1.

From the viewpoint of exhibiting an excellent light-emitting property, it is preferable that the compounding ratio between the perovskite compound (1) and the polymer (4-1) is in the above-described range.

In the composition of the present embodiment, the total amount of the perovskite compound (1) and the polymer (4-1) is 90% by mass or greater with respect to the total mass of the composition. The total amount of the perovskite compound (1) and the polymer (4-1) may be 95% by mass or greater, 99% by mass or greater, or 100% by mass, with respect to the total mass of the composition.

The composition of the present embodiment may contain the same components as the other components described above. The amount of the other components is preferably 10% by mass or less, more preferably 5% by mass or less, and still more preferably 1% by mass or less, with respect to the total mass of the composition.

<<Composition Containing Component (1), Component (2), and Component (10)>>

The composition of the present embodiment contains a component (1), a component (2), and a component (10), in which the mass ratio of halide ions contained in the component (2) to the component (10) (mass of halide ions contained in the component (2)/mass of the component (10)) is 3.0 or less.

Component (1): A Perovskite Compound Containing Constituent Components A, B, and X The constituent component A indicates a component positioned at each vertex of a hexahedron having the constituent component B at its center in a perovskite type crystal structure, and is a monovalent cation.

The constituent component X indicates a component positioned at each vertex of an octahedron having the constituent component B at the center in the perovskite type crystal structure, and is one or more kinds of anions selected from the group consisting of a halide ion and a thiocyanate ion.

The constituent component B indicates a component positioned at a center of a hexahedron having the constituent component A at each vertex and at a center of an octahedron having the constituent component X at each vertex in the perovskite type crystal structure, and is a metal ion.

Component (2): A Halogen-Containing Compound

Component (10): A Luminescent Semiconductor Material

The composition according to the present embodiment is a composition containing the component (1), the component (2), and the component (10), in which the mass ratio of halide ions contained in the component (2) to the component (10) (mass of halide ions contained in the component (2)/mass of the component (10)) may be 3.0 or less.

The description of the perovskite compound (1) and halogen-containing compound (2) is the same as described above. A luminescent semiconductor material as a component (10) will be described.

<<(10) Semiconductor Material>>

In the present specification, the component (10) is sometimes referred to as the semiconductor material (10).

Examples of the luminescent semiconductor material contained in the composition of the present embodiment include the following (i) to (vii).

(i) a semiconductor material containing Group II-VI compound semiconductor (ii) a semiconductor material containing Group II-V compound semiconductor (iii) a semiconductor material containing Group III-V compound semiconductor (iv) a semiconductor material containing Group III-IV compound semiconductor (v) a semiconductor material containing Group III-VI compound semiconductor (vi) a semiconductor material containing Group IV-VI compound semiconductor (vii) a semiconductor material containing transition metal-p-block compound semiconductor The perovskite compound (1) is not included in the luminescent semiconductor material (10).

<(i) Semiconductor Material Containing Group II-VI Compound Semiconductor>

Examples of the Group II-VI compound semiconductor include a compound semiconductor containing the Group 2 element and the Group 16 element in the periodic table, and a compound semiconductor containing the Group 12 element and the Group 16 element in the periodic table.

In the present specification, the "periodic table" indicates the long-period type periodic table.

In the following description, the compound semiconductor containing the Group 2 element and the Group 16 element is sometimes referred to as a "compound semiconductor (i-1)", and the compound semiconductor containing the Group 12 element and the Group 16 element is sometimes referred to as a "compound semiconductor (i-2)".

Among the compound semiconductors (i-1), examples of the binary compound semiconductor include MgS, MgSe, MgTe, CaS, CaSe, CaTe, SrS, SrSe, SrTe, BaS, BaSe, and BaTe.

Further, the compound semiconductor (i-1) may be a ternary compound semiconductor (i-1-1) containing one type of Group 2 element and two types of Group 16 element, a ternary compound semiconductor (i-1-2) containing two types of Group 2 element and one type of Group 16 element, or a quaternary compound semiconductor (i-1-3) containing two types of Group 2 element and two types of Group 16 element.

Among the compound semiconductors (i-2), examples of the binary compound semiconductor include ZnS, ZnSe, ZnTe, CdS, CdSe, CdTe, HgS, HgSe, and HgTe.

Further, the compound semiconductor (i-2) may be a ternary compound semiconductor (i-2-1) containing one type of Group 12 element and two types of Group 16 element, a ternary compound semiconductor (i-2-2) containing two types of Group 12 element and one type of Group 16 element, or a quaternary compound semiconductor (i-2-3) containing two types of Group 12 element and two types of Group 16 element.

The Group II-VI compound semiconductor may contain an element other than the Group 2 elements, the Group 12 elements, and the Group 16 elements as a doping element.

<(ii) Semiconductor Material Containing Group II-V Compound Semiconductor>

The Group II-V compound semiconductor include the Group 12 element and the Group 15 element.

Among the Group II-V compound semiconductor, examples of the binary compound semiconductor include $Zn_3P_2$, $Zn_3As_2$, $Cd_3P_2$, $Cd_3As_2$, $Cd_3N_2$, and $Zn_3N_2$.

Further, the Group II-V compound semiconductor may be a ternary compound semiconductor (ii-1) containing one type of Group 12 element and two types of Group 15 element, a ternary compound semiconductor (ii-2) containing two types of Group 12 element and one type of Group 15 element, or a quaternary compound semiconductor (ii-3) containing two types of Group 12 element and two types of Group 15 element.

The Group II-V compound semiconductor may contain an element other than the Group 12 elements and the Group 15 elements as a doping element.

<(iii) Semiconductor Material Containing Group III-V Compound Semiconductor>

The Group III-V compound semiconductor include the Group 13 element and the Group 15 element.

Among the Group III-V compound semiconductor, examples of the binary compound semiconductor include BP, AlP, AlAs, AlSb, GaN, GaP, GaAs, GaSb, InN, InP, InAs, InSb, AlN, and BN.

Further, the Group III-V compound semiconductor may be a ternary compound semiconductor (iii-1) containing one type of Group 13 element and two types of Group 15 element, a ternary compound semiconductor (iii-2) containing two types of Group 13 element and one type of Group 15 element, or a quaternary compound semiconductor (iii-3) containing two types of Group 13 element and two types of Group 15 element.

The Group III-V compound semiconductor may contain an element other than the Group 13 elements and the Group 15 elements as a doping element.

<(iv) Semiconductor Material Containing Group III-IV Compound Semiconductor>

The Group III-IV compound semiconductor include the Group 13 element and the Group 14 element.

Among the Group III-IV compound semiconductor, examples of the binary compound semiconductor include $B_4C_3$, $Al_4C_3$, and $Ga_4C_3$.

Further, the Group III-IV compound semiconductor may be a ternary compound semiconductor (iv-1) containing one type of Group 13 element and two types of Group 14 element, a ternary compound semiconductor (iv-2) containing two types of Group 13 element and one type of Group 14 element, or a quaternary compound semiconductor (iv-3) containing two types of Group 13 element and two types of Group 14 element.

The Group III-IV compound semiconductor may contain an element other than the Group 13 elements and the Group 14 elements as a doping element.

<(v) Semiconductor Material Containing Group III-VI Compound Semiconductor>

The Group III-VI compound semiconductor include the Group 13 element and the Group 16 element.

Among the Group III-VI compound semiconductor, examples of the binary compound semiconductor include $Al_2S_3$, $Al_2Se_3$, $Al_2Te_3$, $Ga_2S_3$, $Ga_2Se_3$, $Ga_2Te_3$, GaTe, $In_2S_3$, $In_2Se_3$, $In_2Te_3$, and InTe.

Further, the Group III-VI compound semiconductor may be a ternary compound semiconductor (v-1) containing one type of Group 13 element and two types of Group 16 element, a ternary compound semiconductor (v-2) containing two types of Group 13 element and one type of Group 16 element, or a quaternary compound semiconductor (v-3) containing two types of Group 13 element and two types of Group 16 element.

The Group III-VI compound semiconductor may contain an element other than the Group 13 elements and the Group 16 elements as a doping element.

<(vi) Semiconductor Material Containing Group IV-VI Compound Semiconductor>

The Group IV-VI compound semiconductor include the Group 14 element and the Group 16 element.

Among the Group IV-VI compound semiconductor, examples of the binary compound semiconductor include PbS, PbSe, PbTe, SnS, SnSe, and SnTe.

Further, the Group IV-VI compound semiconductor may be a ternary compound semiconductor (vi-1) containing one type of Group 14 element and two types of Group 16 element, a ternary compound semiconductor (vi-2) containing two types of Group 14 element and one type of Group 16 element, or a quaternary compound semiconductor (vi-3) containing two types of Group 14 element and two types of Group 16 element.

The Group IV-VI compound semiconductor may contain an element other than the Group 14 elements and the Group 16 elements as a doping element.

<(vii) Semiconductor Material Containing Transition Metal-p-Block Compound Semiconductor>

The transition metal-p-block compound semiconductor include transition metal element and p-block element. The "p-block element" is an element belonging to Groups 13 to 18 of the periodic table.

Among the transition metal-p-block compound semiconductors, examples of the binary compound semiconductor include NiS and CrS.

Further, the transition metal-p-block compound semiconductor may be a ternary compound semiconductor (vii-1) containing one type of transition metal element and two types of p-block element, a ternary compound semiconductor (vii-2) containing two types of transition metal element and one type of p-block element, or a quaternary compound semiconductor (vii-3) containing two types of transition metal element and two types of p-block element.

The transition metal-p-block compound semiconductor may contain an element other than transition metal and p-block element as a doping element.

Specific examples of the above described ternary compound semiconductor and quaternary compound semiconductor include ZnCdS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, ZnCdSSe, CdZnSeS, CdZnSeTe, CdZnSTe, CdHgSeS, CdHgSeTe, CdHgSTe, HgZnSeS, HgZnSeTe, HgZnSTe, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, $CuInS_2$ and InAlPAs.

In the present embodiment, among the above described compound semiconductors, a compound semiconductor containing Cd which is the Group 12 element, and a compound semiconductor containing In which is the Group 13 element are preferable. Further, in the present embodiment, among the above described compound semiconductors, a compound semiconductor containing Cd and Se and a compound semiconductor containing In and P are preferable.

As the compound semiconductor containing Cd and Se, any of a binary compound semiconductor, a ternary compound semiconductor, and a quaternary compound semiconductor is preferable. Among them, CdSe, which is a binary compound semiconductor, is particularly preferable.

As the compound semiconductor containing In and P, any of a binary compound semiconductor, a ternary compound semiconductor, and a quaternary compound semiconductor is preferable. Among them, InP, which is a binary compound semiconductor, is particularly preferable.

In the present embodiment, a semiconductor material containing Cd or a semiconductor material containing In is preferable, and CdSe or InP is more preferable.

Ideally, the composition of the present embodiment does not contain a halogen-containing compound, but when the composition contains a halogen-containing compound, the mass ratio of halide ions contained in halogen-containing compound (2) to the semiconductor material (10) [halide ions contained in halogen-containing compound (2)/semiconductor material (10)] is 3.0 or less, preferably 1.1 or less, more preferably 0.65 or less, still more preferably 0.6 or less, even more preferably 0.25 or less, even more preferably 0.1 or less, even more preferably 0.07 or less, and particularly preferably 0.05 or less, from the viewpoint of suppressing a decrease in the emission quantum yield of the semiconductor material (10).

As described above, the composition of the present embodiment preferably does not contain a halogen-containing compound, but when the composition contains a halogen-containing compound, the mass ratio of halide ions contained in halogen-containing compound (2) to the semiconductor material (10) [halide ions contained in halogen-containing compound (2)/semiconductor material (10)] may be typically 0.0130 or greater.

The above-described upper limit values and lower limit values can be arbitrarily combined.

As the combination of the upper limit values and the lower limit values, for example, the mass ratio of halide ions contained in halogen-containing compound (2) to the semiconductor material (10) [halide ions contained in halogen-containing compound (2)/semiconductor material (10)] is preferably 0 or greater and 3.0 or less, more preferably 0 or greater and 1.1 or less, still more preferably 0.0130 or greater and 0.65 or less, even more preferably 0.0130 or greater and 0.6 or less, even more preferably 0.0130 or greater and 0.25 or less, even more preferably 0.0130 or greater and 0.1 or less, even more preferably 0.0130 or greater and 0.07 or less, and particularly prefeatably 0.0130 or gerater and 0.05 or less.

The mass ratio of halide ions contained in halogen-containing compound (2) to the semiconductor material (10) [halide ions contained in halogen-containing compound (2)/semiconductor material (10)] can be obtained by the following method.

First, the halogen-containing compound (2) is extracted from the composition of the present embodiment with water, and then the mass of the halide ion contained in the halogen-containing compound (2) is measured by an ion chromatograph. Then, it can be calculated from the mass of the semiconductor material (10) contained in the composition by the following Formula.

Mass of halide ion contained in halogen-containing compound (2)/Mass of semiconductor material (10)

In the present embodiment, one type of the semiconductor material (10) may be used alone, or two or more types of the p semiconductor materials may be used in combination.

<<Modified Product Group (6)>>

The composition of the present embodiment preferably contains a modified product group (6) as an optional component.

The modified product group (6) is at least one compound selected from the group consisting of silazane, a modified product of silazane, a compound represented by following Formula (C1), a modified product of the compound represented by following Formula (C1), a compound represented by following Formula (C2), a modified product of the compound represented by following Formula (C2), a compound represented by following Formula (A5-51), a modified product of the compound represented by following Formula (A5-51), a compound represented by following Formula (A5-52), a modified product of the compound represented by following Formula (A5-52), sodium silicate, and a modified product of sodium silicate. Among them, the modified product group (6) is preferably at least one compound selected from the group consisting of a modified product of silazane, a modified product of the compound represented by following Formula (C1), a modified product of the compound represented by following Formula (C2), a modified product of the compound represented by following Formula (A5-51), a modified product of the compound represented by following Formula (A5-52), and a modified product of sodium silicate, and more preferably a modified product of silazane, from the viewpoint of improving durability.

In the present embodiment, one type of the compound selected from the modified product group (6) may be used alone, or two or more types of the compounds selected from the modified product group (6) may be used in combination.

In the composition, the modified product group (6) forms a shell structure with the perovskite compound (1) or the semiconductor material (10) as a core, in which at least a part of the surface is covered with the surface modifier (5). It is preferable that the modified product group (6) forms a shell structure with the perovskite compound (1) as a core. Specifically, it is preferable that the modified product group (6) covers the surface of the surface modifier (5) by overlapping with the surface modifier (5) which covers the perovskite compound (1) or the semiconductor material (10). The modified product may cover the surface the perovskite compound (1) or the semiconductor material (10), in which the surface modifier does not cover.

In the present embodiment, the modified product group (6) covering the surface of the perovskite compound (1) or the surface modifier (5), or the modified product group (6) covering the surface of the semiconductor material (10) or the surface modifier (5) can be confirmed, for example, by observing the composition using SEM, TEM, or the like. Further, detailed element distribution can be analyzed by EDX measurement using SEM or TEM.

In the present specification, the term "modification" means that a silicon compound having a Si—N bond, a Si—SR bond (R is a hydrogen atom or an organic group) or a Si—OR bond (R is a hydrogen atom or an organic group) is hydrolyzed to generate a silicon compound having a Si—O—Si bond. The Si—O—Si bond may be generated by an intermolecular condensation reaction or an intramolecular condensation reaction.

In the present specification, the term "modified product" refers to a compound obtained by modifying a silicon compound having a Si—N bond, a Si—SR bond, or a Si—OR bond.

(1. Silazane)

A silazane is a compound having a Si—N—Si bond. The silazane may be linear, branched, or cyclic.

The silazane may be of a low molecular weight or a high molecular weight. In the present specification, the silazan having a high molecular weight is sometime referred to as polysilazane.

The "low-molecular-weight" in the present specification indicates that the number average molecular weight is less than 600.

Further, the "high-molecular-weight" indicates that the number average molecular weight is in a range of 600 to 2000.

In the present specification, the "number average molecular weight" indicates a value in terms of polystyrene to be measured according to a gel permeation chromatography (GPC) method.

(1-1. Low Molecular Weight Silazane)

As the silazane, for example, disilazane represented by the following Formula (B1), which is a low molecular weight silazane, is preferable.

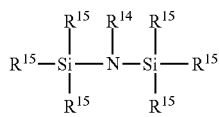
(B1)

In Formula (B1), $R^{14}$ and $R^{15}$ each independently represent a hydrogen atom, an alkyl group having 1 to 20 carbon atoms, an alkenyl group having 1 to 20 carbon atoms, a cycloalkyl group having 3 to 20 carbon atoms, an aryl group having 6 to 20 carbon atoms, or an alkylsilyl group having 1 to 20 carbon atoms.

$R^{14}$ and $R^{15}$ may have a substituent such as an amino group. A plurality of $R^{15}$'s may be the same as or different from one another.

Examples of the low-molecular-weight silazane represented by Formula (B1) include 1,3-divinyl-1,1,3,3-tetramethyldisilazane, 1,3-diphenyltetramethyldisilazane, and 1,1,1,3,3,3-hexamethyldisilazane.

(1-2. Low Molecular Weight Silazane)

As the silazane, for example, a low molecular weight silazane represented by the following Formula (B2) is also preferable.

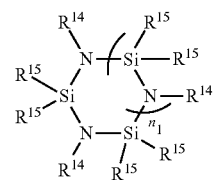
(B2)

In Formula (B2), $R^{14}$ and $R^{15}$ are the same as $R^{14}$ and $R^{15}$ in the above Formula (B1).

A plurality of $R^{14}$'s may be the same as or different from one another.

A plurality of $R^{15}$'s may be the same as or different from one another.

In Formula (B2), $n_1$ represents an integer of 1 to 20. $n_1$ may represent an integer of 1 to 10, or 1 or 2.

Examples of the low-molecular-weight silazane represented by Formula (B2) include octamethylcyclotetrasilazane, 2,2,4,4,6,6,-hexamethylcyclotrisilazane, and 2,4,6-trimethyl-2,4,6-trivinylcyclotrisilazane.

As the low-molecular-weight silazane, octamethylcyclotetrasilazane or 1,3-diphenyltetramethyldisilazane is preferable, and octamethylcyclotetrasilazane is more preferable.

(1-3. High Molecular Weight Silazane)

As the silazane, for example, the high molecular weight silazane (polysilazane) represented by the following Formula (B3) is preferable.

A polysilazane is a polymer compound having a Si—N—Si bond. The constituent unit represented by Formula (B3) may be used alone or in combination of a plurality of kinds thereof.

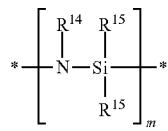
(B3)

In Formula (B3), $R^{14}$ and $R^{15}$ are the same as $R^{14}$ and $R^{15}$ in the above Formula (B1).

In Formula (B3), the symbol "*" represents a bonding site. $R^{14}$ is bonded to the bonding site of the nitrogen atom at the end of the molecular chain.

$R^{15}$ is bonded to the bonding site of the Si atom at the end of the molecular chain.

A plurality of $R^{14}$'s may be the same as or different from one another.

A plurality of $R^{15}$'s may be the same as or different from one another.

m represents an integer of 2 to 10000.

The polysilazane represented by Formula (B3) may be a perhydropolysilazane in which all of R14's and R15's represent a hydrogen atom.

The polysilazane represented by Formula (B3) may be an organopolysilazane in which at least one $R^{15}$ represents a group other than the hydrogen atom. According to the application thereof, the perhydropolysilazane or organopolysilazane may be appropriately selected or can be used by being mixed.

(1-4. High Molecular Weight Silazane)

As the polysilazane, for example, polysilazane having a structure represented by following Formula (B4) is also preferable.

The polysilazane may have a ring structure in a portion of a molecule. For example, the polysilazane may have a structure represented by Formula (B4).

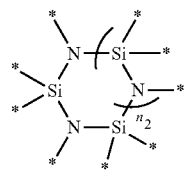
(B4)

In Formula (B4), the symbol "*" represents a bonding site.

The bonding site of Formula (B4) may be bonded to the bonding site in polysilazane represented by Formula (B3) or the bonding site in constituent unit of polysilazane represented by Formula (B3).

Further, in a case where polysilazane contains plurality of structures represented by Formula (B4) in the molecule, the bonding site of the structure represented by Formula (B4) may be directly bonded to the bonding site of the structure represented by another Formula (B4).

$R^{14}$ is bonded to the bonding site of nitrogen atom which is not bonded to any of the bonding site of polysilazane represented by Formula (3), the bonding site of the constituent unit of polysilazane represented by Formula (3), and the bonding site of the structure represented by another Formula (4).

$R^{15}$ is bonded to the bonding site of Si atom which is not bonded to any of the bonding site of polisilazane represented by Formula (3), the bonding site of the constituent unit of polysilazane represented by Formula (3), and the bonding site of the structure represented by another Formula (4).

$n_2$ represents an integer of 1 to 10000. $n_2$ may represent an integer of 1 to 10, or 1 or 2.

A typical polysilazane has, for example, a structure in which a linear structure and a ring structure such as a 6-membered ring or a 8-membered ring are present. In other words, a typical polysilazane has a structure represented by the Formula (B3) or a structure represented by Formula (B4). The molecular weight of a typical polisilazane is approximately 600 to 2000 (in terms of polystyrene) as the number average molecular weight (Mn), and the silazane may be a substance in a liquid or solid state depending on the molecular weight thereof.

As the polysilazane, a commercially available product may be used, and examples of the commercially available product include NN120-10, NN120-20, NAX120-20, NN110, NAX120, NAX110, NL120A, NL110A, NL150A, NP110, and NP140 (all manufactured by AZ Electronic Materials plc), AZNN-120-20, Durazane (registered trademark) 1500 Slow Cure, Durazane 1500 Rapid Cure, Durazane 1800, and Durazane 1033 (all manufactured by Merck Performance Materials Ltd.).

As the polysilazane, AZNN-120-20, Durazane 1500 Slow Cure or Durazane 1500 Rapid cure is preferable, and Durazane 1500 Slow Cure is more preferable.

In the modified product of low molecular weight silazane represented by Formula (B2), the ratio of silicon atoms not bonded to nitrogen atoms is preferably in a range of 0.1 to 100% with respect to all silicon atoms. Further, the ratio of silicon atoms not bonded to nitrogen atoms is more preferably in a range of 10 to 98%, and still more preferably in a range of 30 to 95%.

The "ratio of silicon atoms not bonded to nitrogen atoms" can be obtained from "((Si (mol))−(N (mol) in SiN bond))/Si (mol)×100", using the measured values described below. Considering the modification reaction, the "ratio of silicon atoms not bonded to nitrogen atoms" means the "ratio of silicon atoms contained in the siloxane bond generated by the modification treatment".

In the modified product of polysilazane represented by Formula (B3), the ratio of silicon atoms not bonded to nitrogen atoms is preferably in a range of 0.1 to 100% with respect to all silicon atoms. Further, the ratio of silicon atoms not bonded to nitrogen atoms is more preferably in a range of 10 to 98%, and still more preferably in a range of 30 to 95%.

In the modified product of polysilazane having the structure represented by Formula (B4), the ratio of silicon atoms not bonded to nitrogen atoms is preferably in a range of 0.1 to 100% with respect to all silicon atoms. Further, the ratio of silicon atoms not bonded to nitrogen atoms is more preferably in a range of 10 to 97%, and still more preferably in a range of 30 to 95%.

The number of Si atoms, the number of SiN bonds in the modified product can be measured by X-ray photoelectron spectroscopy (hereinafter, also referred to as XPS).

In the modified product, the "ratio of silicon atoms not bonded to nitrogen atoms" determined using the values measured by the above method is preferably 0.1 to 99%, more preferably 10 to 99%, and still more preferably 30 to 95%, with respect to the total silicon atoms.

The modified product of silazane is not particularly limited, but a modified product of organopolysilazane is preferable from the viewpoints of improving the dispersibility and suppressing aggregation.

The organopolysilazane may be, for example, an organopolysilazane represented by Formula (B3) in which at least one of $R^{14}$ and $R^{15}$ is an alkyl group having 1 to 20 carbon atoms, an alkenyl group having 1 to 20 carbon atoms, a cycloalkyl group having 3 to 20 carbon atoms, an aryl group having 6 to 20 carbon atoms, or alkylsilyl group having 1 to 20 carbon atoms.

Further, the organopolysilazane may be, for example, an organopolysilazane including a structure represented by Formula (B4) in which at least one bonding site is bonded to $R^{14}$ or $R^{15}$, and at least one of $R^{14}$ and $R^{15}$ is an alkyl group having 1 to 20 carbon atoms, an alkenyl group having 1 to 20 carbon atoms, a cycloalkyl group having 3 to 20 carbon atoms, an aryl group having 6 to 20 carbon atoms, or alkylsilyl group having 1 to 20 carbon atoms.

It is preferable that the organopolysilazane is an organopolysilazane represented by Formula (B3) in which at least one of $R^{14}$ and $R^{15}$ is a methyl group, or a polysilazane including a structure represented by Formula (B4) in which at least one bonding site is bonded to $R^{14}$ or $R^{15}$ and at least one of the $R^{14}$ and $R^{15}$ is a methyl group.

(2. Compound Represented by Formula (C1) and Compound Represented by Formula (C2))

In the present embodiment, the compound represented by the following Formula (C1) or the compound represented by the following Formula (C2) may be used.

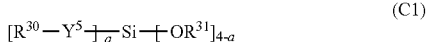

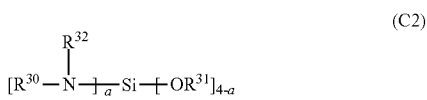

In the formula (C1), $Y^5$ represents a single bond, an oxygen atom, or a sulfur atom.

In a case where $Y^5$ is an oxygen atom, each of $R^{30}$ and $R^{31}$ independently represents a hydrogen atom, an alkyl group having 1 to 20 carbon atoms, a cycloalkyl group having 3 to 30 carbon atoms, or an unsaturated hydrocarbon group having 2 to 20 carbon atoms.

In a case where $Y^5$ is a single bond or a sulfur atom, $R^{30}$ represents an alkyl group having 1 to 20 carbon atoms, a cycloalkyl having 3 to 30 carbon atoms, or an unsaturated hydrocarbon group having 2 to 20 carbon atoms, and $R^{31}$ represents a hydrogen atom, an alkyl group having 1 to 20 carbon atoms, a cycloalkyl group having 3 to 30 carbon atoms, or an unsaturated hydrocarbon group having 2 to 20 carbon atoms.

In Formula (C2), each of $R^{30}$, $R^{31}$, and $R^{32}$ independently represents a hydrogen atom, an alkyl group having 1 to 20 carbon atoms, a cycloalkyl group having 3 to 30 carbon atoms, or an unsaturated hydrocarbon group having 2 to 20 carbon atoms.

In Formula (C1) and (C2), hydrogen atoms included in the alkyl group, the cycloalkyl group and the unsaturated hydrocarbon group represented by $R^{30}$, $R^{31}$, or $R^{32}$ are each independently substituted by or not substituted by a halogen atom or an amino group.

Examples of the halogen atom which may substitute the hydrogen atoms included in the alkyl group, the cycloalkyl group and the unsaturated hydrocarbon group represented by $R^{30}$, $R^{31}$, or $R^{32}$ include a fluorine atom, a chlorine atom, a bromine atom and an iodine atom, among which a fluorine atom is preferable due to its high chemical stability.

In Formula ($C_1$) and Formula ($C_2$), a is an integer of 1 to 3.

When a is 2 or 3, a plurality of $Y^5$ is the same or different.
When a is 2 or 3, a plurality of $R^{30}$ is the same or different.
When a is 2 or 3, a plurality of $R^{33}$ is the same or different.
When a is 1 or 2, a plurality of $R^{31}$ is the same or different.

The alkyl group represented by $R^{30}$ or $R^{31}$ may be either linear or branched.

In the compound represented by Formula (C1), when $Y^5$ is an oxygen atom, the number of carbon atoms of the alkyl group represented by $R^{30}$ is preferably in a range of 1 to 20, from the viewpoint of advancing the modification reaction more rapidly. Further, the number of carbon atoms of the alkyl group represented by $R^{30}$ is more preferably in a range of 1 to 3, and still more preferably 1.

In the compound represented by Formula (C1), when $Y^5$ is a direct bond or sulfur atom, the number of carbon atoms of the alkyl group represented by $R^{30}$ is preferably in a range of 5 to 20, more preferably in a range of 8 to 20.

In the compound represented by Formula (C1), $Y^5$ is preferably an oxygen atom, from the viewpoint of advancing the modification reaction more rapidly.

In the compound represented by Formula ($C_2$), the number of carbon atoms of the alkyl group represented by each of independent $R^{30}$ and $R^{32}$ is preferably in a range of 1 to 20, from the viewpoint of advancing the modification reaction more rapidly. Further, the number of carbon atoms of the alkyl group represented by each of independent $R^{30}$ and $R^{32}$ is more preferably in a range of 1 to 3, and still more preferably 1.

In both the compound represented by Formula (C1) and the compound represented by Formula (C2), the number of carbon atoms of the alkyl group represented by $R^{31}$ is preferably in a range of 1 to 5, more preferably in a range of 1 to 2, and still more preferably 1.

Specific examples of the alkyl group represented by $R^{30}$, $R^{31}$, and $R^{32}$ are the same as those provided as exemplary examples of the alkyl group represented by each of independent $R^6$ to $R^9$.

The number of carbon atoms of the cycloalkyl group represented by $R^{30}$, $R^{31}$, or $R^{32}$ is preferably in a range of 3 to 20, and more preferably in a range of 3 to 11. The number of carbon atoms include the number of carbon atoms in a substituent.

In a case where the hydrogen atoms in the cycloalkyl group represented by $R^{30}$, $R^{31}$, and $R^{32}$ are each independently substituted by an alkyl group, the number of carbon atoms of the cycloalkyl group is 4 or greater. The alkyl group that may substitute the hydrogen atoms of the cycloalkyl group has 1 to 27 carbon atoms.

Specific examples of the cycloalkyl group represented by $R^{30}$, $R^{31}$, and $R^{32}$ are the same as those provided as exemplary examples of the cycloalkyl group represented by each of independent $R^6$ to $R^9$.

The unsaturated hydrocarbon group represented by $R^{30}$, $R^{31}$, or $R^{32}$ may be linear, branched or cyclic.

The number of carbon atoms in the unsaturated hydrocarbon group represented by $R^{30}$, $R^{31}$, or $R^{32}$ is preferably in a range of 5 to 20, and more preferably in a range of 8 to 20.

The unsaturated hydrocarbon group represented by $R^{30}$, $R^{31}$, or $R^{32}$ is preferably an alkenyl group, and more preferably an alkenyl group having 8 to 20 carbon atoms.

As the alkenyl group represented by $R^{30}$, $R^{31}$, or $R^{32}$, a group in which any one single bond (C—C) between carbon atoms is substituted with a double bond (C═C) in the linear or branched alkyl group represented by $R^6$ to $R^9$ is an exemplary example. In the alkenyl group, the position of the double bond is not limited.

Preferred examples of such an alkenyl group include an ethenyl group, a propenyl group, a 3-butenyl group, a 2-butenyl group, a 2-pentenyl group, a 2-hexenyl group, a 2-nonenyl group, a 2-dodecenyl group, and a 9-octadecenyl group.

Each of $R^{30}$ and $R^{32}$ is preferably an alkyl group or an unsaturated hydrocarbon group, and more preferably an alkyl group.

$R^{31}$ is preferably a hydrogen atom, an alkyl group, or an unsaturated hydrocarbon group, and more preferably an alkyl group.

When the alkyl group, cycloalkyl group and unsaturated hydrocarbon group represented by $R^{31}$ have carbon atoms in a number described above, the compound represented by Formula (C-1) and the compound represented by Formula (C-2) are easily hydrolyzed to form a modified product. Therefore, the modified product of the compound represented by Formula (C1) and the modified product of the compound represented by Formula (C2) easily covers the surface of the perovskite compound (1). As a result, it is considered that the perovskite compound (1) is less likely deteriorate and the composition with high durability can be obtained.

Specific examples of the compound represented by the Formula (C1) include tetraethoxysilane, tetramethoxysilane, tetrabutoxysilane, tetrapropoxysilane, tetraisopropoxysilane, 3-aminopropyltriethoxysilane, 3-aminopropyltrimethoxysilane, trimethoxyphenylsilane, ethoxytriethylsilane, methoxytrimethylsilane, methoxydimethyl (phenyl) silane, pentafluorophenylethoxydimethylsilane, trimethylethoxysilane, 3-chloropropyldimethoxymethylsilane, (3-chloropropyl) diethoxy (methyl) silane, (chloromethyl) dimethoxy (methyl) silane, (chloromethyl) diethoxy (methyl) silane, diethoxydimethylsilane, dimethoxydimethylsilane, dimethoxydiphenylsilane, dimethoxymethylphenylsilane, diethoxydiphenylsilane, dimethoxymethylvinylsilane, diethoxy (methyl) phenylsilane, dimethoxy (methyl) (3,3,3-trifluoropropyl) silane, allyltriethoxysilane, allyltrimethoxysilane, (3-bromopropyl) trimethoxysilane, cyclohexyltrimethoxysilane, (chloromethyl) triethoxysilane, (chloromethyl) trimethoxysilane, dodecyltriethoxysilane, dodecyltrimethoxysilane, triethoxyethylsilane, decyltrimethoxysilane, ethyltrimethoxysilane, hexyltriethoxysilane, hexyltrimethoxysilane, hexadecyltrimethoxysilane, trimethoxy (methyl) silane, triethoxymethylsilane, trimethoxy (1H, 1H, 2H, 2H-heptadecafluorodecyl) silane, triethoxy-1H, 1H, 2H, 2H-tridecafluoro-n-octylsilane, trimethoxy (1H, 1H, 2H, 2H-nonafluorohexyl) silane, trimethoxy (3,3,3-trifluoropropyl) silane, 1H, 1H, 2H, 2H-perfluorooctyltriethoxysilane.

Among them, trimethoxyphenylsilane, methoxydimethyl (phenyl) silane, dimethoxydiphenylsilane, dimethoxymethylphenylsilane, cyclohexyltrimethoxysilane, dodecyltriethoxysilane, dodecyltrimethoxysilane, decyltrimethoxysilane, hexyltriethoxysilane, hexyltrimethoxysilane, hexadecyltrimethoxysilane, trimethoxy (1H, 1H, 2H, 2H-heptadecafluorodecyl) silane, triethoxy-1H, 1H, 2H, 2H-tridecafluoro-n-octylsilane, trimethoxy (1H, 1H, 2H, 2H-nonafluorohexyl) silane, trimethoxy (3,3,3-trifluoropropyl) silane, tetraethoxysilane, tetramethoxysilane, tetrabutoxysilane, tetraisopropoxysilane are preferable, tetraethoxysilane, tetramethoxysilane, tetrabutoxysilane, and tetraisopropoxysilane are more preferable, and tetramethoxysilane is the most preferable.

Further, the compound represented by Formula (C1) may be dodecyltrimethoxysilane or trimethoxyphenylsilane.

(3. Compound Represented by Formula (A5-51) and Compound Represented by Formula (A5-52))

In the present embodiment, the compound represented by the following Formula (A5-51) or the compound represented by the following Formula (A5-52) may be used.

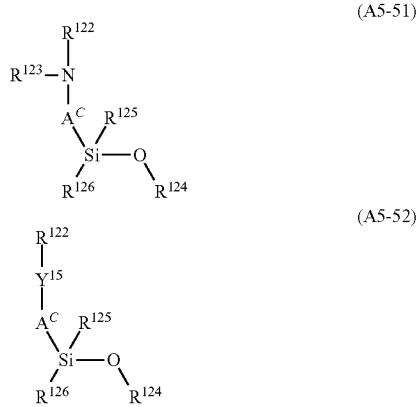

In Formula (A5-51) and Formula (A5-52), $A^C$ is a divalent hydrocarbon group and $Y^{15}$ is an oxygen atom or a sulfur atom.

In Formula (A5-51) and Formula (A5-52), $R^{122}$ and $R^{123}$ each independently represent a hydrogen atom, an alkyl group, or a cycloalkyl group.

In Formula (A5-51) and Formula (A5-52), $R^{124}$ represents an alkyl group or a cycloalkyl group.

In Formula (A5-51) and Formula (A5-52), $R^{125}$ and $R^{126}$ each independently represent a hydrogen atom, an alkyl group, an alkoxy group, or a cycloalkyl group.

When $R^{122}$ to $R^{126}$ is an alkyl group, the alkyl group may be either linear or branched. The number of carbon atoms in the alkyl group is typically in a range of 1 to 20, preferably in a range of 5 to 20, and more preferably in a range of 8 to 20.

When $R^{122}$ to $R^{126}$ is a cycloalkyl group, the cycloalkyl group may contain an alkyl group as a substituent. The number of carbon atoms in the cycloalkyl group is typically in a range of 3 to 30, preferably in a range of 3 to 20, and more preferably in a range of 3 to 11. The number of carbon atoms include the number of carbon atoms in a substituent.

Hydrogen atoms included in the alkyl group and the cycloalkyl group as $R^{122}$ to $R^{126}$ are each independently substituted by or not substituted by a halogen atom or an amino group.

Examples of the halogen atom which may substitute the hydrogen atoms included in the alkyl group and the cycloalkyl group represented by $R^{122}$ to $R^{126}$ include a fluorine atom, a chlorine atom, a bromine atom and an iodine atom, among which a fluorine atom is preferable due to its high chemical stability.

Specific examples of the alkyl group as $R^{122}$ to $R^{126}$ are the same as those provided as exemplary examples of the alkyl group represented by each of independent $R^6$ to $R^9$.

Specific examples of the cycloalkyl group as $R^{122}$ to $R^{126}$ are the same as those provided as exemplary examples of the cycloalkyl group represented by each of independent $R^6$ to $R^9$.

Examples of the alkoxy group as $R^{125}$ to $R^{126}$ include a monovalent group in which the linear or branched alkyl group exemplified as $R^6$ to $R^9$ is bonded to an oxygen atom.

When $R^{125}$ to $R^{126}$ are alkoxy groups, examples thereof include a methoxy group, an ethoxy group, and a butoxy group, and a methoxy group is preferable.

The divalent hydrocarbon group represented by $A^C$ may be a group obtained by removing two hydrogen atoms from a hydrocarbon compound, and the hydrocarbon compound may be an aliphatic hydrocarbon, an aromatic hydrocarbon or a saturated aliphatic hydrocarbon. When $A^C$ is an alkylene group, the alkylene group may be either linear or branched. The number of carbon atoms in the alkylene group is typically in a range of 1 to 100, preferably in a range of 1 to 20, and more preferably in a range of 1 to 5.

Preferable examples of the compound represented by Formula (A5-51) include trimethoxy [3-(methylamino)propyl] silane, 3-aminopropyltriethoxysilane, 3-aminopropyldimethoxymethylsilane, 3-aminopropyldiethoxymethylsilane, and 3-aminopropyltrimethoxysilane.

As the compound represented by Formula (A5-51), a preferable example is a compound represented by Formula (A5-51), in which $R^{122}$ and $R^{123}$ are hydrogen atoms, $R^{124}$ is an alkyl group, and $R^{125}$ and $R^{126}$ are alkoxy groups. For example, 3-aminopropyltriethoxysilane and 3-aminopropyltrimethoxysilane are more preferable.

As the compound represented by Formula (A5-51), 3-aminopropyltrimethoxysilane is more preferable.

As the compound represented by Formula (A5-52), 3-mercaptopropyltrimethoxysilane and 3-mercaptopropyltriethoxysilane are more preferable.

(Modified Product of Sodium Silicate)

The inorganic silicon compound having a siloxane bond may be a modified product of sodium silicate ($Na_2SiO_3$). Sodium silicate is hydrolyzed and modified by treatment with an acid.

<<Surface Modifier (5)>>

The composition according to the present embodiment preferably contains a surface modifier (5) as an optional component.

The surface modifier (5) contains at least one compound or ion selected from the group consisting of an ammonium ion, an amine, primary to quaternary ammonium cations, an ammonium salt, a carboxylic acid, a carboxylate ion, a carboxylate salt, compounds respectively represented by Formulae (X1) to (X6), and salts of the compounds respectively represented by Formulae (X2) to (X4).

Among them, surface modifier preferably contains at least one compound or ion selected from the group consisting of an ammonium ion, an amine, primary to quaternary ammonium cations, an ammonium salt, a carboxylic acid, a carboxylate ion, and a carboxylate salt, and more preferably contains at least one compound selected from the group consisting of an amine and a carboxylic acid.

In the present embodiment, one type of the compound selected from the surface modifier (5) may be used alone, or two or more types of the compounds selected from the surface modifier (5) may be used in combination.

The surface modifier is a compound that adsorbs on the surface of the perovskite compound (1) and acts to stably disperse the perovskite compound (1) in the composition during the production of the perovskite compound (1) in the production method described below.

<Ammonium Ion, Primary to Quaternary Ammonium Cations, and Ammonium Salt>

Ammonium ion and primary to quaternary ammonium cations, which are surface modifiers, are represented by following Formula (A1). The ammonium salt, which is a surface modifier, is a salt containing an ion represented by following Formula (A1).

(A1)

In ion represented by Formula (A1), each of $R^1$ to $R^4$ represents a hydrogen atom or a monovalent hydrocarbon group.

The hydrocarbon group represented by each of $R^1$ to $R^4$ may be a saturated hydrocarbon group or an unsaturated hydrocarbon group. Examples of the saturated hydrocarbon group include an alkyl group and cycloalkyl group.

The alkyl group represented by each of $R^1$ to $R^4$ may be either linear or branched. The number of carbon atoms in the alkyl group represented by each of $R^1$ to $R^4$ is typically in a range of 1 to 20, preferably in a range of 5 to 20, and still more preferably in a range of 8 to 20.

The number of carbon atoms in the cycloalkyl group is typically in a range of 3 to 30, preferably in a range of 3 to 20, and more preferably in a range of 3 to 11. The number of carbon atoms include the number of carbon atoms in a substituent.

The unsaturated hydrocarbon group represented by each of $R^1$ to $R^4$ may be either linear or branched.

The number of carbon atoms in the unsaturated hydrocarbon group represented by each of $R^1$ to $R^4$ is typically in a range of 2 to 20, preferably in a range of 5 to 20, and more preferably in a range of 8 to 20.

It is preferable that each of $R^1$ to $R^4$ represents a hydrogen atom, an alkyl group or an unsaturated hydrocarbon group.

As the unsaturated hydrocarbon group, an alkenyl group is preferable. Each of $R^1$ to $R^4$ is preferably an alkenyl group having 8 to 20 carbon atoms.

Specific examples of the alkyl group as $R^1$ to $R^4$ are the same as those provided as exemplary examples of the alkyl group represented by each of independent $R^6$ to $R^9$.

Specific examples of the cycloalkyl group as $R^1$ to $R^4$ are the same as those provided as exemplary examples of the cycloalkyl group represented by each of independent $R^6$ to $R^9$.

As the alkenyl group represented by each of $R^1$ to $R^4$, a group in which any one single bond (C—C) between carbon atoms is substituted with a double bond (C=C) in the linear or branched alkyl group as $R^6$ to $R^9$ is an exemplary example, and the position of the double bond is not limited.

Preferred examples of the alkenyl group represented by each of $R^1$ to $R^4$ include an ethenyl group, a propenyl group, a 3-butenyl group, a 2-butenyl group, a 2-pentenyl group, a 2-hexenyl group, a 2-nonenyl group, a 2-dodecenyl group, and a 9-octadecenyl group.

In a case where the ammonium cation represented by Formula (A1) forms a salt, the counter anion is not particularly limited. As the counter anion, halide ion and carboxylate ion are preferable. Examples of the halide ion include bromide ion, chloride ion, iodide ion, and fluoride ion.

Preferred examples of the ammonium salt containing the ammonium cation represented by Formula (A1) and a counter anion include an n-octylammonium salt and an oleyl ammonium salt.

<Amine>

The amine as the surface modifier can be represented by following Formula (A11).

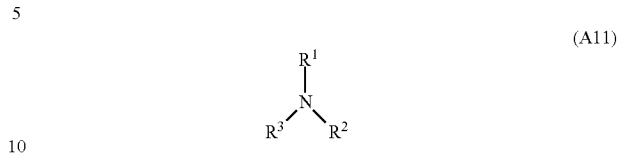
(A11)

In Formula (A11), $R^1$ to $R^3$ represent the same groups as $R^1$ to $R^3$ included in Formula (A1). However, at least one of $R^1$ to $R^3$ is a monovalent hydrocarbon group.

The amine as the surface modifier may be any of primary to tertiary amines, but primary amine and secondary amine are preferable, and primary amine is more preferable.

As the amine which is a surface modifier, oleylamine is preferable.

<Carboxylic Acid, Carboxylate Ion, and Carboxylate Salt>

The carboxylate ion, which is a surface modifier, is represented by following Formula (A2). The carboxylate salt, which is a surface modifier, is a salt containing an ion represented by following Formula (A2).

$R^5$—$CO_2^-$ (A2)

Examples of the carboxylic acid as a surface modifier include a carboxylic acid in which a proton ($H^+$) is bonded to the carboxylate anion represented by Formula (A2).

In the ion represented by Formula (A2), $R^5$ represents a monovalent hydrocarbon group. The hydrocarbon group represented by $R^5$ may be a saturated hydrocarbon group or an unsaturated hydrocarbon group.

Examples of the saturated hydrocarbon group include an alkyl group and a cycloalkyl group.

The alkyl group represented by $R^5$ may be either linear or branched.

The number of carbon atoms in the alkyl group represented by $R^5$ is typically in a range of 1 to 20, preferably in a range of 5 to 20, and still more preferably in a range of 8 to 20.

The number of carbon atoms in the cycloalkyl group is typically in a range of 3 to 30, preferably in a range of 3 to 20, and more preferably in a range of 3 to 11. The number of carbon atoms include the number of carbon atoms in a substituent.

The unsaturated hydrocarbon group as $R^5$ may be linear or branched.

The number of carbon atoms in the unsaturated hydrocarbon group as $R^5$ is typically in a range of 2 to 20, preferably in a range of 5 to 20, and more preferably in a range of 8 to 20.

It is preferable that $R^5$ represents an alkyl group or an unsaturated hydrocarbon group. As the unsaturated hydrocarbon group, an alkenyl group is preferable.

Specific examples of the alkyl group as $R^5$ include those provided as exemplary examples of the alkyl group represented by $R^6$ to $R^9$.

Specific examples of the cycloalkyl group as $R^5$ include those provided as exemplary examples of the cycloalkyl group represented by $R^6$ to $R^9$.

Specific examples of the alkenyl group as $R^5$ include those provided as exemplary examples of the alkenyl group represented by $R^1$ to $R^4$.

As the carboxylate anion represented by Formula (A2), an oleate anion is preferable.

When the carboxylate anion forms a salt, the counter cation of the carboxylate anion is not particularly limited, and preferred examples thereof include an alkali metal cation, an alkaline earth metal cation, and an ammonium cation.

As the carboxylic acid which is a surface modifier, oleic acid is preferable.

<Compound Represented by Formula (X1)>

(X1)

In the compound (salt) represented by Formula (X1), each of $R^{18}$ to $R^{21}$ is independently an alkyl group having 1 to 20 carbon atoms which may have a substituent, a cycloalkyl group having 3 to 30 carbon atoms which may have a substituent, or an aryl group having 6 to 30 carbon atoms which may have a substituent.

The alkyl group represented by each of $R^{18}$ to $R^{21}$ may be either linear or branched.

The alkyl group represented by each of $R^{18}$ to $R^{21}$ preferably has an aryl group as a substituent. The number of carbon atoms in the alkyl group represented by each of $R^{18}$ to $R^{21}$ is typically in a range of 1 to 20, preferably in a range of 5 to 20, and still more preferably in a range of 8 to 20. The number of carbon atoms include the number of carbon atoms in a substituent.

The cycloalkyl group represented by each of $R^{18}$ to $R^{21}$ preferably has an aryl group as a substituent. The number of carbon atoms in the cycloalkyl group represented by each of $R^{18}$ to $R^{21}$ is typically in a range of 3 to 30, preferably in a range of 3 to 20, and still more preferably in a range of 3 to 11. The number of carbon atoms include the number of carbon atoms in a substituent.

The aryl group represented by each of $R^{18}$ to $R^{21}$ preferably has an alkyl group as a substituent. The number of carbon atoms in the aryl group represented by each of $R^{18}$ to $R^{21}$ is typically in a range of 6 to 30, preferably in a range of 6 to 20, and still more preferably in a range of 6 to 10. The number of carbon atoms include the number of carbon atoms in a substituent.

As the group represented by each of $R^{18}$ to $R^{21}$, an alkyl group is preferable.

Specific examples of the alkyl group as $R^{18}$ to $R^{21}$ are the same as those provided as exemplary examples of the alkyl group represented by each of independent $R^6$ to $R^9$.

Specific examples of the cycloalkyl group as $R^{18}$ to $R^{21}$ are the same as those provided as exemplary examples of the cycloalkyl group represented by each of independent $R^6$ to $R^9$.

Specific examples of the aryl group as $R^{18}$ to $R^{21}$ include a phenyl group, a benzyl group, a tolyl group, and an o-xysilyl group.

Hydrogen atoms included in the group as $R^{18}$ to $R^{21}$ are each independently substituted by or not substituted by a halogen atom. Examples of the halogen atom include a fluorine atom, a chlorine atom, a bromine atom and an iodine atom. Since the compound substituted with a halogen atom has high chemical stability, a fluorine atom is preferable as the halogen atom to be substituted.

In the compound represented by Formula (X1), M⁻ represents a counter anion. As the counter anion, a halide ion, a carboxylate ion, or the like is preferable. Examples of the halide ion include bromide ion, chloride ion, iodide ion, and fluoride ion, and bromide ion is preferable.

Specific examples of the compound represented by Formula (X1) include tetraethylphosphonium chloride, tetraethylphosphonium bromide, tetraethylphosphonium iodide; tetrabutylphosphonium chloride, tetrabutylphosphonium bromide, tetrabutylphosphonium iodide: tetraphenylphosphonium chloride, tetraphenylphosphonium bromide, tetraphenylphosphonium iodide; tetra-n-octylphosphonium chloride, tetra-n-octylphosphonium bromide, tetra-n-octylphosphonium iodide; tributyl-n-octylphosphonium bromide; tributyldodecylphosphonium bromide; tributylhexadecylphosphonium chloride, tributylhexadecylphosphonium bromide, and tributylhexadecylphosphonium iodide.

Since the thermal durability of the perovskite compound (1) can be expected to increase, as the compound represented by Formula (X1), tributylhexadecylphosphonium bromide and tributyl-n-octylphosphonium bromide are preferable, and tributyl-n-octylphosphonium bromide is more preferable.

<Compound Represented by Formula (X2) and Salt of Compound Represented by Formula (X2)>

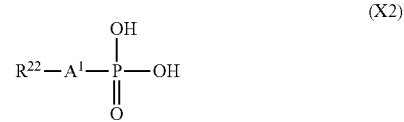
(X2)

In the compound represented by Formula (X2), $A^1$ represents a single bond or an oxygen atom.

In the compound represented by Formula (X2), $R^{22}$ represents an alkyl group having 1 to 20 carbon atoms which may have a substituent, a cycloalkyl group having 3 to 30 carbon atoms which may have a substituent, or an aryl group having 6 to 30 carbon atoms which may have a substituent.

The alkyl group represented by $R^{22}$ may be either linear or branched.

As the alkyl group represented by $R^{22}$, the same group as the alkyl group represented by $R^{18}$ to $R^{21}$ can be employed.

As the cycloalkyl group represented by $R^{22}$, the same group as the cycloalkyl group represented by $R^{18}$ to $R^{21}$ can be employed.

As the aryl group represented by $R^{22}$, the same group as the aryl group represented by $R^{18}$ to $R^{21}$ can be employed.

The group represented by $R^{22}$ is preferably an alkyl group.

Hydrogen atoms included in the group as $R^{22}$ are each independently substituted by or not substituted by a halogen atom. Examples of the halogen atom include a fluorine atom, a chlorine atom, a bromine atom and an iodine atom, among which a fluorine atom is preferable due to its high chemical stability.

In the salt of the compound represented by Formula (X2), the anionic group is represented by following Formula (X2-1).

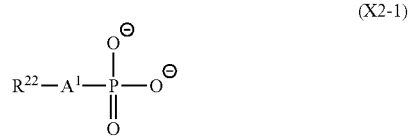
(X2-1)

In the salt of the compound represented by Formula (X2), examples of the counter cation paired with Formula (X2-1) include ammonium ion.

In the salt of the compound represented by Formula (X2), the counter cation paired with the formula (X2-1) is not particularly limited, and examples thereof include monovalent ions such as $Na^+$, $K^+$, and $Cs^+$.

Examples of the compound represented by Formula (X2) and the salt of the compound represented by Formula (X2) include phenyl phosphate, phenyl disodium phosphate hydrate, 1-naphthyl disodium phosphate hydrate, 1-monosodium naphthyl phosphate monohydrate, lauryl phosphate, sodium lauryl phosphate, oleyl phosphate, benzhydrylphosphonic acid, decylphosphonic acid, dodecylphosphonic acid, ethylphosphonic acid, hexadecylphosphonic acid, heptylphosphonic acid, hexylphosphonic acid, methylphosphonic acid, nonylphosphonic acid, octadecylphosphonic acid, n-octylphosphonic acid, benzenephosphonic acid, disodium phenylphosphonate hydrate, phenethylphosphonic acid, propylphosphonic acid, undecylphosphonic acid, tetradecylphosphonic acid, and cinnamylphosphonic acid.

Since the thermal durability of the perovskite compound (1) can be expected to increase, as the compound represented by Formula (X2), oleylphosphoric acid, dodecylphosphonic acid, ethylphosphonic acid, hexadecylphosphonic acid, heptylphosphonic acid, and hexylphosphonic acid, methylphosphonic acid, nonylphosphonic acid, octadecylphosphonic acid, n-octylphosphonic acid are more preferable, and octadecylphosphonic acid is still more preferable.

<Compound Represented by Formula (X3) and Salt of Compound Represented by Formula (X3)>

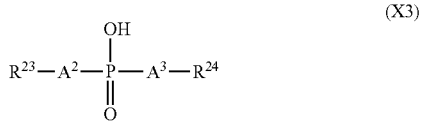

(X3)

In the compound represented by Formula (X3), each of $A^2$ and $A^3$ independently represents a single bond or an oxygen atom.

In the compound represented by Formula (X3), each of $R^{23}$ and $R^{24}$ independently represents an alkyl group having 1 to 20 carbon atoms which may have a substituent, a cycloalkyl group having 3 to 30 carbon atoms which may have a substituent, or an aryl group having 6 to 30 carbon atoms which may have a substituent.

The alkyl group represented by each of $R^{23}$ and $R^{24}$ may be independently either linear or branched.

As the alkyl group represented by each of $R^{23}$ and $R^{24}$, the same group as the alkyl group represented by $R^{18}$ to $R^{21}$ can be employed.

As the cycloalkyl group represented by each of $R^{23}$ and $R^{24}$, the same group as the cycloalkyl group represented by $R^{18}$ to $R^{21}$ can be employed.

As the aryl group represented by each of $R^{23}$ and $R^{24}$, the same group as the aryl group represented by $R^{18}$ to $R^{21}$ can be employed.

It is preferable that each of $R^{23}$ and $R^{24}$ is independently an alkyl group.

Hydrogen atoms included in the group as $R^{23}$ to $R^{24}$ are each independently substituted by or not substituted by a halogen atom. Examples of the halogen atom include a fluorine atom, a chlorine atom, a bromine atom and an iodine atom, among which a fluorine atom is preferable due to its high chemical stability.

In the salt of the compound represented by Formula (X3), the anionic group is represented by following Formula (X3-1).

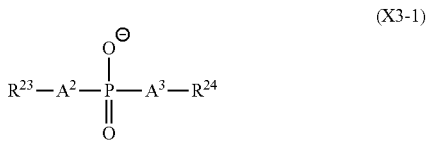

(X3-1)

In the salt of the compound represented by Formula (X3), examples of the counter cation paired with Formula (X3-1) include ammonium ion.

In the salt of the compound represented by Formula (X3), the counter cation paired with the formula (X3-1) is not particularly limited, and examples thereof include monovalent ions such as $Na^+$, $K^+$, and $Cs^+$.

Examples of the compound represented by Formula (X3) include diphenylphosphinic acid, dibutyl phosphate, didecyl phosphate, and diphenyl phosphate. Examples of the salt of the compound represented by Formula (X3) include the salt of the above compound.

Since the thermal durability of the perovskite compound (1) can be expected to increase, diphenylphosphinic acid, dibutyl phosphate, and didecyl phosphate are preferable, and diphenylphosphinic acid and salts thereof are more preferable.

<Compound Represented by Formula (X4) and Salt of Compound Represented by Formula (X4)>

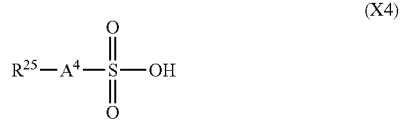

(X4)

In the compound represented by Formula (X4), $A^4$ represents a single bond or an oxygen atom.

In the compound represented by Formula (X4), $R^{25}$ represents an alkyl group having 1 to 20 carbon atoms which may have a substituent, a cycloalkyl group having 3 to 30 carbon atoms which may have a substituent, or an aryl group having 6 to 30 carbon atoms which may have a substituent.

As the alkyl group represented by $R^{25}$, the same group as the alkyl group represented by $R^{18}$ to $R^{21}$ can be employed.

As the cycloalkyl group represented by $R^{25}$, the same group as the cycloalkyl group represented by $R^{18}$ to $R^{21}$ can be employed.

As the aryl group represented by $R^{25}$, the same group as the aryl group represented by $R^{18}$ to $R^{21}$ can be employed.

It is preferable that $R^{25}$ is an alkyl group.

Hydrogen atoms included in the group as $R^{25}$ are each independently substituted by or not substituted by a halogen atom. Examples of the halogen atom include a fluorine atom, a chlorine atom, a bromine atom and an iodine atom, among which a fluorine atom is preferable due to its high chemical stability.

Examples of the compound represented by Formula (X4) include 1-octane sulfonic acid, 1-decane sulfonic acid, 1-dodecane sulfonic acid, hexadecyl sulfate, lauryl sulfate, myristyl sulfate, laureth sulfate, and dodecyl sulfate.

In the salt of the compound represented by Formula (X4), the anionic group is represented by following Formula (X4-1).

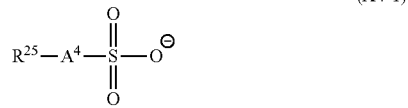

In the salt of the compound represented by Formula (X4), examples of the counter cation paired with Formula (X4-1) include ammonium ion.

In the salt of the compound represented by Formula (X4), the counter cation paired with the formula (X4-1) is not particularly limited, and examples thereof include monovalent ions such as $Na^+$, $K^+$, and $Cs^+$.

Examples of the salt of the compound represented by Formula (X4) include sodium 1-octane sulfonate, sodium 1-decane sulfonate, sodium 1-dodecane sulfonate, sodium hexadecyl sulfate, sodium lauryl sulfate, sodium myristyl sulfate, sodium laureth sulfate, and sodium dodecyl sulfate.

Since the thermal durability of the perovskite compound (1) can be expected to increase, sodium hexadecyl sulfate and sodium dodecyl sulfate are preferable, and sodium dodecyl sulfate is more preferable.

<Compound Represented by Formula (X5)>

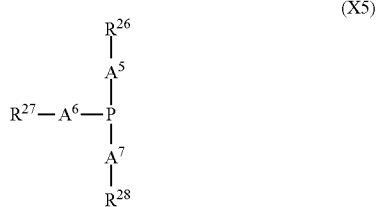

In the compound represented by Formula (X5), each of $A^5$ to $A^7$ independently represents a single bond or an oxygen atom.

In the compound represented by Formula (X5), each of $R^{26}$ to $R^{28}$ independently represents an alkyl group having 1 to 20 carbon atoms which may have a substituent, a cycloalkyl group having 3 to 30 carbon atoms which may have a substituent, an aryl group having 6 to 30 carbon atoms which may have a substituent, an alkenyl group having 2 to 20 carbon atoms which may have a substituent, or an alkynyl group having 2 to 20 carbon atoms which may have a substituent.

The alkyl group represented by each of $R^{26}$ to $R^{28}$ may be independently either linear or branched.

As the alkyl group represented by each of $R^{26}$ to $R^{28}$, the same group as the alkyl group represented by $R^{18}$ to $R^{21}$ can be employed.

As the cycloalkyl group represented by each of $R^{26}$ to $R^{28}$, the same group as the cycloalkyl group represented by $R^{18}$ to $R^{21}$ can be employed.

As the aryl group represented by each of $R^{26}$ to $R^{28}$, the same group as the aryl group represented by $R^{18}$ to $R^{21}$ can be employed.

It is preferable that the alkenyl group represented by each of $R^{26}$ to $R^{28}$ independently has an alkyl group or an aryl group as a substituent. The number of carbon atoms in the alkenyl group represented by each of $R^{26}$ to $R^{28}$ is typically in a range of 2 to 20, preferably in a range of 6 to 20, and still more preferably in a range of 12 to 18. The number of carbon atoms include the number of carbon atoms in a substituent.

It is preferable that the alkynyl group represented by each of $R^{26}$ to $R^{28}$ independently has an alkyl group or an aryl group as a substituent. The number of carbon atoms in the alkynyl group represented by each of $R^{26}$ to $R^{28}$ is typically in a range of 2 to 20, preferably in a range of 6 to 20, and still more preferably in a range of 12 to 18. The number of carbon atoms include the number of carbon atoms in a substituent.

It is preferable that each of $R^{26}$ to $R^{28}$ is independently an alkyl group.

Specific examples of the alkenyl group represented by each of $R^{26}$ to $R^{28}$ include a hexenyl group, an octenyl group, a decenyl group, a dodecenyl group, a tetradecenyl group, a hexadecenyl group, an octadecenyl group, and an icosenyl group.

Specific examples of the alkynyl group represented by each of $R^{26}$ to $R^{28}$ include a hexynyl group, an octynyl group, a decynyl group, a dodecinyl group, a tetradecynyl group, a hexadecynyl group, an octadecynyl group, and an icocinyl group.

Hydrogen atoms included in the group as $R^{26}$ to $R^{28}$ are each independently substituted by or not substituted by a halogen atom. Examples of the halogen atom include a fluorine atom, a chlorine atom, a bromine atom and an iodine atom, among which a fluorine atom is preferable due to its high chemical stability.

Examples of the compound represented by Formula (X5) include trioleyl phosphine, tributyl phosphine, triethyl phosphine, trihexyl phosphite, triisodecyl phosphine, trimethyl phosphine, cyclohexyldiphenyl phosphine, and di-tert-butylphenyl phosphine, dicyclohexylphenyl phosphine, diethylphenyl phosphine, tributyl phosphine, tri-tert-butyl phosphine, trihexyl phosphine, trimethyl phosphine, tri-n-octyl phosphine, and triphenyl phosphine.

Since the thermal durability of the perovskite compound (1) can be expected to increase, trioleyl phosphite, tributyl phosphine, trihexyl phosphine, trihexyl phosphite are preferable, and trioleyl phosphite is more preferable.

<Compound Represented by Formula (X6)>

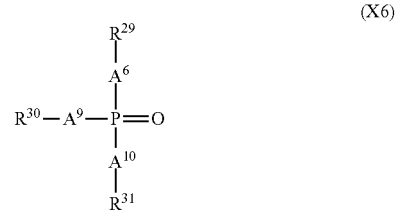

In the compound represented by Formula (X6), each of $A^8$ to $A^{10}$ independently represents a single bond or an oxygen atom.

In the compound represented by Formula (X6), each of $R^{29}$ to independently represents an alkyl group having 1 to 20 carbon atoms which may have a substituent, a cycloalkyl group having 3 to 30 carbon atoms which may have a substituent, an aryl group having 6 to 30 carbon atoms which may have a substituent, an alkenyl group having 2 to 20 carbon atoms which may have a substituent, or an alkynyl group having 2 to 20 carbon atoms which may have a substituent.

The alkyl group represented by each of $R^{29}$ to $R^{31}$ may be independently either linear or branched.

As the alkyl group represented by each of $R^{29}$ to $R^{31}$, the same group as the alkyl group represented by $R^{18}$ to $R^{21}$ can be employed.

As the cycloalkyl group represented by each of $R^{29}$ to $R^{31}$, the same group as the cycloalkyl group represented by $R^{18}$ to $R^{21}$ can be employed.

As the aryl group represented by each of $R^{29}$ to $R^{31}$, the same group as the aryl group represented by $R^{18}$ to $R^{21}$ can be employed.

As the alkenyl group represented by each of $R^{29}$ to $R^{31}$, the same group as the alkenyl group represented by $R^{26}$ to $R^{28}$ can be employed.

As the alkynyl group represented by each of $R^{29}$ to $R^{31}$, the same group as the alkynyl group represented by $R^{26}$ to $R^{28}$ can be employed.

It is preferable that each of $R^{29}$ to $R^{31}$ is independently an alkyl group.

Hydrogen atoms included in the group as $R^{29}$ to $R^{31}$ are each independently substituted by or not substituted by a halogen atom. Examples of the halogen atom include a fluorine atom, a chlorine atom, a bromine atom and an iodine atom, among which a fluorine atom is preferable due to its high chemical stability.

Examples of the compound represented by Formula (X6) include tri-n-octylphosphine oxide, tributylphosphine oxide, methyl (diphenyl) phosphine oxide, triphenylphosphine oxide, tri-p-tolylphosphine oxide, cyclohexyldiphenylphosphine oxide, trimethyl phosphate, tributyl phosphate, triamyl phosphate, tris(2-butoxyethyl) phosphate, triphenyl phosphate, tri-p-cresyl phosphate, tri-m-cresyl phosphate, tri-o-cresyl phosphate.

Since the thermal durability of the perovskite compound (1) can be expected to increase, tri-n-octylphosphine oxide and tributylphosphine oxide are preferable, and tri-n-octylphosphine oxide is more preferable.

Among the above-mentioned surface modifiers, ammonium salt, ammonium ion, primary to quaternary ammonium cations, carboxylate salt, and carboxylate ion are preferable.

Among the ammonium salts and ammonium ions, oleylamine salt and oleylammonium ion are more preferable.

Among the carboxylate salts and carboxylate ions, oleate and oleate cation are more preferable.

<Regarding Compounding Ratio of Each Component>

In the composition of the present embodiment, the compounding ratio of the perovskite compound (1), the halogen-containing compound (2), the dispersion medium, the semiconductor material (10), optional surface modifier (5), and optional modified product group (6) can be appropriately determined according to the type of each component and the like.

The compounding ratio of each component of the composition described below is not particularly limited as long as the amount of halogen atoms contained in the halogen-containing compound (2) is 5500 ppm by mass or less with respect to a total mass of the composition. Further, in a case where, the semiconductor material (10) is contained, the compounding ratio of each component of the composition described below is not particularly limited as long as the mass ratio of halide ions contained in the halogen-containing compound (2) to the semiconductor material (10) (mass of halide ions contained in the halogen-containing compound (2)/mass of the semiconductor material (10)) is 3.0 or less.

Composition Containing Perovskite Compound (1), Halogen-Containing Compound (2) and Dispersion Medium As an example of the compounding ratio of the composition including the perovskite compound (1), the halogen-containing compound (2), and the dispersion medium, the mass ratio of the perovskite compound (1) to dispersion medium [perovskite compound (1)/(dispersion medium)] is preferably 0.00001 to 10, more preferably 0.0001 to 2, still more preferably 0.0005 to 1, even more preferably 0.001 to 0.05, and the most preferably 0.0012 to 0.005.

In the composition according to the present embodiment, the molar ratio [Si/B] of the Si element in the modified product group (6) to the metal ion serving as the component B in the perovskite compound (1) may be in a range of 0.001 to 2000 or in a range of 0.01 to 500.

In the composition according to the present embodiment, in a case where the modified product group (6) is a silazane represented by Formula (B1) or (B2) or a modified product thereof, the molar ratio [Si/B] of Si in the modified product group (6) to the metal ion serving as the component B of the perovskite compound (1) may be in a range of 1 to 1000, in a range of 10 to 500, or in a range of 20 to 300.

In the composition according to the present embodiment, in a case where the modified product group (6) is a polysilazane having a constituent unit which is represented by Formula (B3), the molar ratio [Si/B] of the Si element in the modified product group (6) to the metal ion serving as the component B of the perovskite compound (1) may be in a range of 0.001 to 2000, in a range of 0.01 to 2000, in a range of 0.1 to 1000, in a range of 1 to 500, or in a range of 2 to 300.

From the viewpoint of satisfactorily exhibiting the excellent effect of improving durability by the modified product group (6), it is preferable that the compounding ratio between the perovskite compound (1) and the modified product group (6) is in the above-described range.

The molar ratio [Si/B] of the Si element in the modified product to the metal ion serving as the component B of the perovskite compound can be determined by the following method.

The amount of substance (B) (unit:mol) of the metal ions as the component B of the perovskite compound is determined by measuring the mass of the metal as the B component by inductively coupled plasma mass spectrometry (ICP-MS), and converting the measured value to the amount of substance.

The amount of substance (Si) of the Si element of the modified product is determined from the value obtained by converting the mass of the raw material compounds of the modified product used into the molar amount and the amount of Si (amount of substance) contained per unit mass of the raw material compounds. The unit mass of the raw material compounds is the molecular weight of the raw material compound if the raw material compound is a low molecular weight compound, and is the molecular weight of the repeating unit of the raw material compound if the raw material compound is a high molecular weight compound.

The molar ratio [Si/B] can be calculated from the amount of substance (Si) of the Si element and the amount of substance (B) of the metal ions as the B component of the perovskite compound.

From the viewpoints of making the perovskite compound (1) difficult to aggregate and exhibiting an excellent light-emitting property, it is preferable that the compounding ratio between the perovskite compound (1) and the dispersion medium is in the above-described range.

Composition Containing Perovskite Compound (1), Halogen-Containing Compound (2) and Semiconductor Compound (10)

As an example of the compounding ratio of the composition including the perovskite compound (1), the halogen-containing compound (2), and the semiconductor compound (10), the mass ratio of the perovskite compound (1) to the semiconductor compound (10) [perovskite compound (1)/semiconductor compound (10)] is preferably 0.00001 to 100, more preferably 0.0001 to 20, still more preferably 0.0005 to 10, even more preferably 0.001 to 5, and particularly preferably 0.005 to 3.

From the viewpoints of exhibiting an excellent light-emitting property, it is preferable that the compounding ratio between the perovskite compound (1) and the semiconductor compound (10) is in the above-described range.

Composition Containing Perovskite Compound (1), Halogen-Containing Compound (2), Dispersion Medium, and Modified Product Group (6)

As an example of the compounding ratio of the composition including the perovskite compound (1), the halogen-containing compound (2), the dispersion medium, and the modified product group (6), the mass ratio of the perovskite compound (1) to the total amount of the dispersion medium and the modified product group (6) [perovskite compound (1)/((dispersion medium)+modified product group (6))] is preferably 0.00001 to 10, more preferably 0.0001 to 2, still more preferably 0.0005 to 1, even more preferably 0.001 to 0.05, and the most preferably 0.0012 to 0.005.

From the viewpoints of making the perovskite compound (1) difficult to aggregate and exhibiting an excellent light-emitting property, it is preferable that the compounding ratio between the perovskite compound (1) and the total amount of the dispersion medium and the modified product group (6) is in the above-described range.

Composition Containing Perovskite Compound (1), Halogen-Containing Compound (2), Semiconductor Material (10), and Modified Product Group (6)

As an example of the compounding ratio of the composition including the perovskite compound (1), the halogen-containing compound (2), the semiconductor material (10), and the modified product group (6), the mass ratio of the perovskite compound (1) to the total amount of the semiconductor material (10) and the modified product group (6) [perovskite compound (1)/(semiconductor material (10)+modified product group (6))] is preferably 0.00001 to 100, more preferably 0.0001 to 20, still more preferably 0.0005 to 10, even more preferably 0.001 to 5, and particularly preferably 0.002 to 3.

From the viewpoints of making the perovskite compound (1) difficult to aggregate and exhibiting an excellent light-emitting property, it is preferable that the compounding ratio between the perovskite compound (1) and the total amount of the semiconductor material (10) and the modified product group (6) is in the above-described range.

Composition Containing Perovskite Compound (1), Halogen-Containing Compound (2), Dispersion Medium, and Surface Modifier (5)

As an example of the compounding ratio of the composition including the perovskite compound (1), the halogen-containing compound (2), the dispersion medium, and the surface modifier (5), the mass ratio of the perovskite compound (1) to the total amount of the dispersion medium and the surface modifier (5) [perovskite compound (1)/((dispersion medium)+surface modifier (5))] is preferably 0.00001 to 10, more preferably 0.0001 to 2, still more preferably 0.0005 to 1, even more preferably 0.001 to 0.05, and the most preferably 0.0012 to 0.005.

From the viewpoints of making the perovskite compound (1) difficult to aggregate and exhibiting an excellent light-emitting property, it is preferable that the compounding ratio between the perovskite compound (1) and the total amount of the dispersion medium and the surface modifier (5) is in the above-described range.

Composition containing perovskite compound (1), halogen-containing compound (2), dispersion medium, modified product group (6), and surface modifier (5)

As an example of the compounding ratio of the composition including the perovskite compound (1), the halogen-containing compound (2), the dispersion medium, the modified product group (6), and the surface modifier (5), the mass ratio of the perovskite compound (1) to the total amount of the despersion medium, the modified product group (6), and the surface modifier (5) [perovskite compound (1)/((dispersion medium)+modified product group (6)+surface modifier (5))] is preferably 0.00001 to 10, more preferably 0.0001 to 2, still more preferably 0.0005 to 1, even more preferably 0.001 to 0.05, and the most preferably 0.0012 to 0.005.

From the viewpoints of making the perovskite compound (1) difficult to aggregate and exhibiting an excellent light-emitting property, it is preferable that the compounding ratio between the perovskite compound (1) and the total amount of the dispersion medium, the modified product group (6), and the surface modifier (5) is in the above-described range.

Composition Containing Perovskite Compound (1), Halogen-Containing Compound (2), Semiconductor Material (10), and Surface Modifier (5)

As an example of the compounding ratio of the composition including the perovskite compound (1), the halogen-containing compound (2), the semiconductor material (10), and the surface modifier (5), the mass ratio of the perovskite compound (1) to the total amount of the semiconductor material (10) and the surface modifier (5) [perovskite compound (1)/(semiconductor material (10)+surface modifier (5))] is preferably 0.00001 to 100, more preferably 0.0001 to 20, still more preferably 0.0005 to 1, even more preferably 0.001 to 5, and particularly preferably 0.005 to 3, from the viewpoint of suppressing deterioration of semiconductor material (10).

From the viewpoints of making the perovskite compound (1) difficult to aggregate and exhibiting an excellent light-emitting property, it is preferable that the compounding ratio between the perovskite compound (1) and the total amount of the semiconductor material (10) and the surface modifier (5) is in the above-described range.

Composition Containing Perovskite Compound (1), Halogen-Containing Compound (2), Semiconductor Material (10), Modified Product Group (6), and Surface Modifier (5)

As an example of the compounding ratio of the composition including the perovskite compound (1), the halogen-containing compound (2), the semiconductor material (10), the modified product group (6), and the surface modifier (5), the mass ratio of the perovskite compound (1) to the total amount of the semiconductor material (10), the modified product group (6), and the surface modifier (5) [perovskite compound (1)/(semiconductor material (10)+modified product group (6)+surface modifier (5))] is preferably 0.00001 to 100, more preferably 0.0001 to 20, still more preferably 0.0005 to 10, even more preferably 0.001 to 5, and particularly preferably 0.005 to 3, from the viewpoint of suppressing deterioration of semiconductor material (10).

From the viewpoints of making the perovskite compound (1) difficult to aggregate and exhibiting an excellent light-emitting property, it is preferable that the compounding ratio between the perovskite compound (1) and the total amount of the semiconductor material (10), the modified product group (6), and the surface modifier (5) is in the above-described range.

In each of the above-mentioned compositions, the amount of the perovskite compound (1) with respect to the total mass of the composition is not particularly limited.

The amount of the perovskite compound (1) with respect to the total mass of the composition is typically 0.0001 to 30% by mass.

The amount of the perovskite compound (1) with respect to the total mass of the composition is preferably 0.0001 to 10% by mass, more preferably 0.0005 to 1% by mass, and still more preferably 0.001 to 0.3% by mass.

From the viewpoints of making the perovskite compound (1) difficult to aggregate and exhibiting an excellent light-emitting property, a composition in which the amount of the perovskite compound (1) with respect to the total mass of the composition is in the above-described range is preferable.

In the above composition, as the dispersion medium, the solvent (3) may be used alone, the polymerizable compound (4) may be used alone, or the polymer (4-1) may be used alone.

In a case where two or more kinds of dispersion medium are combined, a combination of the solvent (3) and the polymerizable compound (4), a combination of the solvent (3) and the polymer (4-1), or a combination of the solvent, the polymerizable compound (4), and the polymer (4-1) is preferable. The above-mentioned compounding amount of the solvent means the total amount of the solvent (3) when two or more kinds of solvent (3) are mixed and used.

<Production Method for Composition>

Hereinbelow, explanations are made with respect to the production method for the composition of the present invention referring to the embodiments thereof. According to the production method, the composition of the embodiment according to the present invention can be produced. Further, the composition of the present invention is not limited to a composition produced by a method for producing a composition according to the embodiment described below.

<Production Method for Perovskite Compound (1)>

(First Production Method)

Examples of the method for producing the perovskite compound (1) include a production method including a step of dissolving a compound containing the component A, a compound containing the component B, and a compound containing the component X constituting the perovskite compound in a first solvent to obtain a solution, and a step of mixing the obtained solution and a second solvent.

The second solvent is a solvent having a lower solubility in the perovskite compound than the first solvent.

The solubility indicates the solubility at the temperature at which the step of mixing the obtained solution and the second solvent is carried out.

Examples of the first solvent and the second solvent include at least two types selected from the group consisting of organic solvents listed as (a) to (k) above.

For example, in a case where the step of mixing the solution and the second solvent is carried out at room temperature (10° C. to 30° C.), examples of the first solvent include the above described alcohol (d), glycol ether (e), organic solvent (0 containing an amide group, and dimethyl sulfoxide (k).

Further, in a case where the step of mixing the solution and the second solvent is carried out at room temperature (10° C. to 30° C.), examples of the second solvent include the above described ester (a), ketone (b), ether (c), organic solvent (g) having a nitrile group, organic solvent (h) having a carbonate group, halogenated hydrocarbon (i), and hydrocarbon (j).

Hereinbelow, specific explanations are made on the first production method.

First, a compound containing the component A, a compound containing the component B, and a compound containing the component X are dissolved in a first solvent to obtain a solution. The "compound containing the component A" may contain the component X. The "compound containing the component B" may contain the component X.

Then, the obtained solution and the second solvent are mixed. In the step of mixing the solution and the second solvent, (I) the solution may be added to the second solvent, or (II) the second solvent may be added to the solution. Since the perovskite compound produced by the first production method is easily dispersed in the solution, it is preferable that (I) the solution is added to the second solvent.

When mixing the solution and the second solvent, one may be added dropwise to the other. Further, it is preferable to mix the solution and the second solvent with stirring.

In the step of mixing the solution and the second solvent, the temperature of the solution and the second solvent is not particularly limited. The temperature is preferably in a range of −20° C. to 40° C. and more preferably in a range of −5° C. to 30° C. from the viewpoint of ensuring easy precipitation of the perovskite compound. The temperature of the solution and the temperature of the second solvent may be the same or different.

A difference in solubility of perovskite compound between the first solvent and the second solvent is preferably in a range of (100 μg/100 g of solvent) to (90 g/100 g of solvent) and more preferably in a range of (1 mg/100 g of solvent) to (90 g/100 g of solvent).

As a combination of the first solvent and the second solvent, it is preferable that the first solvent is an organic solvent having an amide group such as N, N-dimethylacetamide or dimethyl sulfoxide, and the second solvent is a halogenated hydrocarbon or hydrocarbon. When the first solvent and the second solvent are preferably a combination of these solvents, for example, in a case where the step of mixing at room temperature (10° C. to 30° C.) is carried out, a difference in solubility of perovskite compound between the first solvent and the second solvent is easily controlled within the range of (100 μg/100 g of solvent) to (90 g/100 g of solvent).

By mixing the solution and the second solvent, the solubility of the perovskite compound is lowered in the obtained mixed solution, and the perovskite compound is precipitated. As a result, a dispersion containing the perovskite compound is obtained.

The perovskite compound can be recovered by performing solid-liquid separation on the obtained dispersion containing the perovskite compound. Examples of the solid-liquid separation method include filtration and concentration by evaporation of a solvent. It is possible to recover only the perovskite compound by performing solid-liquid separation.

From the viewpoint of stably dispersing the obtained perovskite compound in the dispersion, it is preferable that the above described production method includes a step of adding a surface modifier.

The step of adding the surface modifier is preferably performed before the step of mixing the solution and the second solvent. Specifically, the surface modifier may be added to the first solvent, the solution, or the second solvent.

Further, the surface modifier may be added to both the first solvent and the second solvent.

It is preferable that the above described production method includes a step of removing coarse particles using a method of carrying out centrifugation or filtration after the step of mixing the solution and the second solvent. The size of the coarse particles to be removed by the removal step is preferably 10 µm or greater, more preferably 1 µm or greater, and still more preferably 500 nm or greater.

(Second Production Method)

Examples of the method for producing the perovskite compound include a production method including a step of dissolving a compound containing the component A, a compound containing the component B, and a compound containing the component X constituting the perovskite compound in a high-temperature third solvent to obtain a solution, and a step of cooling the solution.

Hereinbelow, specific explanations are made on the second production method.

First, a compound containing the component A, a compound containing the component B, and a compound containing the component X are dissolved in a high-temperature third solvent to obtain a solution. The "compound containing the component A" may contain the component X. The "compound containing the component B" may contain the component X.

In the present step, each compound may be added to a high-temperature third solvent and dissolved to obtain a solution.

Further, in the present step, after adding each compound to the third solvent, the temperature may be raised to obtain a solution.

Examples of the third solvent include a solvent capable of dissolving a compound containing the component A, a compound containing the component B, and a compound containing the component X, which are raw materials. Specifically, examples of the third solvent include the above-mentioned first solvent and second solvent.

The "high-temperature" may be any temperature at which each raw material is dissolved. For example, the temperature of the high-temperature third solvent is preferably 60 to 600° C., more preferably 80 to 400° C.

Then, the obtained solution is cooled.

The cooling temperature is preferably in a range of −20° C. to 50° C. and more preferably in a range of −10° C. to 30° C.

The cooling rate is preferably in a range of 0.1° C. to 1500° C./min and more preferably in a range of 10° C. to 150° C./min.

By cooling the hot solution, the perovskite compound can be precipitated by the difference in solubility due to the temperature difference of the solution. As a result, a dispersion containing the perovskite compound is obtained.

The perovskite compound can be recovered by performing solid-liquid separation on the obtained dispersion containing the perovskite compound. Examples of the solid-liquid separation method include the method shown in the first production method.

From the viewpoint of stably dispersing the obtained perovskite compound in the dispersion, it is preferable that the above described production method includes a step of adding a surface modifier.

The step of adding the surface modifier is preferably performed before the step of cooling the solution. Specifically, the surface modifier may be added to the third solvent or a solution containing at least one of a compound containing the component A, a compound containing the component B, and a compound containing the component X.

Further, it is preferable that the above described production method includes a step of removing coarse particles using a method of carrying out centrifugation or filtration shown in the first production method after the step of cooling the solution.

(Third Production Method)

Examples of the method for producing the perovskite compound include a step of obtaining a first solution in which a compound containing the component A and a compound containing the component B constituting the perovskite compound are dissolved, a step of obtaining a second solution in which a compound containing the component X constituting the perovskite compound are dissolved, a step of mixing the first solution and the second solution to obtain a mixed solution, and a step of cooling the obtained mixed solution.

Hereinbelow, specific explanations are made on the third production method.

First, a compound containing the component A and a compound containing the component B are dissolved in a high-temperature forth solvent to obtain a first solution.

Examples of the forth solvent include a solvent capable of dissolving a compound containing the component A and a compound containing the component B. Specifically, examples of the forth solvent include the above-mentioned third solvent.

The "high-temperature" may be any temperature at which the compound containing the component A and the compound containing the component B are dissolved. For example, the temperature of the high-temperature forth solvent is preferably 60 to 600° C., more preferably 80 to 400° C.

Further, a compound containing the component X is dissolved in a fifth solvent to obtain a second solution. The compound containing the component X may contain the component B.

Examples of the fifth solvent include a solvent capable of dissolving a compound containing the component X.

Specifically, examples of the fifth solvent include the above-mentioned third solvent.

Then, the obtained first solution and the second solution are mixed to obtain a mixed solution. When mixing the first solution and the second solvent, one may be added dropwise to the other. Further, it is preferable to mix the first solution and the second solution with stirring.

Then, the obtained mixed solution is cooled.

The cooling temperature is preferably in a range of −20° C. to 50° C. and more preferably in a range of −10° C. to 30° C.

The cooling rate is preferably in a range of 0.1° C. to 1500° C./min and more preferably in a range of 10° C. to 150° C./min.

By cooling the mixed solution, the perovskite compound can be precipitated by the difference in solubility due to the temperature difference of the mixed solution. As a result, a dispersion containing the perovskite compound is obtained.

The perovskite compound can be recovered by performing solid-liquid separation on the obtained dispersion containing the perovskite compound. Examples of the solid-liquid separation method include the method shown in the first production method.

From the viewpoint of stably dispersing the obtained perovskite compound in the dispersion, it is preferable that the above described production method includes a step of adding a surface modifier.

The step of adding the surface modifier is preferably performed before the step of cooling the mixed solution. Specifically, the surface modifier may be added to any of the forth solvent, the fifth solvent, the first solution, the second solution, and the mixed solution.

Further, it is preferable that the above described production method includes a step of removing coarse particles using a method of carrying out centrifugation or filtration shown in the first production method after the step of cooling the mixed solution.

<Production Method for Semiconductor Material (10)>

The semiconductor material (10), that is, the above described semiconductor materials (i) to (vii) can be produced by a method of heating a mixed solution of a simple substance of an element constituting a semiconductor material or a compound of an element constituting a semiconductor material, and a fat-soluble solvent.

The compound of an element constituting the semiconductor material is not particularly limited, and examples thereof include an oxide, an acetate, an organometallic compound, a halide, and a nitrate.

Examples of the fat-soluble solvent include a nitrogen-containing compound which contains a hydrocarbon group having 4 to 20 carbon atoms and an oxygen-containing compound which contains a hydrocarbon group having 4 to 20 carbon atoms.

Examples of the hydrocarbon group having 4 to 20 carbon atoms include a saturated aliphatic hydrocarbon group, an unsaturated aliphatic hydrocarbon group, an alicyclic hydrocarbon group, and an aromatic hydrocarbon group.

Examples of the saturated aliphatic hydrocarbon group having 4 to 20 carbon atoms include an n-butyl group, an isobutyl group, an n-pentyl group, an octyl group, a decyl group, a dodecyl group, a hexadecyl group and an octadecyl group.

Examples of the unsaturated aliphatic hydrocarbon group having 4 to 20 carbon atoms include an oleyl group.

Examples of the alicyclic hydrocarbon group having 4 to 20 carbon atoms include a cyclopentyl group and a cyclohexyl group.

Examples of the aromatic hydrocarbon group having 4 to 20 carbon atoms include a phenyl group, a benzyl group, a naphthyl group, and a naphthylmethyl group.

As the hydrocarbon group having 4 to 20 carbon atoms, a saturated aliphatic hydrocarbon group and an unsaturated aliphatic hydrocarbon group are preferable.

Examples of the nitrogen-containing compound include amines and amides.

Examples of the oxygen-containing compound include fatty acids.

Among such fat-soluble solvents, a nitrogen-containing compound having a hydrocarbon group having 4 to 20 carbon atoms is preferable. Preferred examples of such nitrogen-containing compounds include alkylamines such as n-butylamine, isobutylamine, n-pentylamine, n-hexylamine, octylamine, decylamine, dodecylamine, hexadecylamine, and octadecylamine, and. alkenylamines such as oleylamine.

Such a fat-soluble solvent can be bonded to the surface of the semiconductor material produced by synthesis. Examples of the type of bond when the fat-soluble solvent is bonded to the surface of the semiconductor material include chemical bonds such as a covalent bond, an ionic bond, a coordination bond, a hydrogen bond, and a van der Waals bond.

The heating temperature of the mixed solution may be appropriately set depending on the kind of raw material (simple substance or compound) to be used. For example, it is preferable that the heating temperature thereof is set to be in a range of 130° C. to 300° C. and more preferable that the heating temperature thereof is set to be in a range of 240° C. to 300° C. From the viewpoint of easily unifying the crystal structure, it is preferable that the heating temperature is higher than or equal to the above-described lower limit. Since the crystal structure of the resulting semiconductor material is less likely to collapse and the desired product can be easily obtained, it is preferable that the heating temperature is less than or equal to the above-described upper limit.

The heating time may be appropriately set depending on the kind of raw material (simple substance or compound) to be used and the heating temperature. For example, it is preferable that the heating time is set to be in a range of several seconds to several hours and more preferable that the heating time is set to be in a range of 1 minute to 60 minutes.

In the above described method for producing a semiconductor material, a precipitate containing the target semiconductor material can be obtained by cooling the mixed solution after heating. By separating the precipitate and appropriately washing the precipitate, the target semiconductor material can be obtained.

A solvent in which the synthesized semiconductor material are insoluble or sparingly soluble is added to the supernatant from which the precipitate has been separated to reduce the solubility of the semiconductor material in the supernatant to generate a precipitates, the precipitates included in the supernatant can be collected. Examples of the "solvent in which the semiconductor material is insoluble or sparingly soluble" include methanol, ethanol, acetone, and acetonitrile.

In the above described production method for the semiconductor material, the separated precipitate is added to an organic solvent (such as chloroform, toluene, hexane, or n-butanol) to obtain a solution containing the semiconductor material.

<<Production Method 1 for Composition>>

Hereinafter, in order to make it easier to understand the properties of the obtained composition, the composition obtained by the production method 1 for the composition is referred to as a "liquid composition".

The liquid composition of the present embodiment can be produced by a production method including a step of mixing the perovskite compound (1), and one or both of the solvent (3) and the polymerizable compound (4).

When mixing the perovskite compound (1) and the solvent (3), it is preferable to stir.

When the perovskite compound (1) and the polymerizable compound (4) are mixed, the temperature at the time of mixing is not particularly limited. The temperature is preferably in a range of 0° C. to 100° C., and more preferably 10° C. to 80° C., because the perovskite compound (1) is easily mixed uniformly.

As described above, the perovskite compound (1) may contain the halogen-containing compound (2) as a residue of the halogen compound used in the process of producing the perovskite compound (1). The production method 1 for the composition may include a step of reducing the amount of the halogen atom of the halogen-containing compound (2) in the perovskite compound (1) to be used in advance. Specific methods of the step of reducing the amount of the halogen atom of the halogen-containing compound (2) include the above-mentioned washing, dilution, and deaeration. Washing of the perovskite compound (1) is preferably carried out using the organic solvents listed as (a) to (h), (i) and (k)

described above, and more preferably carried out using an organic solvent (g) having a nitrile group or a hydrocarbon (i).

Further, in each production method described below, in order to adjust the concentration of the halogen atom contained in the halogen-containing compound (2) in the obtained composition, a step of adjusting the concentration of the halogen atom contained in the obtained composition may be included. Specific methods of the step of adjusting the concentration of halogen atoms include a method of diluting the obtained composition with a dispersion medium.

(Production Method for Liquid Composition Containing Solvent (3))

In a case where the composition of the present embodiment contains the surface modifier (5), the production method for the composition may be the following production method (a1) or the production method (a2).

Production Method (a1): A production method for a composition, which includes a step of mixing the perovskite compound (1) and the solvent (3), and a step of mixing the obtained mixture and the surface modifier (5).

Production Method (a2): A production method for a composition, which includes a step of mixing the perovskite compound (1) and the surface modifier (5), and a step of mixing the obtained mixture and the solvent (3).

The solvent (3) used in the production methods (a1) and (a2) is preferably the above described solvent in which the perovskite compound (1) is difficult to dissolve. When such a solvent (3) is used, the mixture obtained by the production method (a1) and the compositions obtained by the production methods (a1) and (a2) become dispersions.

In a case where the composition of the present embodiment contains the modified product group (6), the production method for the composition may be the production method (a3) using the component (6A) or the production method (a4) using the component (6A).

Component (6A): at least one compound selected from the group consisting of silazane, compound represented by Formula (C1), compound represented by Formula (C2), compound represented by Formula (A5-51), compound represented by Formula (A5-52), and sodium silicate.

In the following description, the component (6A) is referred to as "raw material compound (6A)". The raw material compound (6A) becomes the modified product group (6) by undergoing a modification treatment.

Production method (a3): A production method for a composition, which includes a step of mixing the perovskite compound (1) and the solvent (3), a step of mixing the obtained mixture, the surface modifier (5) and the raw material compound (6A), and a step of subjecting the obtained mixture to a modification treatment.

Production method (a4): A production method for a composition, which includes a step of mixing the perovskite compound (1) and the surface modifier (5) and the raw material compound (6A), a step of mixing the obtained mixture and the solvent (3), and a step of subjecting the obtained mixture to a modification treatment.

The polymer (4-1) may be dissolved or dispersed in the solvent (3).

From the viewpoint of improving the dispersibility, it is preferable that stirring is performed in the mixing step included in the above-described production method.

The temperature in the mixing step included in the above-described production method is not particularly limited, but is preferably in a range of 0° C. to 100° C. and more preferably in a range of 10° C. to 80° C. from the viewpoint of uniformly mixing the mixture.

From the viewpoint of improving the dispersibility of the perovskite compound (1), it is preferable that the production method for a composition is the production method (a1) or the production method (a3).

(Method of Performing Modification Treatment)

Examples of the method of performing the modification treatment include known methods such as a method of radiating the raw material compound (6A) with ultraviolet rays and a method of reacting the raw material compound (6A) with water vapor. In the following description, the treatment of reacting the raw material compound (6A) with water vapor may be referred to as "humidification treatment".

Among these, from the viewpoint of forming a stronger protected region in the vicinity of the perovskite compound (1), it is preferable to perform a humidification treatment.

The wavelength of ultraviolet rays used in the method involving irradiation with ultraviolet rays is typically 10 to 400 nm, preferably 10 to 350 nm, and more preferably 100 to 180 nm. Examples of the light source that generates ultraviolet rays include a metal halide lamp, a high-pressure mercury lamp, a low-pressure mercury lamp, a xenon arc lamp, a carbon arc lamp, an excimer lamp, and a UV laser beam.

In a case where the humidification treatment is performed, for example, the composition may be allowed to stand or be stirred for a certain time under the temperature and humidity conditions described below.

The temperature in the humidification treatment may be a temperature at which the modification proceeds sufficiently. For example, the temperature in the humidification treatment is preferably 5 to 150° C., more preferably 10 to 100° C., and more preferably 15 to 80° C.

The humidity during the humidification treatment may be a humidity at which the moisture is sufficiently supplied to the raw material compound (6A). The humidity during the humidification treatment is, for example, preferably in a range of 30% to 100%, more preferably in a range of 40% to 95%, and still more preferably in a range of 60% to 90%. The "humidity" indicates the relative humidity at a temperature at which the humidification treatment is performed.

The time required for the humidification treatment may be a time at which the modification proceeds sufficiently. The time required for the humidification treatment is, for example, preferably in a range of 10 minutes to 1 week, more preferably in a range of 1 hour to 5 days, and still more preferably in a range of 2 hours to 3 days.

From the viewpoint of improving the dispersibility of the raw material compound (6A) contained in the composition, it is preferable that stirring is carried out.

Water may be supplied in the humidification treatment by circulating a gas containing water vapor in the reaction vessel, or by stirring in an atmosphere containing water vapor to supply water from the interface.

In a case where a gas containing water vapor is circulated in the reaction vessel, the flow rate of the gas containing water vapor is preferably 0.01 L/min or greater and 100 L/min or less, more preferably 0.1 L/min or greater and 10 L/min or less, and still more preferably 0.15 L/min or greater and 5 L/min or less, from the viewpoint of improving the durability of the obtained composition. Examples of the gas containing water vapor include nitrogen containing a saturated amount of water vapor.

In the production method for a composition of the present embodiment, the surface modifier (5), the solvent (3), and modified product group (6) may be mixed in any steps included in the above described production method for the perovskite compound (1). For example, the following production method (a5) or the following production method (a6) may be employed.

Production method (a5) is a production method which includes a step of dissolving a compound containing the component B, a compound containing component X, and a compound containing component A constituting the perovskite compound, the surface modifier (5), and the modified product group (6) in the first solvent to obtain a solution, and a step of mixing the obtained solution and the second solvent.

The first solvent and the second solvent are the same as the above-mentioned solvent.

Production method (a6) is a production method which includes a step of dissolving a compound containing the component B, a compound containing component X, and a compound containing component A constituting the perovskite compound, the surface modifier (5), and the modified product group (6) in a high-temperature third solvent to obtain a solution, and a step of cooling the solution.

The third solvent is the same as the above-mentioned solvent.

The conditions of each step included in these production methods are the same as those described above in relation to the first production method and the second production method in the production method for the perovskite compound.

Further, in a case where the composition of the present embodiment contains the semiconductor material (10), it can be appropriately set "a step of mixing semiconductor material (10)" in the above described production methods (a1) to (a4).

Specifically, in the production method (a1), a step of mixing the semiconductor material (10) is preferably set after the step of mixing the mixture and the surface modifier (5).

In the production method (a2), a step of mixing the semiconductor material (10) is preferably set after the step of mixing the mixture and the solvent (3).

In the production method (a3), a step of mixing the semiconductor material (10) is preferably set after the step of mixing the mixture and the surface modifier (5) and after the step of subjecting the mixture to a modification treatment.

In the production method (a4), a step of mixing the semiconductor material (10) is preferably set after the step of mixing the mixture and the solvent (3) and after the step of subjecting the mixture to a modification treatment.

(Production Method for Liquid Composition Containing Polymerizable Compound (4))

Examples of the production method for a composition containing the perovskite compound (1), the polymerizable compound (4), the surface modifier (5), and the modified product group (6) include the following production methods (c1) to (c3).

Production method (c1): a production method including a step of dispersing the perovskite compound (1) in the polymerizable compound (4) to obtain a dispersion, a step of mixing the obtained dispersion, and the surface modifier (5) and modified product group (6).

Production method (c2): a production method including a step of dispersing the surface modifier (5) and modified product group (6) in the polymerizable compound (4) to obtain a dispersion, a step of mixing the obtained dispersion and the perovskite compound (1).

Production method (c3): a production method including a step of dispersing the perovskite compound (1), the surface modifier (5), and modified product group (6) in the polymerizable compound (4) to obtain a dispersion.

Among the production methods (c1) to (c3), the production method (c1) is preferable from the viewpoint of improving the dispersibility of the perovskite compound (1).

In the steps of obtaining each dispersion included in the production methods (c1) to (c3), the polymerizable compound (4) may be added dropwise to each material, or each material may be added dropwise to the polymerizable compound (4).

From the viewpoint of easy uniform dispersion, it is preferable that at least one of the perovskite compound (1), the surface modifier (5), and the modified product group (6) is added dropwise to the polymerizable compound (4).

In each mixing step included in the production methods (c1) to (c3), the dispersion may be added dropwise to each material, or each material may be added dropwise to the dispersion.

From the viewpoint of easy uniform dispersion, it is preferable that at least one of the perovskite compound (1), the surface modifier (5), and the modified product group (6) is added dropwise to the dispersion.

At least one of the solvent (3) and the polymer (4-1) may be dissolved or dispersed in the polymerizable compound (4).

The solvent for dissolving or dispersing the polymer (4-1) is not particularly limited. As the solvent, a solvent that is difficult to dissolve the perovskite compound (1) is preferable.

Examples of the solvent in which the polymer (4-1) is dissolved include the same solvents as the above described first to third solvents.

Among them, the second solvent is preferable because it has a low polarity and it is considered that the perovskite compound (1) is difficult to dissolve.

Among the second solvents, a hydrocarbon is more preferable.

The production method for a composition of the present embodiment may be the following production method (c4) or the following production method (c5).

Production method (c4): a production method for a composition, which includes a step of dispersing the perovskite compound (1) in the solvent (3) to obtain a dispersion, a step of mixing the obtained dispersion with the polymerizable compound (4) to obtain a mixture, and a step of mixing the obtained mixture with the surface modifier (5) and modified product group (6).

Production method (c5): a production method for a composition, which includes a step of dispersing the perovskite compound (1) in the polymerizable compound (4) to obtain a dispersion, a step of mixing the obtained dispersion with the surface modifier (5) and the raw material compound (6A) to obtain a mixture, a step of modifying the mixture to obtain a mixture containing modified product group (6), and a step of mixing the obtained mixture with the polymerizable compound (4).

In a case where the composition of the present embodiment contains the semiconductor material (10), it can be appropriately set "a step of mixing semiconductor material (10)" in the above described production methods (c1) to (c5).

In the production methods (c1), (c2), (c4), and (c5), a step of mixing the semiconductor material (10) is preferably set after the step of mixing.

In the production method (c3), a step of mixing the semiconductor material (10) is preferably set after the step of dispersing.

<<Production method 2 for composition>>

The composition of the present embodiment can be produced by a production method including a step of mixing the perovskite compound (1) and the polymerizable compound (4), and a step of polymerizing the polymerizable compound (4).

Examples of the production method for the composition of the present embodiment include a production method including a step of mixing the perovskite compound (1), surface modifier (5), the polymerizable compound (4), and the modified product group (6), and a step of polymerizing the polymerizable compound (4).

In the composition obtained by the production method 2 for the composition, the total amount of perovskite compound (1), surface modifier (5), polymer (4-1), and modified product group (6) is preferably 90% by mass or more, with respect to the total mass of the composition.

Further, Examples of the production method for the composition of the present embodiment also include a production method including a step of mixing the perovskite compound (1), surface modifier (5), the polymer (4-1) dissolved in the solvent (3), and the modified product group (6), and a step of removing the solvent (3).

As the mixing step included in the production method, the same mixing method as the production method 1 for the composition described above can be used.

Examples of the production method for the composition include the following production methods (d1) to (d6).

Production method (d1): a production method including a step of dispersing the perovskite compound (1) in the polymerizable compound (4) to obtain a dispersion, a step of mixing the obtained dispersion, and the surface modifier (5) and the modified product group (6), and a step of polymerizing the polymerizable compound (4).

Production method (d2): a production method including a step of dispersing the perovskite compound (1) in the polymer (4-1) dissolved in the solvent (3) to obtain a dispersion, a step of mixing the obtained dispersion, and the surface modifier (5) and the modified product group (6), and a step of removing the solvent.

Production method (d3): a production method including a step of dispersing the surface modifier (5) and the modified product group (6) in the polymerizable compound (4) to obtain a dispersion, a step of mixing the obtained dispersion and the perovskite compound (1), and a step of polymerizing the polymerizable compound (4).

Production method (d4): a production method including a step of dispersing the surface modifier (5) and the modified product group (6) in the polymer (4-1) dissolved in the solvent (3) to obtain a dispersion, a step of mixing the obtained dispersion and the perovskite compound (1), and a step of removing the solvent.

Production method (d5): a production method including a step of dispersing the mixture of the perovskite compound (1), the surface modifier (5), and modified product group (6) in the polymerizable compound (4), and a step of polymerizing the polymerizable compound (4).

Production method (d6): a production method including a step of dispersing the mixture of the perovskite compound (1), the surface modifier (5), and modified product group (6) in the polymer (4-1) dissolved in the solvent (3), and a step of removing the solvent.

The step of removing the solvent (3) included in the production methods (d2), (d4), and (d6) may be a step of allowing the solvent to stand at room temperature so as to be naturally dried, a vacuum drying using a vacuum dryer, or a step of evaporating the solvent (3) by heating.

In the step of removing the solvent (3), for example, the solvent (3) can be removed by drying at a temperature of 0° C. to 300° C. for 1 minute to 7 days.

The step of polymerizing the polymerizable compound (4) included in the production methods (d1), (d3), and (d5) can be performed by appropriately using a known polymerization reaction such as radical polymerization.

For example, in a case of the radical polymerization, the polymerization reaction can be allowed to proceed by adding a radical polymerization initiator to the mixture of the perovskite compound (1), the surface modifier (5), the polymerizable compound (4), and the modified group (6) to generate a radical.

The radical polymerization initiator is not particularly limited, and examples thereof include a photoradical polymerization initiator.

As the photoradical polymerization initiator, bis(2,4,6-trimethylbenzoyl)-phenylphosphine oxide is an exemplary example.

In a case where the composition of the present embodiment contains the semiconductor material (10), it can be appropriately set "a step of mixing semiconductor material (10)" in the above described production methods (d1) to (d6).

Specifically, to the production methods (d1) to (d4), a step of mixing the semiconductor material (10) is preferably set after the step of mixing.

In the production methods (d5) and (d6), a step of mixing the semiconductor material (10) is preferably set after the step of dispersing.

<<Production Method 3 for Composition>>

Further, as the production method for the composition of the present embodiment, the following production methods (d7) to (d11) can also be employed.

Production method (d7): a production method including a step of melt-kneading the perovskite compound (1), the surface modifier (5), and the polymer (4-1).

Production method (d8): a production method including a step of melt-kneading the perovskite compound (1), the surface modifier (5), the polymer (4-1), and the raw material compound (6A), a step of performing modification treatment in a molten state of the polymer (4-1).

Production method (d9): a production method including a step of producing a liquid composition containing the perovskite compound (1) and the surface modifier (5), a step of extracting solid content from the obtained liquid composition, and a step of melt-kneading the obtained solid content and the polymer (4-1).

Production method (d10): a production method including a step of producing a liquid composition containing the perovskite compound (1), the surface modifier (5), and the modified product group (6), a step of extracting solid content from the obtained liquid composition, and a step of melt-kneading the obtained solid content and the polymer (4-1).

Production method (d11): a production method including a step of producing a liquid composition containing the perovskite compound (1) and the surface modifier (5), a step of extracting solid content from the obtained liquid composition, and a step of melt-kneading the obtained solid content, the modified product group (6), and the polymer (4-1).

In the steps of melt-kneading in the production methods (d7) to (d11), a mixture of the polymer (4-1) and other materials may be melt-kneaded, or other materials may be added to the molten polymer (4-1). "Other materials" refers to materials used in each production method in addition to the polymer (4-1), specifically the perovskite compound (1), the surface modifier (5), the raw material compound (6A), and the modified product group (6).

The modified product group (6) added in the step of melt-kneading in the production method (d11) is obtained by subjecting the raw material compound (6A) to a modification treatment.

As a method for melt-kneading the polymer (4-1) in the production methods (d7) to (d11), a known method as a polymer kneading method can be employed. For example, extrusion using a single-screw extruder or a twin-screw extruder can be employed.

As the step of performing modification treatment in the production method (d8), the above-mentioned method can be employed.

As the step of producing the liquid composition in the production methods (d9) and (d11), the above-mentioned production method (a1) or (a2) can be employed.

As the step of producing the liquid composition in the production method (d10), the above-mentioned production method (a3) or (a4) can be employed.

The step of extracting the solid content in the production methods (d9) to (d11), for example, is carried out by removing the solvent (3) and the polymerizable compound (4) constituting the liquid composition from the liquid composition by heating, depressurizing, blowing, and combination thereof.

In a case where the composition of the present embodiment contains the semiconductor material (10), it can be appropriately set "a step of mixing semiconductor material (10)" in the above described production methods (d7) to (d11).

Specifically, in the production methods (d7) and (d8), it is preferable to melt-knead the semiconductor material (10) and the polymer (4-1) together with the perovskite compound (1).

In the production methods (d9) to (d11), the step of producing the liquid composition may include a step of mixing the semiconductor material (10), and the semiconductor material (10) and the polymer (4-1) may be melt-kneaded together with the perovskite compound (1).

<<Measurement of Luminescent Semiconductor Material>>

The amount of the luminescent semiconductor material contained in the composition of the present invention is calculated as a solid content concentration (mass %) by the dry mass method.

<<Measurement of Solids Content of Perovskite Compound>>

The solids content of the perovskite compound in the composition of the present embodiment is determined as follows. A dispersion containing the perovskite compound and the solvent, which have been obtained by re-dispersing the perovskite compound, is dried, and then, the mass of the remaining product is measured. The solids content is calculated by applying the measured values to the following Formula.

Solids content (% by mass)=mass after drying÷mass before drying×100

<<Emission Intensity Measurement>>

The emission intensity can be measured with excitation light having a wavelength of 450 nm at room temperature in the atmosphere using an absolute PL quantum yield measuring device (C9920-02, manufactured by Hamamatsu Photonics K. K.).

<<Film>>

The film according to the present embodiment uses the above described composition as a fabrication material. For example, the film according to the present embodiment contains the perovskite compound (1), the surface modifier (5), and the polymer (4-1), in which the total amount of the perovskite compound (1), surface modifier (5), and the polymer (4-1) is 90% by mass or greater with respect to the total mass of the film.

The shape of the film is not particularly limited, and the film can be formed in an arbitrary shape such as a sheet shape or a bar shape. In the present specification, the "bar shape" means, for examples, a band shape in plan view extending in one direction. Examples of the band shape in plan view include a plate shape having different lengths on each side.

The thickness of the film may be in a range of 0.01 μm to 1000 mm, in a range of 0.1 μm to 10 mm, or in a range of 1 μm to 1 mm.

In the present specification, when the side with the smallest length value among the length, width, and height of the film is set to the "thickness direction", the thickness of the film refers to the distance between the front surface and the back surface in the thickness direction of the film. Specifically, the thickness of the film is measured at any three points of the film using a micrometer, and the average value of the measured values at the three points is taken as the thickness of the film.

The film may be formed of a single layer or a plurality of layers. In a case of a plurality of layers, the same kind of composition may be used for each layer or different kinds of composition may be used for respective layers.

For example, the film can be obtained as a film formed on a substrate according to production methods for a laminated structure (e1) to (e3) described below. Further, the film can be obtained by being peeled off from the substrate.

<<Laminated structure>>

The laminated structure according to the present embodiment has a plurality of layers, at least one of which is the above-described film.

Among the plurality of layers included in the laminated structure, examples of layers other than the above-described film include optional layers such as a substrate, a barrier layer, and a light scattering layer.

The shape of the film to be laminated is not particularly limited, and the film can be formed in an arbitrary shape such as a sheet shape or a bar shape.

(Substrate)

The substrate is not particularly limited and may be a film. The substrate is preferably a substrate having light transmission. A laminated structure having a substrate having light transmission is preferable because the light emitted by the perovskite compound (1) can be easily taken out.

As the substrate forming material, for example, a polymer such as polyethylene terephthalate or a known material such as glass can be used.

For example, the above-described film may be provided on the substrate in the laminated structure.

FIG. 1 is a cross-sectional view schematically showing the configuration of the laminated structure according to the present embodiment. A film 10 according to the present embodiment may be provided between a first substrate 20 and a second substrate 21 in a first laminated structure 1a. The film 10 is sealed by a sealing layer 22.

According to one aspect of the present invention, the laminated structure 1a includes the first substrate 20, the second substrate 21, the film 10 according to the present embodiment which is positioned between the first substrate 20 and the second substrate 21, and the sealing layer 22 and is configured such that the sealing layer is disposed on a surface that does not contact with the first substrate 20 and the second substrate 21 of the film 10.

(Barrier Layer)

The layer which may be included in the laminated structure according to the present embodiment is not particularly limited, and examples thereof include a barrier layer. The laminated structure may include a barrier layer because the barrier layer protects the above-described composition from water vapor in outside air or the air in the atmosphere.

The barrier layer is not particularly limited, and a transparent barrier layer is preferable from the viewpoint of extracting emitted light. For example, a polymer such as polyethylene terephthalate or a known barrier layer such as a glass film can be used as the barrier layer.

(Light Scattering Layer)

The layer which can be included in the laminated structure according to the present embodiment is not particularly limited, and examples thereof include a light scattering layer. From the viewpoint of efficiently utilizing incident light, the laminated structure may include a light scattering layer.

The light scattering layer is not particularly limited, and a transparent light scattering layer is preferable from the viewpoint of extracting emitted light. For example, light scattering particles such as silica particles or a known light scattering layer such as an amplified diffusion film can be used.

<<Light-Emitting Device>>

A light-emitting device according to the present embodiment can be obtained by combining the film according to the present embodiment or the laminated structure according to the present embodiment with a light source. The light-emitting device is a device that extracts light by irradiating the film or the laminated structure placed in the light emitting direction of light source with light emitted from the light source and allowing the film or the laminated structure to emit light.

Among a plurality of layers included in the laminated structure in the light-emitting device, examples of layers other than the film, the substrate, the barrier layer, and the light scattering layer include optional layers such as a light reflection member, a brightness-reinforcing film, a prism sheet, a light-guiding plate, and a medium material layer between elements.

According to one aspect of the present invention, a light-emitting device 2 is formed by laminating a prism sheet 50, a light-guiding plate 60, the first laminated structure 1a, and a light source 30 in this order.

(Light Source)

As the light source constituting the light emitting device according to the present embodiment, a light source that emits light included in the absorption wavelength band of the perovskite compound (1) is used. For example, a light source having an emission wavelength of 600 nm or less is preferable, from the viewpoint of allowing the perovskite compound in the above described film or the laminated structure to emit light. Examples of the light source include known light sources, for example, a light-emitting diode (LED) such as a blue light-emitting diode, a laser, and an EL.

(Light Reflection Member)

The layer which may be included in the laminated structure constituting the light-emitting device according to the present embodiment is not particularly limited, and examples thereof include a light reflection member. The light-emitting device having a light reflecting member can efficiently irradiate the light of the light source toward the film or the laminated structure.

The light reflection member is not particularly limited and may be a reflective film. Examples of the light reflection member include known reflective films such as a reflecting mirror, a film formed of reflective particles, a reflective metal film, and a reflector.

(Brightness-Reinforcing Unit)

The layer which may be included in the laminated structure constituting the light-emitting device according to the present embodiment is not particularly limited, and examples thereof include a brightness-reinforcing unit. From the viewpoint of reflecting partial light to be returned to the direction in which the light is transmitted, the laminated structure may include the brightness-reinforcing unit.

(Prism Sheet)

The layer which may be included in the laminated structure constituting the light-emitting device according to the present embodiment is not particularly limited, and examples thereof include a prism sheet. A prism sheet typically includes a base material portion and a prism portion. Further, the base material portion may not be provided depending on a member adjacent to the base material portion.

The prism sheet can be attached to adjacent members through an optional appropriate adhesion layer (for example, an adhesive layer or a pressure sensitive adhesive layer).

In a case where the light-emitting device is used for a display described below, the prism sheet is configured such that a plurality of unit prisms which become projections are arranged in parallel with one another on a side (rear side) opposite to a viewing side. Light transmitted through the prism sheet is likely to be focused by arranging the projections of the prism sheet toward the rear side. Further, in a case where the projections of the prism sheet are arranged toward the rear side, the quantity of light to be reflected without being incident on the prism sheet is small compared to a case where the projections are arranged toward the viewing side, and a display with high brightness can be obtained.

(Light-Guiding Plate)

The layer which may be included in the laminated structure constituting the light-emitting device according to the present embodiment is not particularly limited, and examples thereof include a light-guiding plate. As the light-guiding plate, an optional appropriate light-guiding plate such as a light-guiding plate in which a lens pattern is formed on the rear side such that light from the lateral direction can be deflected in the thickness direction or a light-guiding plate in which a prism shape or the like is formed on either or both of the rear side and the viewing side can be used.

(Medium Material Layer Between Elements)

The layer which may be included in the laminated structure constituting the light-emitting device according to the present embodiment is not particularly limited, and examples thereof include a layer (medium material layer between elements) formed of one or more medium materials on an optical path between elements (layers) adjacent to each other.

One or more mediums included in the medium material layer between elements are not particularly limited, and examples thereof include vacuum, air, gas, an optical material, an adhesive, an optical adhesive, glass, a polymer, a solid, a liquid, a gel, a curing material, an optical bonding material, a refractive index matching or refractive index mismatching material, a refractive index gradient material, a cladding or anti-cladding material, a spacer, a silica gel, a brightness-reinforcing material, a scattering or diffusing material, a reflective or anti-reflective material, a wavelength selective material, a wavelength selective anti-reflective material, a color filter, and suitable media known in the technical field.

Specific examples of the light-emitting device according to the present embodiment include those provided with wavelength conversion materials for an EL display and a liquid crystal display. Specific examples thereof include the following configurations (E1) to (E4).

Configuration (E1): a backlight (on-edge type backlight) that converts blue light to green light or red light by putting the composition of the present embodiment into a glass tube or the like so as to be sealed and disposing the glass tube or the like between a light-guiding plate and a blue light-emitting diode serving as a light source such that the glass tube or the like is along with an end surface (side surface) of the light-guiding plate.

Configuration (E2): a backlight (surface-mounting type backlight) that converts blue light to be irradiated to a sheet after passing through a light-guiding plate from a blue light-emitting diode placed on an end surface (side surface) of the light-guiding plate to green light or red light by forming the sheet using the composition of the present embodiment and placing a film obtained by interposing the sheet between two barrier films so as to be sealed on the light-guiding plate.

Configuration (E3): a backlight (on-chip type backlight) that converts blue light to be irradiated to green light or red light by dispersing the composition of the present embodiment in a resin or the like and placing the resin or the like in the vicinity of a light-emitting unit of a blue light-emitting diode.

Configuration (E4): a backlight that converts blue light to be irradiated from a light source to green light or red light by dispersing the composition of the present embodiment in a resist and placing the resist on a color filter.

Further, specific examples of the light-emitting device according to the present embodiment include an illumination emitting white light which is obtained by forming the composition according to the present embodiment, disposing the composition on a back stage of a blue light-emitting diode serving as a light source, and converting blue light to green light or red light.

<<Display>>

Figure 2:
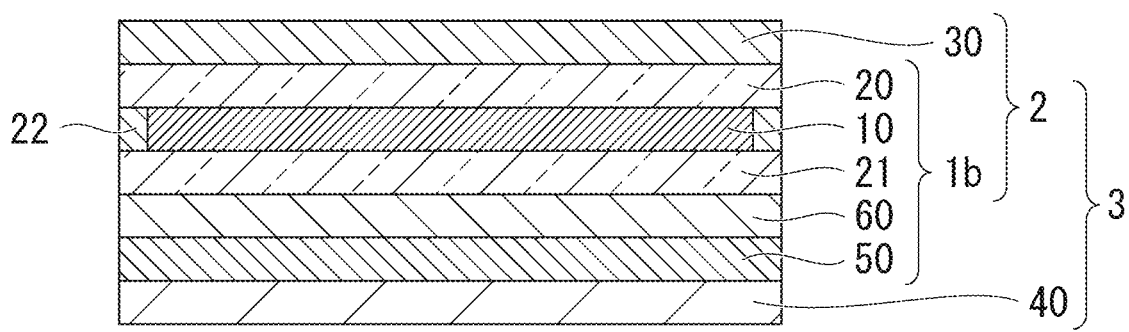
FIG. 2 is a cross-sectional view showing an embodiment of a display according to the present invention.

As shown in FIG. 2, a display 3 according to the present embodiment includes a liquid crystal panel 40 and the light-emitting device 2 described above in this order from the viewing side. The light-emitting device 2 includes a second laminated structure 1b and a light source 30. The second laminated structure 1b is formed of the first laminated structure 1a described above which further includes a prism sheet 50 and a light-guiding plate 60. The display may further include other appropriate optional members.

According to one aspect of the present invention, the display is the liquid crystal display 3 obtained by laminating the liquid crystal panel 40, the prism sheet 50, the light-guiding plate 60, the first laminated structure 1a, and the light source 30 in this order.

(Liquid Crystal Panel)

The liquid crystal panel typically includes a liquid crystal cell; a viewing-side polarizing plate disposed on a viewing side of the liquid crystal cell; and a rear-surface-side polarizing plate disposed on a rear surface side of the liquid crystal cell. The viewing-side polarizing plate and the rear-surface-side polarizing plate can be disposed such that respective absorption axes are substantially orthogonal or parallel to each other.

(Liquid Crystal Cell)

The liquid crystal cell includes a pair of substrates; and a liquid crystal layer serving as a display medium interposed between the substrates. In a typical configuration, a color filter and a black matrix are provided on one substrate. Further, a switching element that controls electro-optical characteristics of a liquid crystal; a scanning line that sends a gate signal to the switching element and a signal line that sends a source signal to the switching element; and a pixel electrode and a counter electrode are provided on the other substrate. The interval (cell gap) between the substrates can be controlled by a spacer or the like. An alignment film formed of polyimide can be provided on a side of the substrate that contacts the liquid crystal layer.

(Polarizing Plate)

The polarizing plate typically includes a polarizer and a protective layer disposed on both sides of the polarizer. Typically, the polarizer is an absorption type polarizer.

As the polarizer, an appropriate optional polarizer is used. Examples thereof include a polarizer obtained by adsorbing a dichroic material such as iodine or a dichroic dye on a hydrophilic polymer film such as a polyvinyl alcohol-based film, a partially formalized polyvinyl alcohol-based film, or an ethylene-vinyl acetate copolymer-based partially saponified film, followed by uniaxially stretching the resulting film; and a polyene-based alignment film such as a dehydrated product of polyvinyl alcohol or a dehydrochlorinated product of polyvinyl chloride. Among these, an example particularly preferable from the viewpoint of a high dichroic ratio is a polarizer obtained by adsorbing a dichroic material such as iodine on a polyvinyl alcohol-based film, followed by uniaxially stretching the resulting film.

<<Use of composition>>

Examples of the use of the composition according to the present embodiment include the following uses.

<LED>

For example, the composition according to the present embodiment can be used as a material for a light-emitting layer of an LED.

As the LED containing the composition of the present embodiment, an LED which has a structure in which the composition of the present embodiment and conductive particles such as ZnS are mixed and laminated in a film shape, an n-type transport layer is laminated on one surface, and a p-type transport layer is laminated on the other surface and emits light by circulating the current so that positive holes of a p-type semiconductor and electrons of an n-type semiconductor cancel the charge in the perovskite compound (1) contained in the bonding surface of the composition is an exemplary example.

<Solar Cell>

The composition of the present embodiment can be used as an electron transport material contained in an active layer of a solar cell.

The configuration of the solar cell is not particularly limited, and examples thereof include a solar cell which includes a fluorine-doped tin oxide (FTO) substrate, a titanium oxide dense layer, a porous aluminum oxide layer, an active layer containing the composition of the present invention, a hole transport layer such as 2,2',7,7'-tetrakis-(N,N'-di-p-methoxyphenylamine)-9,9'-spirobifluorene (Spiro-MeOTAD), and a silver (Ag) electrode in this order.

The titanium oxide dense layer has a function of transporting electrons, an effect of suppressing the roughness of FTO, and a function of suppressing movement of inverse electrons.

The porous aluminum oxide layer has a function of improving the light absorption efficiency.

The composition of the present embodiment which is contained in the active layer plays a role of charge separation and electron transport.

<Sensor>

The composition of the present embodiment can be used as the photoelectric conversion element (photodetection element) material which is used as image detector (image sensor) for solid-state image sensors such as X-ray image sensors and CMOS image sensors, a detection unit that detects specific features of a part of the living body, such as a fingerprint detector, a face detector, a vein detector and an iris detector, or a detection unit of an optical biosensor such as a pulse oximeter.

<<Production Method for Film>>

Examples of the production method for film include the following production methods (e1) to (e3).

Production method (e1): a production method for a film, which includes a step of applying a liquid composition to obtain a coating film and a step of removing the solvent (3) from the coating film.

Production method (e2): a production method for a film, which includes a step of applying a liquid composition containing the polymerizable compound (4) to obtain a coating film and a step of polymerizing the polymerizable compound (4) contained in the obtained coating film.

Production method (e3): a production method for a film by molding the compositions obtained in the above described production methods (d1) to (d6).

The film produced by the above described production method (e1) or (e2) may be peeled off from the production position and used.

<<Production Method for Laminated Structure>>

Examples of the production method for a laminated structure include the following production methods (f1) to (f3).

Production method (f1): a production method for a laminated structure, which includes a step of producing a liquid composition, a step of coating the obtained liquid composition on a substrate, and a step of removing the solvent (3) from the obtained coating film.

Production method (f2): a production method for a laminated structure, which includes a step of laminating a film on a substrate.

Production method (f3): a production method for a laminated structure, which includes a step of producing a liquid composition containing the polymerizable compound (4), a step of coating the obtained liquid composition on a substrate, and a step of polymerizing the polymerizable compound (4) included in the obtained coating film.

As the steps for producing the liquid composition in the production methods (f1) and (f3), the above described production methods (c1) to (c5) can be employed.

The steps of coating the liquid composition on the substrate in the production methods (f1) and (f3) are not particularly limited and can be carried out using a known coating method such as a gravure coating method, a bar coating method, a printing method, a spray method, a spin coating method, a dip method, or a die coating method.

The step of removing the solvent (3) in the production method (f1) may be the same as the step of removing the solvent (3) included in the above described production methods (d2), (d4), and (d6).

The step of polymerizing the polymerizable compound (4) in the production method (f3) may be the same as the step of polymerizing the polymerizable compound (4) included in the above described production methods (d1), (d3) and (d5).

In the step of laminating the film on the substrate, included in the production method (f2), an optional adhesive can be used.

The adhesive is not particularly limited as long as the perovskite compound (1) and the semiconductor material (10) are not dissolved therein, and a known adhesive can be used.

The production method for a laminated structure may be a production method including a step of further laminating an optional film on the obtained laminated structure.

Examples of the optional film to be laminated include a reflective film and a diffusion film.

An optional adhesive can be used in the step of laminating the film on the substrate.

The above described adhesive is not particularly limited as long as the perovskite compound (1) and the semiconductor material (10) are not dissolved therein, and a known adhesive can be used.

<<Production Method for Light-Emitting Device>>

A production method including a step of placing the light source, and the film or the laminated structure on the optical path of light emitted from the light source is an exemplary example.

EXAMPLES

Hereinbelow, the present invention will be described with reference to Examples and Comparative Examples which, however, should not be construed as limiting the present invention.

(Measurement of Solids Content of Perovskite Compound)

The solids content of the perovskite compound in each of the compositions obtained in Examples 1 to 8 and Comparative Example 1 was determined as follows. A dispersion containing the perovskite compound and the solvent, which had been obtained by re-dispersing the perovskite compound, was dried at 105° C. for 3 hours, and then, the mass of the remaining product was measured. The solids content was calculated by applying the measured values to the following formula.

$$\text{Solids content (\% by mass)} = \text{mass after drying} \div \text{mass before drying} \times 100$$

(Emission Intensity Measurement)

The emission spectrum of the composition obtained in each of Examples 1 to 8 and Comparative Example 1 was measured with excitation light having a wavelength of 450 nm at room temperature in the atmosphere using an absolute PL quantum yield measuring device (C9920-02, manufactured by Hamamatsu Photonics K. K.). For the emission intensity ascribed to the luminescent semiconductor material, the intensity of the wavelength at the apex of the emission peak ascribed to the semiconductor material was used.

(Calculation Method for Amount of Halogen Atoms in Halogen-Containing Compound)

An absolute ion chromatography was implemented under the following measurement conditions to determine the amount of halogen atoms in the halogen-containing compound contained in each of the toluene compositions obtained in Examples 1 to 8 and Comparative Example 1. The mass of the halogen ions obtained by the absolute ion chromatography was taken as the mass of the halogen atoms.
Ion Chromatography Measurement Conditions
ICS-2000, manufactured by Dionex Corporation
Column: IonPA CAG17C (card column)
IonPac AS17C (separation column ASRS500, suppressor used, flow rate 1 mL/min, eluent KOH)

4 mL of ion-exchanged water was mixed with 0.4 mL of the composition containing the perovskite to thereby extract halogen ions from the halogen-containing compound into water, followed by separating the aqueous layer to quantify halogen ions in the resulting aqueous solution. The calculation was made according to the following formula.

Amount (μg/g) of halogen atoms in halogen-containing compound (2) contained in composition=
(mass of halogen atoms contained in compound (2) contained in 0.4 mL of composition measured by ion chromatograph)(μg))÷0.4 (volume of composition (mL))×0.867 (specific gravity of toluene (g/mL))

(Mass Ratio of Halide Ions Contained in Halogen-Containing Compound to Luminescent Semiconductor Material)

The mass ratio of the halide ions to the luminescent semiconductor material in the composition obtained in each of Examples 1 to 8 and Comparative Example 1 was calculated by the following formula.

Mass of Halide Ions Contained in Compound (2) in Composition Measured by Ion chromatograph (μg)÷mass of luminescent semiconductor material in composition (μg)

(Evaluation of Durability)

The composition obtained in each of Examples 1 to 8 and Comparative Example 1 was mixed with a luminescent semiconductor material, followed by stirring. 1 hour later, a sample was separated, diluted 300-fold with toluene, and then subjected to emission spectrum measurement in ambient atmosphere at an excitation light of 450 nm and room temperature, using an absolute PL quantum yield measuring device (C9920-02, manufactured by Hamamatsu Photonics Co., Ltd.).

The durability was evaluated in terms of the value of (emission intensity ascribed to semiconductor material after 1 hour)/(emission intensity ascribed to semiconductor material immediately after mixing with the semiconductor material).

(Production of Composition)

Example 1

After mixing 25 mL of oleylamine and 200 mL of ethanol, 17.12 mL of a hydrobromic acid solution (48%) was added while stirring and cooling over ice, and the resultant was dried under reduced pressure to obtain a precipitate. The precipitate was washed with diethyl ether and then dried under reduced pressure to obtain an oleyl ammonium bromide.

200 mL of toluene was mixed with 21 g of the oleyl ammonium bromide to prepare a solution containing the oleyl ammonium bromide.

1.52 g of lead acetate trihydrate, 1.56 g of formamidine acetate, 160 mL of 1-octadecene solvent, and 40 mL of oleic acid were mixed. The resulting mixture was stirred and heated to 130° C. with flowing nitrogen, followed by addition of 53.4 mL of the above-mentioned solution containing the oleyl ammonium bromide. After the addition, the resulting solution was cooled to room temperature to obtain a dispersion.

A solution obtained by mixing 100 mL of toluene and 50 mL of acetonitrile with 120 mL of the dispersion was subjected to solid-liquid separation by filtration, and the solids remaining on the filter were washed twice with a mixed solution of 100 mL of toluene and 50 mL of acetonitrile. Then, the solids on the filter were dispersed into toluene to obtain a perovskite dispersion.

With respect to 200 mL of the perovskite dispersion obtained above, the solids content thereof was adjusted with toluene to 0.45% by mass, and 1.9 parts by mass (relative to 1 part by mass of perovskite in the dispersion) of organosilazane (Durazane 1500 Slow Cure, manufactured by Merck Performance Materials Ltd.) was added. The resulting was subjected to steam reforming for 4 hours, and then 0.05 mL thereof was separated and mixed with 0.45 mL of toluene, thereby obtaining a dispersion composition containing the perovskite, the solvent, and the halogen-containing compound. As for the conditions for the reforming treatment, the flow rate of steam was 0.2 L/min (supplied with $N_2$ gas, saturated steam amount at 30° C.), and the heating temperature was 80° C. The amount of bromide ions derived from the halogen-containing compound contained in the above-mentioned dispersion containing the perovskite was measured by an ion chromatograph and was found to be 130 ppm (μg/g).

0.1 mL of a commercially available InP/ZnS toluene dispersion (solids content of the luminescent semiconductor material: 5%; emission wavelength: 630 nm) was mixed with 0.5 mL of the obtained dispersion composition containing the perovskite, the solvent, and the halogen-containing compound to obtain a dispersion composition containing the InP, the dispersion composition containing the perovskite, the halogen-containing compound, and the solvent, in which the amount of bromide ions derived from the halogen-containing compound was 108 ppm (μg/g). The mass ratio of bromine in the halogen-containing compound to the luminescent semiconductor particles in the composition was 0.0130.

The results of the durability test revealed that the value of (emission intensity ascribed to semiconductor material after 1 hour)/(emission intensity ascribed to semiconductor material immediately after mixing with the semiconductor material) was 0.80.

The emission spectrum was measured after mixing 0.01 mL of the dispersion composition containing the InP, the dispersion composition containing the perovskite, the halogen-containing compound, and the solvent, in which the amount of bromide ions derived from the halogen-containing compound was 108 ppm (μg/g) with 2.99 mL of toluene to dilute the dispersion composition 300-fold.

Example 2

With respect to 200 mL of the perovskite dispersion obtained in the same manner as in Example 1, the solids content thereof was adjusted with toluene to 0.45% by mass, and 1.9 parts by mass (relative to 1 part by mass of perovskite in the dispersion) of organosilazane (Durazane 1500 Slow Cure, manufactured by Merck Performance Materials Ltd.) was added. The resulting was subjected to steam reforming for 4 hours, and then 0.2 mL thereof was separated and mixed with 0.3 mL of toluene, thereby obtaining a dispersion composition containing the perovskite, a solvent, and a halogen-containing compound. As for the conditions for the reforming treatment, the flow rate of steam was 0.2 L/min (supplied with $N_2$ gas, saturated steam amount at 30° C.), and the heating temperature was 80° C. The amount of bromide ions derived from the halogen-containing compound contained in the above-mentioned dispersion containing the perovskite was measured by an ion chromatograph and was found to be 520 ppm (µg).

0.1 mL of a commercially available InP/ZnS toluene dispersion (solids content of the luminescent semiconductor material: 5%; emission wavelength: 630 nm) was mixed with 0.5 mL of the above-mentioned dispersion composition containing the perovskite, the solvent, and the halogen-containing compound to obtain a dispersion composition containing the InP, the dispersion composition containing perovskite, the halogen-containing compound, and the solvent, in which the amount of bromide ions derived from the halogen-containing compound was 434 ppm (nig). The mass ratio of bromine in the halogen-containing compound to the luminescent semiconductor material in the composition was 0.0520.

The results of the durability test revealed that the value of (emission intensity ascribed to semiconductor material after 1 hour)/(emission intensity ascribed to semiconductor material immediately after mixing with the semiconductor material) was 0.82.

The emission spectrum was measured after mixing 0.01 mL of the dispersion composition containing the InP, the dispersion composition containing the perovskite, the halogen-containing compound, and the solvent, in which the amount of bromide ions derived from the halogen-containing compound was 434 ppm (µg/g) with 2.99 mL of toluene to dilute the dispersion composition 300-fold.

Example 3

With respect to 200 mL of the perovskite dispersion obtained in the same manner as in Example 1, the solids content thereof was adjusted with toluene to 0.45% by mass, and 1.9 parts by mass (relative to 1 part by mass of perovskite in the dispersion) of organosilazane (Durazane 1500 Slow Cure, manufactured by Merck Performance Materials Ltd.) was added. The resulting was subjected to steam reforming for 4 hours, and then 0.3 mL thereof was separated and mixed with 0.2 mL of toluene, thereby obtaining a dispersion composition containing the perovskite, a solvent, and a halogen-containing compound. As for the conditions for the reforming treatment, the flow rate of steam was 0.2 L/min (supplied with $N_2$ gas, saturated steam amount at 30° C.), and the heating temperature was 80° C. The amount of bromide ions derived from the halogen-containing compound contained in the above-mentioned dispersion containing the perovskite was measured by an ion chromatograph and was found to be 780 ppm (µg/g).

0.1 mL of a commercially available InP/ZnS toluene dispersion (solids content of the luminescent semiconductor material: 5%; emission wavelength: 630 nm) was mixed with 0.5 mL of the obtained dispersion composition containing the perovskite, the solvent, and the halogen-containing compound to obtain a dispersion composition containing the InP, the dispersion composition containing the perovskite, the halogen-containing compound, and the solvent, in which the amount of bromide ions derived from the halogen-containing compound was 650 ppm (µg/g).

The mass ratio of bromine in the halogen-containing compound to the luminescent semiconductor material in the composition was 0.0780.

The results of the durability test revealed that the value of (emission intensity ascribed to semiconductor material after 1 hour)/(emission intensity ascribed to semiconductor material immediately after mixing with the semiconductor material) was 0.78.

The emission spectrum was measured after mixing 0.01 mL of the dispersion composition containing the InP, the dispersion composition containing the perovskite, the halogen-containing compound, and the solvent, in which the amount of bromide ions derived from the halogen-containing compound is 650 ppm (µg/g) with 2.99 mL of toluene to dilute the dispersion composition 300-fold.

Example 4

With respect to 200 mL of the perovskite dispersion obtained in the same manner as in Example 1, the solids content thereof was adjusted with toluene to 0.45% by mass, and 1.9 parts by mass (relative to 1 part by mass of perovskite in the dispersion) of organosilazane (Durazane 1500 Slow Cure, manufactured by Merck Performance Materials Ltd.) was added. The resulting was subjected to steam reforming for 4 hours, and then 0.4 mL thereof was separated and mixed with 0.1 mL of toluene, thereby obtaining a dispersion composition containing the perovskite, a solvent, and a halogen-containing compound. As for the conditions for the reforming treatment, the flow rate of steam was 0.2 L/min (supplied with $N_2$ gas, saturated steam amount at 30° C.), and the heating temperature was 80° C. The amount of bromide ions derived from the halogen-containing compound contained in the above-mentioned dispersion containing the perovskite was measured by an ion chromatograph and was found to be 1040 ppm (n/g).

0.1 mL of a commercially available InP/ZnS toluene dispersion (solids content of the luminescent semiconductor material: 5%; emission wavelength: 630 nm) was mixed with 0.5 mL of the obtained dispersion composition containing the perovskite, the solvent, and the halogen-containing compound to obtain a dispersion composition containing the InP, the dispersion composition containing the perovskite, the halogen-containing compound, and the solvent, in which the amount of bromide ions derived from the halogen-containing compound was 867 ppm (µg/g). The mass ratio of bromine in the halogen-containing compound to the luminescent semiconductor material in the composition was 0.104.

The results of the durability test revealed that the value of (emission intensity ascribed to semiconductor material after 1 hour)/(emission intensity ascribed to semiconductor material immediately after mixing with the semiconductor material) was 0.74.

The emission spectrum was measured after mixing 0.01 mL of the dispersion composition containing the InP, the dispersion composition containing perovskite, the halogen-containing compound, and the solvent, in which the amount of bromide ions derived from the halogen-containing compound is 867 ppm (µg/g) with 2.99 mL of toluene to dilute the dispersion composition 300-fold.

Example 5

With respect to 200 mL of the perovskite dispersion obtained in the same manner as in Example 1, the solids content thereof was adjusted with toluene to 0.45% by mass, and 1.9 parts by mass (relative to 1 part by mass of perovskite in the dispersion) of organosilazane (Durazane 1500 Slow Cure, manufactured by Merck Performance Materials Ltd.) was added. The resulting was subjected to steam reforming for 4 hours, thereby obtaining a dispersion composition containing a halogen-containing compound. As for the conditions for the reforming treatment, the flow rate of steam was 0.2 L/min (supplied with $N_2$ gas, saturated steam amount at 30° C.), and the heating temperature was 80° C. The amount of bromide ions derived from the halogen-containing compound contained in the above-mentioned dispersion containing the perovskite was measured by an ion chromatograph and was found to be 1301 ppm (μg/g).

0.1 mL of a commercially available InP/ZnS toluene dispersion (solids content of the luminescent semiconductor material: 5%; emission wavelength: 630 nm) was mixed with 0.5 mL of the obtained dispersion composition containing the perovskite, the solvent, and the halogen-containing compound to obtain a dispersion composition containing the InP, the dispersion composition containing the perovskite, the halogen-containing compound, and the solvent, in which the amount of bromide ions derived from the halogen-containing compound was 1084 ppm (μg/g). The mass ratio of bromine in the halogen-containing compound to the luminescent semiconductor material in the composition was 0.130.

The results of the durability test revealed that the value of (emission intensity ascribed to semiconductor material after 1 hour)/(emission intensity ascribed to semiconductor material immediately after mixing with the semiconductor material) was 0.72.

The emission spectrum was measured after mixing 0.01 mL of the dispersion composition containing InP, the dispersion composition containing perovskite, the halogen-containing compound, and the solvent, in which the amount of bromide ions derived from the halogen-containing compound is 1084 ppm (μg/g) with 2.99 mL of toluene to dilute the dispersion composition 300-fold.

Example 6

With respect to 200 mL of the perovskite dispersion obtained in the same manner as in Example 1, the solids content thereof was adjusted with toluene to 0.45% by mass, and 1.9 parts by mass (relative to 1 part by mass of perovskite in the dispersion) of organosilazane (Durazane 1500 Slow Cure, manufactured by Merck Performance Materials Ltd.) was added. The resulting was subjected to steam reforming for 4 hours, thereby obtaining a dispersion composition containing a halogen-containing compound. As for the conditions for the reforming treatment, the flow rate of steam was 0.2 L/min (supplied with $N_2$ gas, saturated steam amount at 30° C.), and the heating temperature was 80° C. The amount of bromide ions derived from the halogen-containing compound contained in the above-mentioned dispersion containing the perovskite was measured by an ion chromatograph and was found to be 1301 ppm (μg/g).

0.05 mL of a commercially available InP/ZnS toluene dispersion (solids content of the luminescent semiconductor material: 5%; emission wavelength: 630 nm) was mixed with 0.5 mL of the obtained dispersion composition containing the perovskite, the solvent, and the halogen-containing compound to obtain a dispersion composition containing InP, the dispersion composition containing the perovskite, the halogen-containing compound, and the solvent, in which the amount of bromide ions derived from the halogen-containing compound was 1182 ppm (n/g). The mass ratio of bromine in the halogen-containing compound to the luminescent semiconductor material in the composition was 0.260.

The results of the durability test revealed that the value of (emission intensity ascribed to semiconductor material after 1 hour)/(emission intensity ascribed to semiconductor material immediately after mixing with the semiconductor material) was 0.67.

The emission spectrum was measured after mixing 0.01 mL of the dispersion composition containing InP, the dispersion composition containing perovskite, the halogen-containing compound, and the solvent, in which the amount of bromide ions derived from the halogen-containing compound is 1182 ppm (μg/g) with 2.99 mL of toluene to dilute the dispersion composition 300-fold.

Example 7

With respect to 200 mL of the perovskite dispersion obtained in the same manner as in Example 1, the solids content thereof was adjusted with toluene to 0.45% by mass, and 1.9 parts by mass (relative to 1 part by mass of perovskite in the dispersion) of organosilazane (Durazane 1500 Slow Cure, manufactured by Merck Performance Materials Ltd.) was added. The resulting was subjected to steam reforming for 4 hours, thereby obtaining a dispersion composition containing a halogen-containing compound. As for the conditions for the reforming treatment, the flow rate of steam was 0.2 L/min (supplied with $N_2$ gas, saturated steam amount at 30° C.), and the heating temperature was 80° C. The amount of bromide ions derived from the halogen-containing compound contained in the above-mentioned dispersion containing perovskite was measured by an ion chromatograph and was found to be 1301 ppm (μg/g).

0.02 mL of a commercially available InP/ZnS toluene dispersion (solids content of the luminescent semiconductor material: 5%; emission wavelength: 630 nm) was mixed with 0.5 mL of the obtained dispersion composition containing the perovskite, the solvent, and the halogen-containing compound to obtain a dispersion composition containing the InP, the dispersion composition containing the perovskite, the halogen-containing compound, and the solvent, in which the amount of bromide ions derived from the halogen-containing compound was 1250 ppm (μg/g). The mass ratio of bromine in the halogen-containing compound to the luminescent semiconductor material in the composition was 0.650.

The results of the durability test revealed that the value of (emission intensity ascribed to semiconductor material after 1 hour)/(emission intensity ascribed to semiconductor material immediately after mixing with the semiconductor material) was 0.60.

The emission spectrum was measured after mixing 0.01 mL of the dispersion composition containing InP, the dispersion composition containing perovskite, the halogen-containing compound, and the solvent, in which the amount of bromide ions derived from the halogen-containing compound is 1250 ppm (μg/g) with 2.99 mL of toluene to dilute the dispersion composition 300-fold.

Example 8

With respect to 200 mL of the perovskite dispersion obtained in the same manner as in Example 1, the solids content thereof was adjusted with toluene to 0.45% by mass, and 1.9 parts by mass (relative to 1 part by mass of perovskite in the dispersion) of organosilazane (Durazane 1500 Slow Cure, manufactured by Merck Performance Materials Ltd.) was added. The resulting was subjected to steam reforming for 4 hours.

As for the conditions for the reforming treatment, the flow rate of steam was 0.2 L/min (supplied with $N_2$ gas, saturated steam amount at 30° C.), and the heating temperature was 80° C. 10 µL of a mixture of 10 µL of an aqueous hydrogen bromide solution (concentration: 48%) and 100 µL of toluene was taken and mixed with 0.5 mL of the above-mentioned dispersion composition containing the perovskite and the halogen-containing compound to obtain a dispersion composition containing the perovskite and the halogen-containing compound. The amount of bromide ions derived from the halogen-containing compound contained in the above-mentioned dispersion containing the perovskite was measured by an ion chromatograph and was found to be 2261 ppm (µg/g).

0.02 mL of a commercially available InP/ZnS toluene dispersion (solids content of the luminescent semiconductor material: 5%; emission wavelength: 630 nm) was mixed with 0.51 mL of the above-mentioned dispersion composition containing the perovskite, the solvent, and the halogen-containing compound to obtain a dispersion composition containing the InP, the dispersion composition containing the perovskite, the halogen-containing compound, and the solvent, in which the amount of bromide ions derived from the halogen-containing compound is 2176 ppm (µg/g). The mass ratio of bromine in the halogen-containing compound to the luminescent semiconductor material in the composition was 1.15.

The results of the durability test revealed that the value of (emission intensity ascribed to semiconductor material after 1 hour)/(emission intensity ascribed to semiconductor material immediately after mixing with the semiconductor material) was 0.49.

The emission spectrum was measured after mixing 0.01 mL of the dispersion composition containing the InP, the dispersion composition containing the perovskite, the halogen-containing compound, and the solvent, in which the amount of bromide ions derived from the halogen-containing compound is 2176 ppm (µg/g) with 2.99 mL of toluene to dilute the dispersion composition 300-fold.

Comparative Example 1

With respect to 200 mL of the perovskite dispersion obtained in the same manner as in Example 1, the solids content thereof was adjusted with toluene to 0.45% by mass, and 1.9 parts by mass (relative to 1 part by mass of perovskite in the dispersion) of organosilazane (Durazane 1500 Slow Cure, manufactured by Merck Performance Materials Ltd.) was added. The resulting was subjected to steam reforming for 4 hours. As for the conditions for the reforming treatment, the flow rate of steam was 0.2 L/min (supplied with $N_2$ gas, saturated steam amount at 30° C.), and the heating temperature was 80° C. 50 µL of a mixture of 10 µL of an aqueous hydrogen bromide solution (concentration: 48%) and 100 µL of toluene was taken and mixed with 0.5 mL of the above-mentioned dispersion composition containing the perovskite and halogen-containing compound to obtain a dispersion composition containing the perovskite and halogen-containing compound. The amount of bromide ions derived from the halogen-containing compound contained in the above-mentioned dispersion containing perovskite was measured by an ion chromatograph and was found to be 5750 ppm (µg/g).

0.02 mL of a commercially available InP/ZnS toluene dispersion (solids content of the luminescent semiconductor material: 5%; emission wavelength: 630 nm) was mixed with 0.55 mL of the above-mentioned dispersion composition containing the perovskite, the solvent, and the halogen-containing compound to obtain a dispersion composition containing the InP, the dispersion composition containing the perovskite, the halogen-containing compound, and the solvent, in which the amount of bromide ions derived from the halogen-containing compound is 5552 ppm (µg/g). The mass ratio of bromine in the halogen-containing compound to the luminescent semiconductor material in the composition was 3.22.

The results of the durability test revealed that the value of (emission intensity ascribed to semiconductor material after 1 hour)/(emission intensity ascribed to semiconductor material immediately after mixing the semiconductor material) was 0.45.

The emission spectrum was measured after mixing 0.01 mL of the dispersion composition containing the InP, the dispersion composition containing perovskite, the halogen-containing compound, and the solvent, in which the amount of bromide ions derived from the halogen-containing compound is 5552 ppm (µg/g) with 2.99 mL of toluene to dilute the dispersion composition 300-fold.

Reference Example 1

The composition obtained in each of Examples 1 to 8 is placed in a glass tube or the like and sealed, and the resulting is placed between a blue light-emitting diode as a light source and a light guiding plate, thereby producing a backlight that can convert the blue light of the blue light-emitting diode into green light or red light.

Reference Example 2

A resin composition is obtained by forming a sheet of the composition of each of Examples 1 to 8. By placing a film obtained by interposing the sheet of the resin composition between two barrier films so as to be sealed on the light-guiding plate, a backlight is produced, which converts blue light to be irradiated to the sheet after passing through the light-guiding plate from a blue light-emitting diode placed on an end surface (side surface) of the light-guiding plate to green light or red light.

Reference Example 3

By placing the composition of each of Examples 1 to 8 in the vicinity of a light-emitting unit of a blue light-emitting diode, a backlight capable of converting blue light to be irradiated thereto to green light or red light is produced.

Reference Example 4

A wavelength conversion material can be obtained by removing the solvent after mixing the composition of each of Examples 1 to 8 with a resist. By placing the obtained wavelength conversion material between the blue light-emitting diode as a light source and the light-guiding plate or downstream of the OLED as a light source, a backlight capable of converting blue light from the light source to green light or red light is produced.

Reference Example 5

The composition of each of Examples 1 to 8 is mixed with conductive particles such as ZnS and formed into a film. An n-type transport layer is laminated on one side of the film, while laminating a p-type transport layer on the other side of the film, to thereby obtain an LED. An electric current passed through an LED allows the holes of the p-type semiconductor and the electrons of the n-type semiconductor to meet with each other in the perovskite compound at the junction interface to cancel out electric charge, thereby enabling the LED to emit light.

Reference Example 6

A titanium oxide dense layer is laminated on the surface of a fluorine-doped tin oxide (FTO) substrate. On the surface of the FTO substrate, a porous aluminum oxide layer is laminated, whereon the composition of each of Examples 1 to 8 is laminated. After removing the solvent from the resulting laminate, a hole transport layer such as 2,2-,7,7-tetrakis-(N,N-di-p-methoxyphenylamine)9,9-spirobifluorene (Spiro-OMeTAD) is laminated thereon, whereon a silver (Ag) layer is further laminated to produce a solar cell.

Reference Example 7

The composition of the present embodiment can be obtained by removing the solvent from the composition of each of Examples 1 to 8, and molding the resulting product, and by installing the obtained composition downstream of the blue light-emitting diode, a laser diode lighting is produced, which converts blue light irradiated to the composition from the blue light-emitting diode to green light or red light, thereby emitting while light.

Reference Example 8

The composition of the present embodiment can be obtained by removing the solvent from the composition of each of Examples 1 to 8, and molding the resulting product. By using the obtained composition as a part of a photoelectric conversion layer, a photoelectric conversion element (photodetection element) material to be used in a light detection unit is produced. The photoelectric conversion element material is used as an image detector (image sensor) for solid-state image sensors such as X-ray image sensors and CMOS image sensors, a detection unit that detects specific features of a part of the living body, such as a fingerprint detector, a face detector, a vein detector and an iris detector, or an optical biosensor such as a pulse oximeter.

REFERENCE SIGNS LIST

1a First laminated structure
1b Second laminated structure
10 Film
20 First substrate
21 Second substrate
22 Sealing layer
2 Light-emitting device
3 Display
30 Light source
40 Liquid crystal panel
50 Prism sheet
60 Light-guiding plate

What is claimed is:
1. A luminescent composition comprising
a component (1) which is a perovskite compound comprising
a metal ion,
a monovalent cation positioned at each vertex of a hexahedron having the metal ion at the center in a perovskite type crystal structure, and
at least one anion selected from the group consisting of a halide ion and a thiocyanate ion, the ion being positioned at each vertex of an octahedron having the metal ion at the center in the perovskite type crystal structure;
a component (2) which is a halogen-containing compound; and
a component (10) which is a luminescent semiconductor material,
wherein a mass ratio of halide ions contained in the component (2) to the component (10) (mass of halide ions contained in the component (2)/mass of the component (10)) is 3.0 or less.

2. The composition according to claim 1, further comprising a component (6) which is at least one compound selected from the group consisting of silazane, a modified product of silazane, a compound represented by formula (C1), a modified product of the compound represented by the formula (C1), a compound represented by formula (C2), a modified product of the compound represented by the formula (C2), a compound represented by formula (A5-51), a modified product of the compound represented by the formula (A5-51), a compound represented by formula (A5-52), a modified product of the compound represented by the formula (A5-52), sodium silicate, and a modified product of sodium silicate:

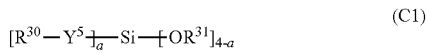
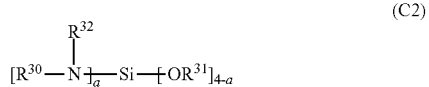

wherein: in the formula (C1), $Y^5$ represents a single bond, an oxygen atom, or a sulfur atom,
with the proviso that, when $Y^5$ is an oxygen atom, each of $R^{30}$ and $R^{31}$ independently represents a hydrogen atom, an alkyl group having 1 to 20 carbon atoms, a cycloalkyl group having 3 to 30 carbon atoms, or an unsaturated hydrocarbon group having 2 to 20 carbon atoms, and
when $Y^5$ is a single bond or a sulfur atom, $R^{30}$ represents an alkyl group having 1 to 20 carbon atoms, a cycloalkyl having 3 to 30 carbon atoms, or an unsaturated hydrocarbon group having 2 to 20 carbon atoms, and $R^{31}$ represents a hydrogen atom, an alkyl group having 1 to 20 carbon atoms, a cycloalkyl group having 3 to 30 carbon atoms, or an unsaturated hydrocarbon group having 2 to 20 carbon atoms;
in the formula (C2), each of $R^{30}$, $R^{31}$ and $R^{32}$ independently represents a hydrogen atom, an alkyl group having 1 to 20 carbon atoms, a cycloalkyl group having 3 to 30 carbon atoms, or an unsaturated hydrocarbon group having 2 to 20 carbon atoms;
in the formulae (C1) and (C2),
hydrogen atoms in the alkyl group, the cycloalkyl group and the unsaturated hydrocarbon group as $R^{30}$, $R^{31}$ or $R^{32}$ are each independently substituted by or not substituted by a halogen atom or an amino group, and
a is an integer of 1 to 3, with the proviso that,
when a is 2 or 3, a plurality of $Y^5$ is the same or different, when a is 2 or 3, a plurality of $R^{30}$ is the same or different,

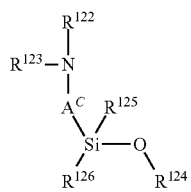 (A5-51)

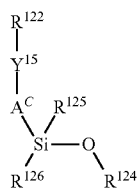 (A5-52)

when a is 2 or 3, a plurality of $R^{32}$ is the same or different,
when a is 1 or 2, a plurality of $R^{31}$ is the same or different,
wherein $A^C$ is a divalent hydrocarbon group and $Y^{15}$ is an oxygen atom or a sulfur atom,
each of $R^{122}$ and $R^{123}$ is independently a hydrogen atom, an alkyl group having 1 to 20 carbon atoms, or a cycloalkyl group having 3 to 30 carbon atoms, $R^{124}$ is an alkyl group having 1 to 20 carbon atoms or a cycloalkyl group having 3 to 30 carbon atoms, and each of $R^{125}$ and $R^{126}$ is independently a hydrogen atom, an alkyl group having 1 to 20 carbon atoms, an alkoxy group having 1 to 20 carbon atoms, or a cycloalkyl group having 3 to 30 carbon atoms, with the proviso that
hydrogen atoms in the alkyl group and the cycloalkyl group as $R^{122}$ to $R^{126}$ are each independently substituted by or not substituted by a halogen atom or an amino group.

3. The composition according to claim 1, which further comprises:
a component (5) which is at least one compound or ion selected from the group consisting of an ammonium ion, an amine, primary to quaternary ammonium cations, an ammonium salt, a carboxylic acid, a carboxylate ion, a carboxylate salt, compounds respectively represented by formulae (X1) to (X6), and salts of the compounds respectively represented by formulae (X2) to (X4):

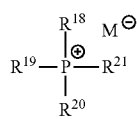 (X1)

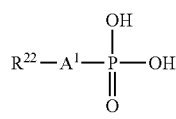 (X2)

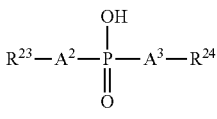 (X3)

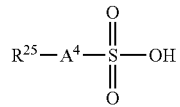 (X4)

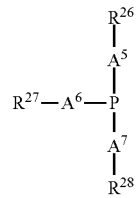 (X5)

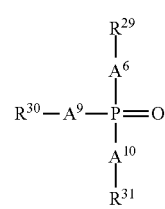 (X6)

wherein:
in the formula (X1), each of $R^{18}$ to $R^{21}$ is independently an alkyl group having 1 to 20 carbon atoms, a cycloalkyl group having 3 to 30 carbon atoms, or an aryl group having 6 to 30 carbon atoms, which is or is not substituted, and $M^-$ is a counter anion;
in the formula (X2), $A^1$ is a single bond or an oxygen atom, and $R^{22}$ is an alkyl group having 1 to 20 carbon atoms, a cycloalkyl group having 3 to 30 carbon atoms, or an aryl group having 6 to 30 carbon atoms, which is or is not substituted;
in the formula (X3), each of $A^2$ and $A^3$ independently represents a single bond or an oxygen atom, and each of $R^{23}$ and $R^{24}$ independently represents an alkyl groups having 1 to 20 carbon atoms, a cycloalkyl group having 3 to 30 carbon atoms, or an aryl group having 6 to 30 carbon atoms, which is or is not substituted;
in the formula (X4), $A^4$ represents a single bond or an oxygen atom, and $R^{25}$ represents an alkyl group having 1 to 20 carbon atoms, a cycloalkyl group having 3 to 30 carbon atoms, or an aryl group having 6 to 30 carbon atoms, which is or is not substituted;
in the formula (X5), each of $A^5$ to $A^7$ independently represents a single bond or an oxygen atom, and each of $R^{26}$ to $R^{28}$ independently represents an alkyl group having 1 to 20 carbon atoms, a cycloalkyl group having 3 to 30 carbon atoms, an aryl group having 6 to 30 carbon atoms, an alkenyl group having 2 to 20 carbon atoms, or an alkynyl group having 2 to 20 carbon atoms, which is or is not substituted;
in the formula (X6), each of $A^8$ to $A^{10}$ independently represents a single bond or an oxygen atom, and each of $R^{29}$ to $R^{31}$ independently represents an alkyl group having 1 to 20 carbon atom, a cycloalkyl group having 3 to 30 carbon atoms, an aryl group of 6 to 30 carbon atoms, an alkenyl group having 2 to 20 carbon atoms, or an alkynyl group having 2 to 20 carbon atoms, which is or is not substituted,
with the proviso that hydrogen atoms in the groups represented by $R^{18}$ to $R^{31}$ re each independently substituted or not substituted by a halogen atom.

4. The composition according to claim 3, wherein the component (5) is a component (5-1) which is at least one compound or ion selected from the group consisting of an ammonium ion, an amine, primary to quaternary ammonium cations, an ammonium salt, a carboxylic acid, a carboxylate ion, and a carboxylate salt.

5. The composition according to claim 1, as a fabrication material.

6. The composition according to claim 1, further comprising at least one component selected from the group consisting of a component (3), a component (4) and a component (4-1), wherein the component (3) is a solvent; the component (4) is a polymerizable compound; and the component (4-1) is a polymer.

7. The composition according to claim 1, wherein the metal ion comprises one or more metal ions selected from the group consisting of lead and tin.

8. The composition according to claim 1, wherein the monovalent cation is one or more selected from the group consisting of a cesium ion, an organic ammonium ion, and an amidinium ion.

9. The composition according to claim 1, wherein the halogen-containing compound is
    metal salt $MX_2$, in which M is a divalent metal ion, and X is at least one ion selected from the group consisting of ions of F, Cl, Br and I, and
    an inorganic acid HX.

10. The composition according to claim 9, wherein said M is at least one selected from the group consisting of lead, tin, manganese, and zinc.

11. The composition according to claim 9, wherein said metal salt $MX_2$ is selected from the group consisting of $PbI_2$, $PbBr_2$ and $PbCl_2$.

12. The composition according to claim 1, wherein the luminescent semiconductor material is at least one selected from the group consisting of
    (i) a semiconductor material containing Group II-VI compound semiconductor
    (ii) a semiconductor material containing Group II-V compound semiconductor
    (iii) a semiconductor material containing Group III-V compound semiconductor
    (iv) a semiconductor material containing Group III-IV compound semiconductor
    (v) a semiconductor material containing Group III-VI compound semiconductor
    (vi) a semiconductor material containing Group IV-VI compound semiconductor, and
    (vii) a semiconductor material containing transition metal-p-block compound semiconductor.

13. The composition according to claim 1, wherein the mass ratio is 0.6 or less.

14. The composition according to claim 1, wherein the mass ratio is 0.05 or less.

15. The composition according to claim 1, wherein the mass ratio is 0.0130 or greater and 0.05 or less.

16. A laminated structure comprising the film according to claim 5.

17. A light-emitting device comprising the laminated structure of claim 16.

18. A display comprising the laminated structure of claim 16.

* * * * *